US010025011B2

(12) United States Patent
Takishita et al.

(10) Patent No.: US 10,025,011 B2
(45) Date of Patent: Jul. 17, 2018

(54) COMPOSITION, INFRARED TRANSMISSION FILTER AND METHOD FOR MANUFACTURING THE SAME, AND INFRARED SENSOR

(71) Applicant: FUJIFILM Corporation, Tokyo (JP)

(72) Inventors: Hirotaka Takishita, Shizuoka (JP); Toshihito Kuge, Shizuoka (JP); Yoshinori Taguchi, Shizuoka (JP); Hiroshi Taguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/723,968

(22) Filed: May 28, 2015

(65) Prior Publication Data

US 2015/0260885 A1    Sep. 17, 2015

Related U.S. Application Data

(63) Continuation of application No. PCT/JP2013/081560, filed on Nov. 22, 2013.

(30) Foreign Application Priority Data

Nov. 29, 2012  (JP) ................................. 2012-261422

(51) Int. Cl.
| | |
|---|---|
| *G02B 1/04* | (2006.01) |
| *G01J 1/42* | (2006.01) |
| *C08F 2/50* | (2006.01) |
| *G03F 7/027* | (2006.01) |
| *G03F 7/031* | (2006.01) |
| *G03F 7/033* | (2006.01) |
| *G03F 7/105* | (2006.01) |
| *G02B 5/20* | (2006.01) |
| *G02B 5/22* | (2006.01) |
| *G01J 1/04* | (2006.01) |
| *G03F 7/00* | (2006.01) |

(52) U.S. Cl.
CPC ............. *G02B 5/208* (2013.01); *C08F 2/50* (2013.01); *G01J 1/0407* (2013.01); *G01J 1/42* (2013.01); *G02B 1/04* (2013.01); *G02B 5/223* (2013.01); *G03F 7/0007* (2013.01); *G03F 7/027* (2013.01); *G03F 7/031* (2013.01); *G03F 7/033* (2013.01); *G03F 7/105* (2013.01)

(58) Field of Classification Search
CPC .......... G02B 1/04; G02B 5/208; G02B 5/223; C08F 2/50; G01J 1/42; G01J 1/0407; G03F 7/0007; G03F 7/027; G03F 7/031; G03F 7/033; G03F 7/105
USPC .............. 250/338.1; 252/586; 427/510; 430/281.1; 522/33, 65, 63; 549/57, 404, 549/458; 558/262; 564/254
See application file for complete search history.

(56) References Cited

U.S. PATENT DOCUMENTS

| | | | | |
|---|---|---|---|---|
| 6,517,980 B2 * | 2/2003 | Ueda | ................... | G03F 7/0388 430/14 |
| 2010/0243970 A1 * | 9/2010 | Toshimitsu | ............ | G02B 5/223 252/582 |
| 2010/0323285 A1 * | 12/2010 | Einaga | ................... | G02B 5/223 430/7 |
| 2011/0123929 A1 * | 5/2011 | Fujita | ................... | C07C 251/66 430/281.1 |

FOREIGN PATENT DOCUMENTS

| | | | | |
|---|---|---|---|---|
| CN | 1542067 A | 11/2004 | | |
| CN | 101688935 A | 3/2010 | | |
| JP | 63-18302 A | 1/1988 | | |
| JP | 3-33173 A | 2/1991 | | |
| JP | 06-194516 | * | 7/1994 | ............... G02B 5/22 |
| JP | 6-194516 A | 7/1994 | | |
| JP | 09-003311 | * | 1/1997 | ............. C08L 69/00 |
| JP | 9-3311 A | 1/1997 | | |
| JP | 2001-75054 A | 3/2001 | | |
| JP | 2003-215326 A | 7/2003 | | |
| JP | 2003-287620 A | 10/2003 | | |
| JP | 2004-300204 A | 10/2004 | | |
| JP | 2004300204 | * | 10/2004 | ............. C08L 63/00 |
| JP | 2009-69822 A | 4/2009 | | |
| JP | 2012-082317 | * | 4/2012 | ............ C08F 222/20 |
| JP | 2012-82317 A | 4/2012 | | |
| JP | 2012-173327 A | 9/2012 | | |
| KR | 10-2010-0112200 A | 10/2010 | | |
| TW | I 282796 B | 6/2007 | | |

(Continued)

OTHER PUBLICATIONS

English translation of Written Opinion dated Feb. 25, 2014 by the International Searching Authority in related Application No. PCT/JP2013/081560.
International Search Report dated Feb. 25, 2014 issued in International Application No. PCT/JP2013/081560 (PCT/ISA/210).
Written Opinion dated Feb. 25, 2014 issued in International Application No. PCT/JP2013/081560 (PCT/ISA/237).
Office Action dated Dec. 8, 2015, issued by the Japanese Patent Office in counterpart Japanese Patent Application No. 2013-242369.
Office Action dated Jan. 14, 2016 by the Korean Intellectual Property Office in corresponding Korean Application No. 10-2015-7013465.
Information Offer with Notification dated May 10, 2016 in counterpart Japanese Application No. 2013-242369.
Office Action dated Jun. 21, 2016, issued by the Japanese Patent Office in counterpart Japanese Application No. 2013-242369.

(Continued)

*Primary Examiner* — Bijan Ahvazi
(74) *Attorney, Agent, or Firm* — Sughrue Mion, PLLC

(57) ABSTRACT

There is provided a composition, wherein when a film is formed to have a film thickness of 1 μm, light transmittance in a thickness direction of the film has a maximum value of 20% or less at a wavelength in a range of 400 to 750 nm, and light transmittance in a thickness direction of the film has a minimum value of 90% or more at a wavelength in a range of 900 to 1,300 nm, and an infrared transmission filter formed with the composition, a method for manufacturing an infrared transmission filter, and an infrared sensor comprising the infrared transmission filter.

20 Claims, No Drawings

(56) References Cited

FOREIGN PATENT DOCUMENTS

TW  200925777 A   6/2009
WO  2012/091083 A1  7/2012

OTHER PUBLICATIONS

Office Action dated Jul. 28, 2016, issued by the State Intellectual Property Office of P.R. China in counterpart Chinese Application No. 201380062212.6.
Office Action dated Feb. 17, 2017, issued by the State Intellectual Property Office of P.R. China in counterpart Chinese Application No. 201380062212.6.
Office Action dated Feb. 3, 2017, issued by the Taiwanese Intellectual Property Office in counterpart Taiwanese Application No. 102143509.

* cited by examiner

COMPOSITION, INFRARED TRANSMISSION FILTER AND METHOD FOR MANUFACTURING THE SAME, AND INFRARED SENSOR

CROSS REFERENCE TO RELATED APPLICATION

This is a continuation of International Application No. PCT/JP2013/081560 filed on Nov. 22, 2013, and claims priority from Japanese Patent Application No. 2012-261422 filed on Nov. 29, 2012, the entire disclosures of which are incorporated herein by reference

TECHNICAL FIELD

The present invention relates to a composition, an infrared transmission filter and a method for manufacturing the same, and an infrared sensor.

BACKGROUND ART

A color filter is an essential component to a solid-state imaging device or a liquid crystal display. In particular, improvement in color separation property and improvement in color reproducibility are required for a color filter for a solid-state imaging device.

The color filter is formed with a colored area (a colored cured film) of a plurality of colors, and usually formed with at least a colored area (hereinafter, also referred to as a "colored pattern" or a "colored pixel") of red, green, and blue. As a method for forming a colored pattern, first, in a first color, a coloring radiation-sensitive composition having a colorant of any one of red, green, and blue is applied, exposed, developed, and subjected to heat treatment, if necessary, to form a colored pattern of the color, and then a similar process of application, exposure, development, and heat treatment, if necessary, is repeated in a second color and a third color.

As the colorant in the color filter, a pigment has been widely used because the pigment has clear color tone and high tinctorial strength, and in particular, it is preferred to use a pigment which is micronized and simultaneously exhibits suitable color separation property.

Further, recently, for the solid-state imaging device, it is required to micronize colored pixels (for example, a colored pattern having a side length of 1.0 µm or less) for the purpose of improving resolution, but it is known that as the colored pixels are micronized, noise is increased.

A solid-state imaging device is utilized as an optical sensor in various applications.

For example, since near-infrared ray has a longer wavelength than visible light and thus is difficult to be scattered, near-infrared ray may be utilized for distance measurement, three-dimensional measurement, and the like. In addition, since near-infrared ray is invisible to humans, animals and the like, near-infrared light may be used to take photos of nocturnal wild animals, as well as to photograph persons without irritating the persons for security purposes, without being noticed by a subject even though the subject is illuminated with a near-infrared ray light source at night. Optical sensors detecting such near-infrared ray may be developed for various applications, and thus there is a need for developing a color filter that may be used for a solid-state imaging device that detects near-infrared ray.

For example, absorption of light is small in the near-infrared to infrared wavelength region, and a resin black matrix which is considered to have a high light transmittance in this wavelength region is known (for example, Patent Document 1), but since transmission of the near-infrared region is still insufficient, particularly, it is difficult to use the resin black matrix as an infrared transmission filter in the infrared sensor for detecting the near-infrared region.

Furthermore, in recent years, very thin (for example, a thickness of 1 µm) infrared transmission filters have been required, but as the thickness becomes smaller, the light-shielding property to visible light of the infrared transmission filter is likely to deteriorate (that is, noise derived from a visible light component easily occurs), and as a result, there is a problem in that the performance as the infrared sensor deteriorates.

RELATED ART

Patent Documents

Patent Document 1: Japanese Patent Application Laid-Open No. 2009-69822

SUMMARY OF INVENTION

Problems to be Solved by the Invention

The present invention has been made in consideration of the aforementioned circumstances and to achieve the following object.

That is, an object of the present invention is to provide a composition which may prepare an infrared transmission filter which may transmit infrared ray (particularly, near-infrared ray) even though being very thin (for example, a thickness of 1 µm) in a state where noise derived from the visible light components is small, an infrared transmission filter using the same, a method for manufacturing an infrared transmission filter, and an infrared sensor.

Means for Solving the Problems

The present inventors have intensively studied in consideration of the aforementioned circumstances, and found that the object may be accomplished by an infrared transmission filter in which a maximum value of the light transmittance in a specific wavelength range and a minimum value of the light transmittance in another specific wavelength range each fall within a specific range, thereby completing the present invention. That is, the present invention is as follows.

[1] A composition, wherein when a film is formed to have a film thickness of 1 µm, light transmittance in a thickness direction of the film has a maximum value of 20% or less at a wavelength in a range of 400 to 750 nm, and light transmittance in a thickness direction of the film has a minimum value of 90% or more at a wavelength in a range of 900 to 1,300 nm.

[2] The composition as described in [1], wherein the composition contains a colorant.

[3] The composition as described in [2], wherein the composition contains an organic pigment as the colorant, and a content of the organic pigment is 95% by mass or more based on a total amount of the colorant.

[4] The composition as described in any one of [1] to [3], wherein the composition contains a photopolymerization initiator and a polymerizable compound.

[5] The composition as described in [4],
wherein the composition further contains an alkali-soluble resin.
[6] The composition as described in [5],
wherein the alkali-soluble resin is a resin having a repeating unit derived from a compound represented by the following Formula (ED):

[Chem. 1]

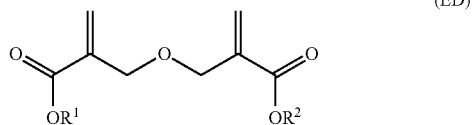

(ED)

wherein each of $R^1$ and $R^2$ independently represents a hydrogen atom or a hydrocarbon group.
[7] The composition as described in any one of [4] to [6],
wherein the photopolymerization initiator is an oxime compound.
[8] An infrared transmission filter formed with the composition according to any one of [1] to [7].
[9] A method for manufacturing an infrared transmission filter, comprising:
a step of forming an infrared transmission composition layer by imparting the composition according to any one of [1] to [8] on a substrate;
a step of pattern-wise exposing the infrared transmission composition layer; and
a step of forming a pattern by developing the infrared transmission composition layer after the exposure.
[10] An infrared sensor comprising the infrared transmission filter according to [8] or an infrared transmission filter obtained by the method for manufacturing an infrared transmission filter according to [9].

Advantage of Invention

According to the present invention, it is possible to provide a composition which may prepare an infrared transmission filter which may transmit infrared ray (particularly, near-infrared ray) even though being very thin (for example, a thickness of 1 μm) in a state where noise derived from the visible light components and the like is small, an infrared transmission filter using the same, a method for manufacturing an infrared transmission filter, and an infrared sensor.

DETAILED DESCRIPTION FOR CARRYING OUT THE INVENTION

Hereinafter, the present invention will be described in detail.

The constituent requirements described below may be described in some cases based on representative embodiments of the present invention, but the present invention is not limited to these embodiments. Meanwhile, the numerical value range expressed by using "to" in the present specification means a range including the numerical values described before and after "to" as the lower limit value and the upper limit value.

In the composition of the present invention, when a film is formed to have a film thickness of 1 μm, light transmittance in a thickness direction of the film has a maximum value of 20% or less at a wavelength in a range of 400 to 750 nm, and light transmittance in a thickness direction of the film has a minimum value of 90% or more at a wavelength in a range of 900 to 1,300 nm.

The maximum value of light transmittance at a wavelength in a range of 400 to 750 nm is preferably 17% or less, more preferably 15% or less, and still more preferably 13% or less. The maximum value of light transmittance at a wavelength in a range of 400 to 750 nm is usually 1% or more.

The minimum value of light transmittance at a wavelength in a range of 900 to 1,300 nm is preferably 90% or more, more preferably 95% or more, and still more preferably 98% or more. The minimum value of light transmittance at a wavelength in a range of 900 to 1,300 nm is usually 99.9% or less.

Further, in the composition of the present invention, when a film is formed to have a film thickness of 1 μm, it is preferred that light transmittance in a thickness direction of the film has a maximum value of 20% or less at a wavelength in a range of 400 to 750 nm, and light transmittance in a thickness direction of the film has a minimum value of 90% or more at a wavelength in a range of 825 to 1,300 nm.

In addition, in the composition of the present invention, when a film is formed to have a film thickness of 1 μm, it is preferred that light transmittance in a thickness direction of the film is 50% or more at a wavelength of 800 nm.

Spectral characteristics of a film formed of the composition according to the present invention, and a measurement method of a film thickness, and the like will be described below.

A film was formed by applying the composition of the present invention on a glass substrate by a method such as spin coat so as to have a film thickness of 1 μm after drying, and was dried at 100° C. for 120 seconds by a hot plate.

For the film thickness of the film, a substrate having the film after drying was measured by using a probe contact-type surface shape measurement apparatus (DEKTAK150 manufactured by ULVAC, Inc.).

For the substrate having the film after drying, transmittance at a wavelength in a range of 300 to 1,300 nm was measured by using a spectrophotometer (ref. a glass substrate) of an ultraviolet-visible-near-infrared spectrophotometer (U-4100 manufactured by Hitachi High-Technologies Corporation).

The conditions of the light transmittance may be achieved by any means, but for example, as explained in detail below, the conditions of the light transmittance may be suitably achieved by containing two or more pigments in a composition, and simultaneously, adjusting the kind and content of each pigment.

The composition of the present invention is typically a coloring composition, preferably a black composition.

Furthermore, the composition of the present invention transmits near-infrared rays and thus may also refer to a near-infrared transmission composition.

Hereinafter, each component which may constitute the composition of the present invention will be described.
<(A) Colorant>

It is preferred that the composition of the present invention contains a colorant.

Examples of the colorant may include a pigment, a dye, and the like.

The pigment is preferably an organic pigment, and examples thereof may include the following. However, the present invention is not limited thereto.

C.I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (those are yellow pigments), C.I. Pigment Orange 2, 5, 13, 16, 17:1, 31, 34, 36, 38, 43, 46, 48, 49, 51, 52, 55, 59, 60, 61, 62, 64, 71, 73, and the like (those are orange pigments), C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (those are red pigments), C.I. Pigment Green 7, 10, 36, 37, 58, and the like (those are green pigments), C.I. Pigment Violet 1, 19, 23, 27, 32, 37, 42, and the like (those are violet pigments), C.I. Pigment Blue 1, 2, 15, 15:1, 15:2, 15:3, 15:4, 15:6, 16, 22, 60, 64, 66, 79, 80, and the like (those are blue pigments), C.I. Pigment Black 1, 7, and the like (those are black pigments)

These organic pigments may be used either alone or in various combinations thereof.

The dye is not particularly limited, and a dye publicly known for a color filter in the related art may be used.

As the chemical structure, it is possible to use dyes such as pyrazole azo-based, anilino azo-based, triphenylmethane-based, anthraquinone-based, anthrapyridone-based, benzilidene-based, oxonol-based, pyrazolotriazole azo-based, pyridone azo-based, cyanine-based, phenothiazino-based, pyrrolo pyrazole azomethine-based, xanthene-based, phthalocyanine-based, benzopyran-based, indigo-based, and pyrromethene-based dyes. Further, multimers of these dyes may also be used.

Furthermore, as the dye, an acidic dye and/or a derivative thereof may be suitably used in some cases.

In addition, a direct dye, a basic dye, a mordant dye, an acid mordant dye, an azoic dye, a dispersion dye, an oil-soluble dye, a food dye, and/or derivatives thereof may also be usefully used.

Hereinafter, specific examples of the acidic dye will be described, but the acidic dye is not limited thereto. Examples thereof may include:

acid alizarin violet N; acid black 1, 2, 24, 48; acid blue 1, 7, 9, 15, 18, 23, 25, 27, 29, 40~45, 62, 70, 74, 80, 83, 86, 87, 90, 92, 103, 112, 113, 120, 129, 138, 147, 158, 171, 182, 192, 243, 324:1; acid chrome violet K; acid Fuchsin; acid green 1, 3, 5, 9, 16, 25, 27, 50; acid orange 6, 7, 8, 10, 12, 50, 51, 52, 56, 63, 74, 95; acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, 274; acid violet 6B, 7, 9, 17, 19; acid yellow 1, 3, 7, 9, 11, 17, 23, 25, 29, 34, 36, 42, 54, 72, 73, 76, 79, 98, 99, 111, 112, 114, 116, 184, 243; Food Yellow 3; and derivatives of these dyes.

Furthermore, in addition to those described above, azo-based, xanthene-based, and phthalocyanine-based acidic dyes are also preferred, and acidic dyes such as C.I. Solvent Blue 44, 38; C.I. Solvent orange 45; and Rhodamine B, and Rhodamine 110, and derivatives of these dyes are also preferably used.

Among them, the dye is preferably a colorant selected from triarylmethane-based, anthraquinone-based, azomethine-based, benzylidene-based, oxonol-based, cyanine-based, phenothiazine-based, pyrrolopyrazole azomethine-based, xanthene-based, phthalocyanine-based, benzopyran-based, indigo-based, pyrazole azo-based, anilino azo-based, pyrazolotriazole azo-based, pyridone azo-based, anthrapyridone-based and pyromethene-based colorants.

Further, pigments and dyes may be used in combination.

It is preferred that the composition of the present invention contains a pigment having particularly an average particle diameter (r) satisfying 20 nm≤r≤300 nm, preferably 25 nm≤r≤250 nm, and particularly preferably 30 nm≤r≤200 nm. As used herein, the term "average particle diameter" means an average particle diameter of secondary particles in which primary particles (single crystallites) of a pigment are aggregated. The average primary particle diameter may be obtained by measuring 100 particle sizes in portions where particles are not aggregated by observation through SEM or TEM and calculating the average value thereof.

In addition, in the particle diameter distribution of secondary particles of a pigment which may be used in the present invention (hereinafter, simply referred to as "particle diameter distribution"), it is preferred that secondary particles i within (average particle diameter±100) nm are present in an amount of 70% by mass or more, and preferably 80% by mass or more, based on the entire secondary particles. Meanwhile, in the present invention, the particle diameter distribution was measured by using a scattering intensity distribution.

A pigment having the aforementioned average particle diameter and particle diameter distribution may be prepared by mixing and dispersing a pigment mixture solution, in which a commercially available pigment is mixed together with another pigment (the average particle diameter thereof usually exceeds 300 nm) used in some cases, preferably, a dispersion agent and a solvent, while pulverizing the pigment mixture solution by using a pulverizer such as, for example, bead mill and roll mill. The pigment thus obtained usually takes a form of pigment dispersion liquid.

—Micronization of Pigment—

In the present invention, it is preferred that a fine and particle-size-regulated organic pigment is used. Micronization of the pigment is achieved through a step which includes preparing a highly viscous liquid composition together with the pigment, a water-soluble organic solvent and a water-soluble inorganic salt and applying stress to grind the pigment by using a wet pulverizing apparatus, and the like.

Examples of the water-soluble organic solvent used in the micronization step of the pigment may include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol, propylene glycol monomethyl ether acetate, and the like.

Furthermore, other solvents which have a low water-solubility or no water-solubility, for example, benzene, toluene, xylene, ethylbenzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methylcyclohexane, halogenated hydrocarbon, acetone, methyl ethyl ketone, methyl isobutyl ketone, cyclohexanone, dimethylformamide, dimethylsulfoxide, N-methylpyrrolidone, or the like may be used as long as the solvent is adsorbed on the pigment and is not lost into wastewater when used in a small amount.

The solvent used in the micronization step of the pigment may be used either alone or in mixture of two or more kinds thereof, if necessary.

In the present invention, examples of the water-soluble inorganic salt used in the micronization step of the pigment may include sodium chloride, potassium chloride, calcium chloride, barium chloride, sodium sulfate, and the like.

The amount of the water-soluble inorganic salt used in the micronization step is 1 time by mass to 50 times by mass the amount of the pigment, and more preferably 1 time by mass to 10 times by mass the amount of the pigment, from the viewpoint of productivity, although a greater amount provides a higher grinding effect. Further, it is preferred that inorganic salts with a moisture content of 1% or less are used.

The amount of the water-soluble organic solvent used in the micronization step is in a range of 50 parts by mass to 300 parts by mass, and preferably 100 parts by mass to 200 parts by mass, based on 100 parts by mass of the pigment.

The operation conditions of the wet pulverizing apparatus in the micronization step of the pigment are not particularly limited, but in order to effectively perform grinding by a pulverizing media, in the operation conditions when the apparatus is a kneader, the number of rotations of a blade in the apparatus is preferably 10 rpm to 200 rpm, and also, the relatively higher rotation ratio between two axes is preferred because a higher grinding effect is obtained. The operation time including a dry pulverizing time is preferably 1 hour to 8 hours, and the internal temperature of the apparatus is preferably 50° C. to 150° C. In addition, it is preferred that the water-soluble inorganic salt as a pulverizing media has a pulverized particle size of 5 μm to 50 μm, a sharp particle diameter distribution, and a spherical shape.

The composition of the present invention preferably contains a pigment, and more preferably two or more pigments, such that when a film is formed to have a film thickness of 1 μm, light transmittance in a thickness direction of the film has a maximum value of 20% or less at a wavelength in a range of 400 to 750 nm, and light transmittance in a thickness direction of the film has a minimum value of 90% or more at a wavelength in a range of 900 to 1,300 nm. It is preferred that two or more pigments are composed of a combination of a red pigment, a yellow pigment, a blue pigment, and a violet pigment.

It is more preferred that the composition of the present invention contains C.I. Pigment Red 254 as the red pigment, C.I. Pigment Yellow 139 as the yellow pigment, C.I. Pigment Blue 15:6 as the blue pigment, and C.I. Pigment Violet 23 as the violet pigment.

When the two or more pigments contained in the composition of the present invention are composed of a combination of a red pigment, a yellow pigment, a blue pigment, and a violet pigment, it is preferred that the mass ratio of the red pigment to the entire pigments is 0.2 to 0.5, the mass ratio of the yellow pigment to the entire pigments is 0.1 to 0.2, the mass ratio of the blue pigment to the entire pigments is 0.25 to 0.55, and the mass ratio of the violet pigment to the entire pigments is 0.05 to 0.15, and it is more preferred that the mass ratio of the red pigment to the entire pigments is 0.3 to 0.4, the mass ratio of the yellow pigment to the entire pigments is 0.1 to 0.2, the mass ratio of the blue pigment to the entire pigments is 0.3 to 0.4, and the mass ratio of the violet pigment to the entire pigments is 0.05 to 0.15.

The composition of the present invention contains an organic pigment as the colorant, and the content of the organic solvent is preferably 95% by mass or more, more preferably 97% by mass or more, and still more preferably 99% by mass or more, based on the total amount of the colorant. The content of the organic pigment is 100% by mass or less based on the total amount of the colorant.

The content of the colorant (more preferably an organic pigment) is preferably 20% by mass to 70% by mass, more preferably 25% by mass to 65% by mass, and still more preferably 30% by mass to 60% by mass, based on the total solid content (in a coloring radiation-sensitive composition to be described below, the total solid content thereof) of the composition, and accordingly, the composition may suitably achieve the aforementioned condition of the light transmittance when a film is formed to have a film thickness of 1 μm.

(Preparation of Pigment Dispersion Liquid)

As described above, it is preferred that the composition of the present invention contains a pigment, and in that case, it is preferred that the composition of the present invention is prepared by preparing a pigment dispersion liquid by dispersing the pigment together with other components such as a pigment dispersing agent, an organic solvent, a pigment derivative, and a polymer compound, if necessary, and then mixing the obtained pigment dispersion liquid with (B) a photopolymerization initiator, (C) a polymerizable compound, and other components added, if necessary.

Hereinafter, the composition of the pigment dispersion liquid and the method for preparing the pigment dispersion liquid will be described in detail.

The method for preparing a pigment dispersion liquid is not specifically limited, but the dispersion method may be performed, for example, by mixing a pigment and a pigment dispersing agent in advance, dispersing the mixture with a homogenizer or the like in advance, and finely-dispersing the resulting mixture with a bead disperser (for example, DISPERMAT manufactured by GETZMANN Co., Ltd.) using a zirconia beads or the like.

<Pigment Dispersing Agent>

Examples of a pigment dispersing agent which may be used for preparing the pigment dispersion liquid may include polymer dispersing agents (for example, polyamide amines and salts thereof, polycarboxylic acids and salts thereof, high molecular-weight unsaturated acid esters, modified polyurethanes, modified polyesters, modified poly(meth)acrylates, (meth)acrylic copolymers, and naphthalene sulfonic acid formalin condensates), surfactants such as polyoxyethylene alkyl phosphoric acid esters, polyoxyethylene alkyl amines, and alkanol amines, pigment derivatives, and the like.

The polymer dispersing agent may be further classified into a straight-chained polymer, a terminal-modification-type polymer, a graft-type polymer, and a block-type polymer, according to the structure thereof.

Examples of a terminal-modification-type polymer having an anchor moiety to a pigment surface may include polymers having a phosphoric acid group at a terminal, which are described in Japanese Patent Application Laid-Open No. H3-112992, Japanese Unexamined Patent Application Publication No. 2003-533455, and the like, polymers having a sulfonic acid group at a terminal, which are described in Japanese Patent Application Laid-Open No. 2002-273191, and the like, and polymers having a partial skeleton of an organic coloring matter or a heterocyclic ring, which are described in Japanese Patent Application Laid-Open No. H9-77994, and the like. Furthermore, polymers having a terminal into which two or more anchor moieties (such as an acidic group, a basic group, a partial skeleton of an organic coloring matter or a heterocyclic ring) to a pigment surface are introduced, which are described in Japanese Patent Application Laid-Open No. 2007-277514, are also preferred due to excellent dispersion stability.

Examples of a graft-type polymer having an anchor moiety to a pigment surface may include reaction products of poly(lower alkylene imine) and polyester, which are described in Japanese Patent Application Laid-Open No. S54-37082, Japanese Unexamined Patent Application Publication No. H8-507960, Japanese Patent Application Laid-Open No. 2009-258668, and the like, reaction products of polyallylamine and polyester, which are described in Japanese Patent Application Laid-Open No. H9-169821, and the like, copolymers of a macromonomer and a nitrogen atom monomer, which are described in Japanese Patent Application Laid-Open Nos. H10-339949 and 2004-37986, and the like, graft-type polymers having a partial skeleton of an organic coloring matter or a heterocyclic ring, which are described in Japanese Patent Application Laid-Open Nos. 2003-238837, 2008-9426, and 2008-81732, and the like, and copolymers of a macromonomer and an acid group-containing monomer, which are described in Japanese Patent Application Laid-Open No. 2010-106268, and the like. In particular, amphoteric dispersant resins having a basic group and an acidic group, which are described in Japanese Patent Application Laid-Open No. 2009-203462, are particularly preferred from the viewpoints of dispersibility and dispersion stability of a pigment dispersion, and developability which a coloring radiation-sensitive composition exhibits.

As the macromonomer used for preparing the graft-type polymer having an anchor moiety to a pigment surface by radical polymerization, a publicly known macromonomer may be used, and examples thereof may include macromonomers AA-6 (methyl polymethacrylate having a terminal methacryloyl group), AS-6 (polystyrene having a terminal methacryloyl group), AN-6S (styrene-acrylonitrile copolymer having a terminal methacryloyl group) and AB-6 (polybutyl acrylate having a terminal methacryloyl group) manufactured by TOAGOSEI CO., LTD., PLACCEL FM5 (a product in which 5 molar equivalent of ε-capro lactone is added to 2-hydroxyethyl methacrylate), and FA10L (a product in which 10 molar equivalent of ε-caprolactone is added to 2-hydroxyethyl acrylate) manufactured by Daicel Corporation, a polyester-based macromonomer described in Japanese Patent Application Laid-Open No. H2-272009, and the like. Among them, in particular, polyester-based macromonomers having excellent flexibility and solvent compatibility are particularly preferred from the viewpoint of dispersibility and dispersion stability of a pigment dispersion, and developability which a coloring radiation-sensitive composition obtained by using the pigment dispersion exhibits, and furthermore, polyester-based macromonomers represented by polyester-based macromonomers described in Japanese Patent Application Laid-Open No. H2-272009 are most preferred.

As a block-type polymer having an anchor moiety to a pigment surface, the block-type polymers described in Japanese Patent Application Laid-Open Nos. 2003-49110 and 2009-52010, and the like are preferred.

The pigment dispersing agents are also available as commercially available products, and specific examples thereof may include "DISPERBYK-101 (polyamide amine phosphate), 107 (carboxylic acid ester), 110 (acid group-containing copolymer), 130 (polyamide), 161, 162, 163, 164, 165, 166, and 170 (high-molecular weight copolymer), BYK-P104, and P105 (high-molecular weight unsaturated polycarboxylic acid)", which are manufactured by BYK Chemie GmbH, "EFKA 4047, 4050 to 4010 to 4165 (polyurethane-based), EFKA 4330 to 4340 (block copolymer), 4400 to 4402 (modified polyacrylate), 5010 (polyester amide), 5765 (high-molecular weight polycarboxylate), 6220 (fatty acid polyester), 6745 (phthalocyanine derivative), and 6750 (azo pigment derivative)" which are manufactured by EFKA Chemicals Co., Ltd., "AJISPER PB821, PB822, PB880 and PB881", which are manufactured by Ajinomoto Fine-Techno Co., Inc., "Florene TG-710 (urethane oligomer)" and "POLYFLOW No. 50E and No. 300 (acrylic copolymer)", which are manufactured by KYOEISHA CHEMICAL Co., Ltd., "Disparlon KS-860, 873SN, 874, and #2150 (aliphatic polyvalent carboxylic acid), #7004 (polyether ester), DA-703-50, DA-705, and DA-725", which are manufactured by Kusumoto Chemicals, Ltd., "DEMOL RN, N (naphthalene sulfonic acid formalin polycondensate), MS, C, and SN-B (aromatic sulfonic acid formalin polycondensate)", "HOMOGENOL L-18 (high-molecular polycarboxylic acid)", "EMULGEN 920, 930, 935, and 985 (polyoxyethylene nonyl phenyl ether)", and "ACETAMIN 86 (stearyl amine acetate)", which are manufactured by Kao Corporation, "SOLSPERSE 5000 (phthalocyanine derivative), 22000 (azo pigment derivative), 13240 (polyester amine), 3000, 17000, and 27000 (polymer having a functional moiety at a terminal), 24000, 28000, 32000, and 38500 (graft-type polymer)", which are manufactured by Lubrizol Japan Ltd., "Nikkol T106 (polyoxyethylene sorbitan monooleate), and MYS-IEX (polyoxyethylene monostearate)", which are manufactured by Nikko Chemicals Co., Ltd., HINOACT T-8000E and the like, which are manufactured by Kawaken Fine Chemicals Co., Ltd., organosiloxane polymer KP341 manufactured by Shin-Etsu Chemical Co., Ltd., "W001: cationic surfactant", non-ionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester, and anionic surfactants such as "W004, WOOS, and W017", which are manufactured by Yusho Co., Ltd., "EFKA-46, EFKA-47, EFKA-47EA, EFKA POLYMER 100, EFKA POLYMER 400, EFKA POLYMER 401, and EFKA POLYMER 450", which are manufactured by MORISHITA & CO., LTD., polymer dispersing agents such as "disperse aid 6, disperse aid 8, disperse aid 15, and disperse aid 9100", manufactured by SAN-NOPCO LIMITED, polymer dispersing agents such as "Adeka Pluronic L31, F38, L42, L44, L61, L64, F68, L72, P95, F77, P84, F87, P94, L101, P103, F108, L121, and P-123", which are manufactured by ADEKA Corporation, and "IONET S-20" manufactured by Sanyo Chemical Industries, Ltd., and the like.

Further, a block copolymer obtained by radical polymerizing a polymerizable unsaturated compound in the presence of a reversible addition-fragmentation chain transfer agent (RAFT agent) such as a dithiocarbonyl compound, and a radical initiator, or a copolymer having a narrow molecular weight distribution may also be used as the pigment dispersing agent. Specific examples of such resins may include resins described in Japanese Patent Application Laid-Open Nos. 2008-242081 and 2008-176218, and the like. In addition, the block copolymer or the copolymer having a narrow molecular weight distribution may also be used as an alkali-soluble resin.

It is preferred that the pigment dispersing agent is also a graft copolymer (hereinafter, also referred to "Specific Resin 1"). The graft polymer preferably has a graft chain having the number of atoms, except for hydrogen atoms, in a range of 40 to 10,000. The graft chain in this case indicates a portion from the source of the main chain of a copolymer (an atom which binds to the main chain in a group branched from the main chain) to the terminal of the group branched from the main chain. In a dispersion composition, since the specific resin is a dispersion resin which imparts dispersibility to a pigment, and the dispersion resin has affinity for the solvent by the graft chain, the dispersibility of the pigment and dispersion stability of the pigment after the passage of time are excellent. In addition, when the specific resin is used for a dispersion composition, the graft chain and the solvent shows excellent interaction with each other, and thus it is thought that the uniformity of film thickness in a coating film is suppressed from deteriorating.

As the graft copolymer, the number of atoms, except for hydrogen atoms, per graft chain is preferably 40 to 10,000, more preferably 100 to 500, and still more preferably 150 to 260. When the number is excessively small, the graft chain is short, and thus the steric repulsive effect decreases, thereby leading to deterioration in the dispersibility or dispersion stability in some cases. Meanwhile, when the number is excessively large, the graft chain is prolonged, and thus adsorptive force to a pigment deteriorates, thereby leading to deterioration in the dispersibility or dispersion stability in some cases. Meanwhile, the number of atoms, except for hydrogen atoms, per graft chain refers to the number of atoms, except for hydrogen atoms, which are included in a chain from an atom of the source bound to a polymer chain constituting the main chain to the terminal of a branched polymer branched from the main chain. Further, when two or more kinds of graft chains are included in the graft copolymer, it is sufficient for the number of atoms of at least one graft chain, except for hydrogen atoms, to satisfy the requirements.

As the polymer structure of the graft chain, a poly(meth)acrylic structure, a polyester structure, a polyurethane structure, a polyurea structure, a polyamide structure, a polyether structure and the like may be used, but in order to improve the interaction of the graft chain with a solvent and accordingly enhance the dispersibility or dispersion stability, a graft chain having a poly(meth)acrylic structure, a polyester structure, or a polyether structure is preferred, and a graft chain having a polyester structure or a polyether structure is more preferred.

The graft copolymer preferably has a structural unit (repeating unit) having the graft chain, and may be obtained, for example, by polymerizing a macromonomer having a polymer structure as the graft chain, based on a typical method, and the structure of a macromonomer is not particularly limited, as long as the macromonomer has a substituent capable of reacting with the polymer main chain moiety, and also has a graft chain satisfying the requirements, but preferably, macromonomers having a reactive double bond group may be suitably used.

Examples of commercially available macromonomers suitably used for synthesizing Specific Resin 1 may include AA-6 (manufactured by TOAGOSEI CO., LTD.), AA-10 (manufactured by TOAGOSEI CO., LTD.), AB-6 (manufactured by TOAGOSEI CO., LTD.), AS-6 (manufactured by TOAGOSEI CO., LTD.), AN-6 (manufactured by TOAGOSEI CO., LTD.), AW-6 (manufactured by TOAGOSEI CO., LTD.), AA-714 (manufactured by TOAGOSEI CO., LTD.), AY-707 (manufactured by TOAGOSEI CO., LTD.), AY-714 (manufactured by TOAGOSEI CO., LTD.), AK-5 (manufactured by TOAGOSEI CO., LTD.), AK-30 (manufactured by TOAGOSEI CO., LTD.), AK-32 (manufactured by TOAGOSEI CO., LTD.), BLEMMER PP-100 (manufactured by NOF CORPORATION), BLEMMER PP-500 (manufactured by NOF CORPORATION), BLEMMER PP-800 (manufactured by NOF CORPORATION), BLEMMER PP-1000 (manufactured by NOF CORPORATION), BLEMMER 55-PET-800 (manufactured by NOF CORPORATION), BLEMMER PME-4000 (manufactured by NOF CORPORATION), BLEMMER PSE-400 (manufactured by NOF CORPORATION), BLEMMER PSE-1300 (manufactured by NOF CORPORATION), BLEMMER 43PAPE-600B (manufactured by NOF CORPORATION), and the like. Among them, preferred examples thereof may include AA-6 (manufactured by TOAGOSEI CO., LTD.), AA-10 (manufactured by TOAGOSEI CO., LTD.), AB-6 (manufactured by TOAGOSEI CO., LTD.), AS-6 (manufactured by TOAGOSEI CO., LTD.), AN-6 (manufactured by TOAGOSEI CO., LTD.), BLEMMER PME-4000 (manufactured by NOF CORPORATION), and the like.

It is preferred that Specific Resin 1 includes, as the structural unit having the graft chain, at least structural unit represented by any one of the following Formulae (1) to (4).

[Chem. 2]

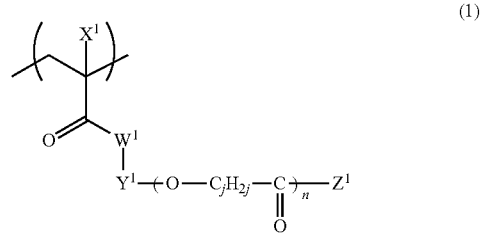

(1)

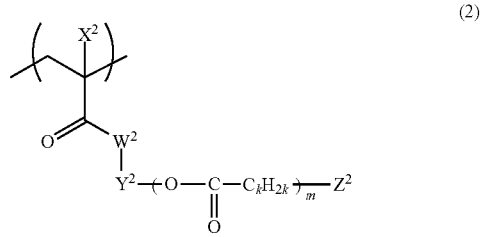

(2)

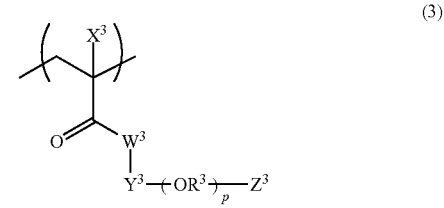

(3)

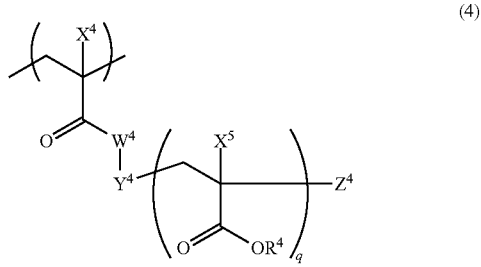

(4)

Each of $X^1$, $X^2$, $X^3$, $X^4$ and $X^5$ independently represents a hydrogen atom or a monovalent organic group. From the viewpoint of the restrictions on synthesis, a hydrogen atom or an alkyl group having a carbon number of 1 to 12 is preferred, a hydrogen atom or a methyl group is more preferred, and a methyl group is particularly preferred.

Each of $W^1$, $W^2$, $W^3$ and $W^4$ independently represents an oxygen atom or NH, and an oxygen atom is particularly preferred.

$R^3$ represents a branched or straight chained alkylene group (preferably having a carbon number of 1 to 10, and more preferably a carbon number of 2 or 3), and from the viewpoint of dispersion stability, a group represented by —$CH_2$—$CH(CH_3)$—, or a group represented by —CH($CH_3$)—$CH_2$— is preferred. Two or more kinds of $R^3$'s having different structures from one another in the specific resin may be mixed and used.

Each of $Y^1$, $Y^2$, $Y^3$, and $Y^4$ is independently a divalent linking group, and are not particularly limited in structure. Specifically, examples thereof may include linking groups from the following (Y-1) to (Y-21), and the like. In the following structures, each of A and B means a bond to the left terminal group and a bond to the right terminal group in Formulae (1) to (4), respectively. Among the structures shown below, (Y-2) and (Y-13) are more preferred in view of the convenience of synthesis.

[Chem. 3]

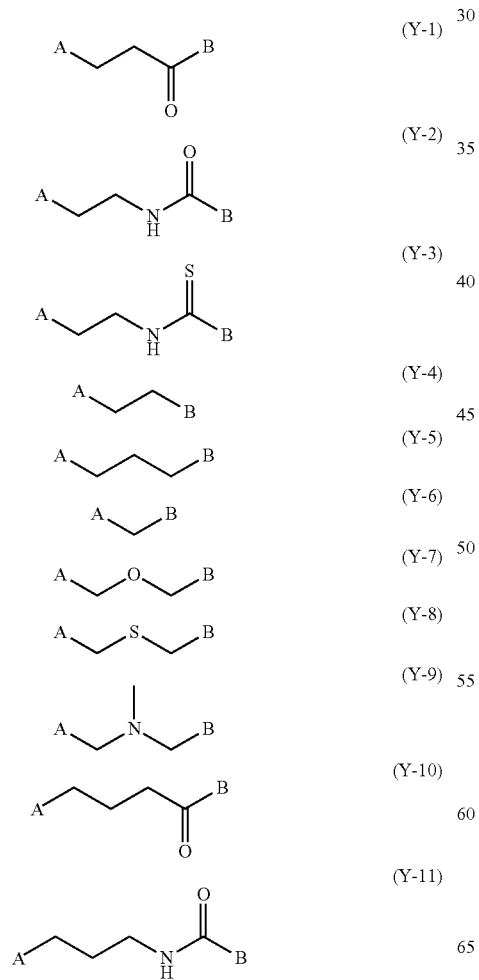

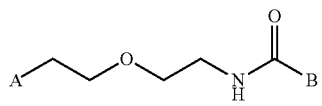

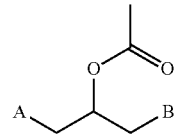

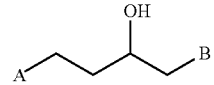

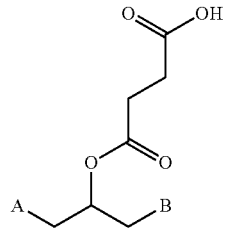

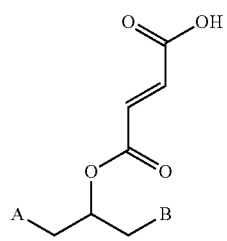

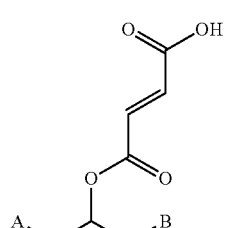

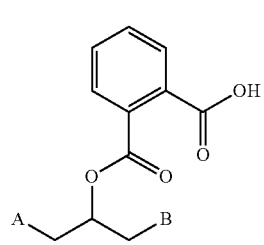

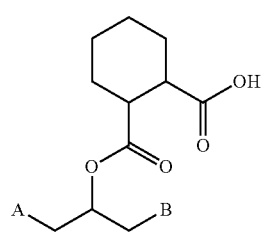

(Y-20)

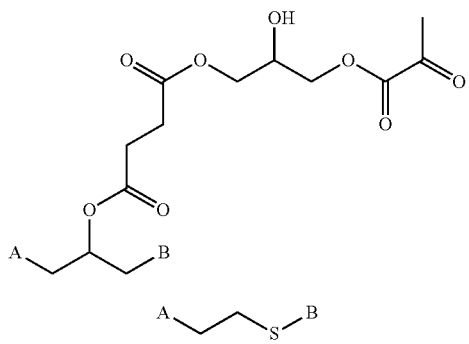

(Y-21)

A‿‿S‿‿B

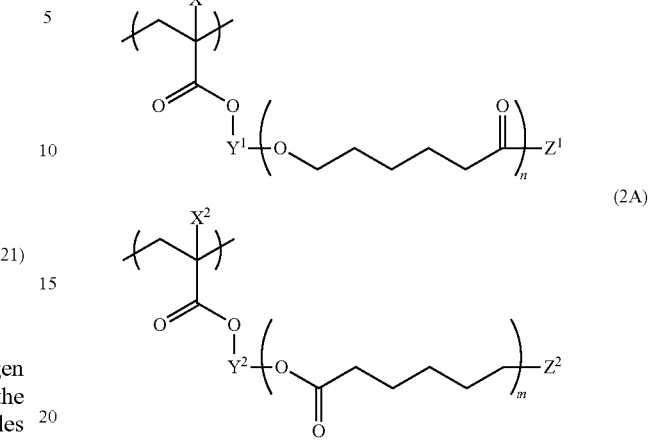

(1A)

(2A)

In Formula (1A), $X^1$, $Y^1$, $Z^1$, and n have the same meanings as $X^1$, $Y^1$, $Z^1$, and n in Formula (1), and the preferred ranges are also the same.

In Formula (2A), $X^2$, $Y^2$, $Z^2$, and m have the same meanings as $X^2$, $Y^2$, $Z^2$, and m in Formula (2), and the preferred ranges are also the same.

As Specific Resin 1, those having the structural unit represented by Formula (1A) are more preferred.

In Specific Resin 1, the structural unit (repeating unit) having the graft chain is included in a range of preferably 10% to 75%, more preferably 12% to 50%, and particularly preferably 15% to 40%, in terms of mass, based on the total mass of Specific Resin 1. When the amount is within these ranges, the dispersibility or dispersion stability of the pigment is high, so that the uniformity of film thickness in a coating film formed by using the dispersion composition is further improved. Furthermore, Specific Resin 1 may be a combination of two or more kinds of graft copolymers whose structures are different from one another.

Further, it is preferred that Specific Resin 1 is a polymer including a structural unit (repeating unit) having an acid group in an amount of 25% by mass to 90% by mass based on the total mass of Specific Resin 1. The content of the structural unit having an acid group is more preferably 50% by mass to 80% by mass, and most preferably 60% by mass to 75% by mass, based on the total mass of Specific Resin 1.

Further, when the content of the structural unit having an acid group is within the above range, the acid value of Specific Resin 1 may be suitably adjusted within the following preferred range.

In addition, the acid group may also serve as a functional group capable of forming interaction with the pigment in addition to the graft chain.

Examples of the acid group may include a carboxylate group, a sulfonate group, a phosphate group, a phenolic hydroxyl group, and the like, and from the viewpoint of adsorptive force to a pigment, dispersibility, and dispersion stability, at least one selected from a carboxylic acid group, a sulfonate group, and a phosphate group is preferred, and a carboxylate group is particularly preferred.

Furthermore, it is preferred that the acid group structure is a structure which is five atoms or more away from the main chain of the resin structure. Further, as the acid group, a carboxylate bonded to an aromatic ring is most preferred.

Each of $Z^1$, $Z^2$, $Z^3$, and $Z^4$ is independently a hydrogen atom or a monovalent substituent, and the structure of the substituent is not particularly limited, but specific examples thereof may include an alkyl group, a hydroxyl group, an alkoxy group, an aryloxy group, or a heteroaryloxy group, an alkyl thioether group, an aryl thioether group, or a heteroaryl thioether group, an amino group, and the like. Among them, particularly from the viewpoint of improving dispersibility, the substituent preferably has a steric repulsive effect, and as a monovalent substituent represented by $Z^1$ to $Z^3$, each of the substituents is independently preferably an alkyl group having a carbon number of 5 to 24 or an alkoxy group having a carbon number of 5 to 24, and among them, each of the substituents is independently particularly preferably an alkoxy group having a branched alkyl group having a carbon number of 5 to 24 or an alkoxy group having a cyclic alkyl group having a carbon number of 5 to 24. In addition, a monovalent substituent represented by $Z^4$ is preferably an alkyl group having a carbon number of 5 to 24, and among them, each of the substituents is independently preferably a branched alkyl group having a carbon number of 5 to 24 or a cyclic alkyl group having a carbon number of 5 to 24.

Each of n, m, p, and q is an integer of 1 to 500.

Each of j and k independently represents an integer of 2 to 8.

From the viewpoint of dispersion stability, j and k are preferably an integer of 4 to 6, and most preferably 5.

$R^4$ represents a hydrogen atom or a monovalent organic group, and is not particularly limited in structure, but is preferably a hydrogen atom, an alkyl group, an aryl group, and a heteroaryl group, and more preferably a hydrogen atom and an alkyl group. When $R^4$ is an alkyl group, the alkyl group is preferably a straight-chained alkyl group having a carbon number of 1 to 20, a branched alkyl group having a carbon number of 3 to 20, or a cyclic alkyl group having a carbon number of 5 to 20, more preferably a straight-chained alkyl group having a carbon number of 1 to 20, and particularly preferably a straight-chained alkyl group having a carbon number of 1 to 6. Two or more kinds of $R^4$'s having different structures from one another in the specific resin may be mixed and used.

As a structural unit represented by Formula (1), from the viewpoint of dispersion stability, a structural unit represented by the following Formula (1A) or (2A) is more referred.

As the acid group, these may be used either alone or in combination of two or more thereof.

The acid value of Specific Resin 1 is in a range of preferably 70 mgKOH/g to 350 mgKOH/g, more preferably 80 mgKOH/g to 300 mgKOH/g, and still more preferably 100 mgKOH/g to 250 mgKOH/g. By adjusting the acid group within the range, it is possible to more securely obtain a film having a small difference in film thickness between the central part and the peripheral part of a wafer even when the dispersion composition is applied on a wafer having a large size (for example, 12 inches).

The acid value of Specific Resin 1 may be calculated from, for example, the average content of the acid group in the specific resin. In addition, a resin having a desired acid value may be obtained by varying the content of a monomer unit containing an acid group constituting the specific resin.

Specific Resin 1 may further have a structural unit (repeating unit) having a functional group capable of forming interaction with the pigment in addition to the graft chain and the acid group. Such a structural unit having a functional group capable of forming interaction with the pigment is not particularly limited in structure, but examples thereof may include a structural unit having a basic group, a structural unit having a coordinating group, a structural unit having a group having reactivity, and the like.

Examples of the basic group may include a primary amino group, a secondary amino group, a tertiary amino group, a hetero ring including an N atom, an amide group, and the like. Particularly preferred is a tertiary amide group having good adsorptive force to a pigment and high dispersibility and dispersion stability. As the basic group, these may be used either alone or in combination of two or more thereof.

Specific Resin 1 may or may not contain a structural unit (repeating unit) having a basic group, but when Specific Resin 1 contains the structural unit, the content of the structural unit having a basic group is 0.1% by mass to 50% by mass, and particularly preferably 0.1% by mass to 30% by mass, based on the total mass of Specific Resin 1.

Examples of the coordinating group or the group having reactivity may include an acetyl acetoxy group, a trialkoxysilyl group, an isocyanate group, an acid anhydride residue, an acid chloride residue, and the like. Particularly preferred is an acetyl acetoxy group having good adsorptive force to a pigment and high dispersibility and dispersion stability. As the coordinating group or the group having reactivity, these may be used either alone or in combination of two or more thereof.

The specific resin may or may not contain a structural unit (repeating unit) having a coordinating group or a group having reactivity, but when the specific resin contains the structural unit, the content of the structural unit having a coordinating group or a group having reactivity is 0.1% by mass to 50% by mass, and particularly preferably 0.1% by mass to 30% by mass, based on the total mass of the specific resin.

Specific Resin 1 may be synthesized by a method publicly known in the related art. Examples of the solvent used during the synthesis may include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethyl formamide, N,N-dimethyl acetamide, dimethyl sulfoxide, toluene, ethyl acetate, methyl lactate, ethyl lactate, and the like. These solvents may be used either alone or in mixture of two or more kinds thereof.

Specific examples of Specific Resin 1 may include the following Exemplary Compounds 1 to 32, but the present invention is not limited thereto. Among the following exemplary compounds, the numerical value (numerical value written after the main chain repeating unit) written after each structural unit indicates the content of the structural unit [% by mass: described as (wt %)]. The numerical value written after the repeating unit of the side chain indicates the repeating number of the repeating moiety.

[Chem. 5]

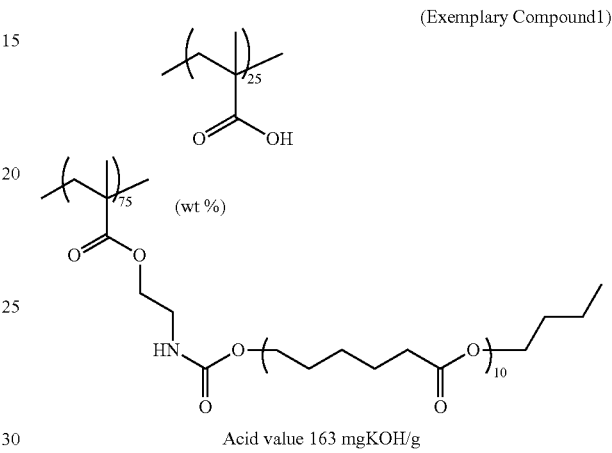

(Exemplary Compound 1)

Acid value 163 mgKOH/g

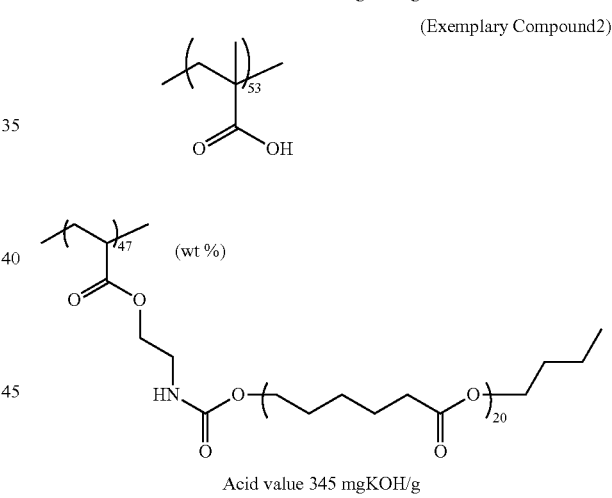

(Exemplary Compound 2)

Acid value 345 mgKOH/g

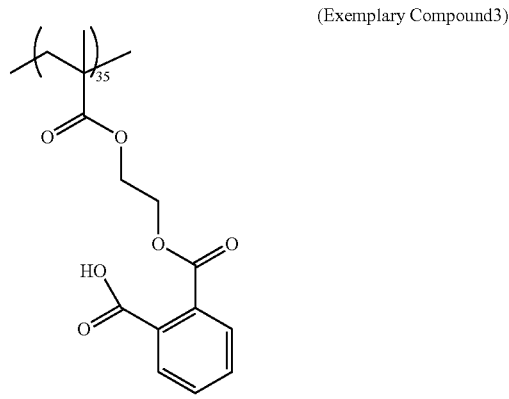

(Exemplary Compound 3)

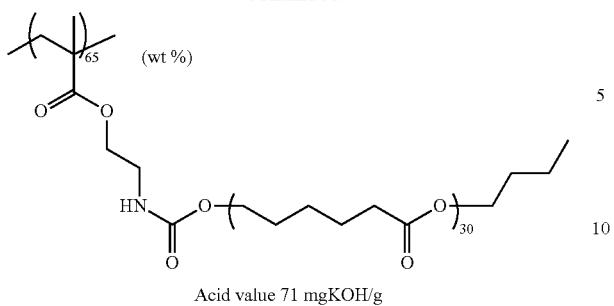
Acid value 71 mgKOH/g
[Chem. 6]
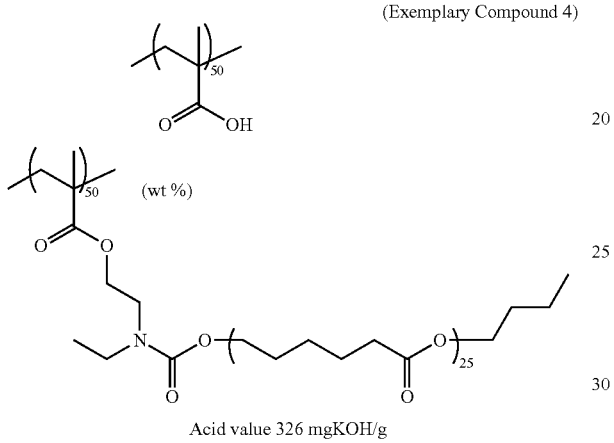
Acid value 326 mgKOH/g
(Exemplary Compound 5)
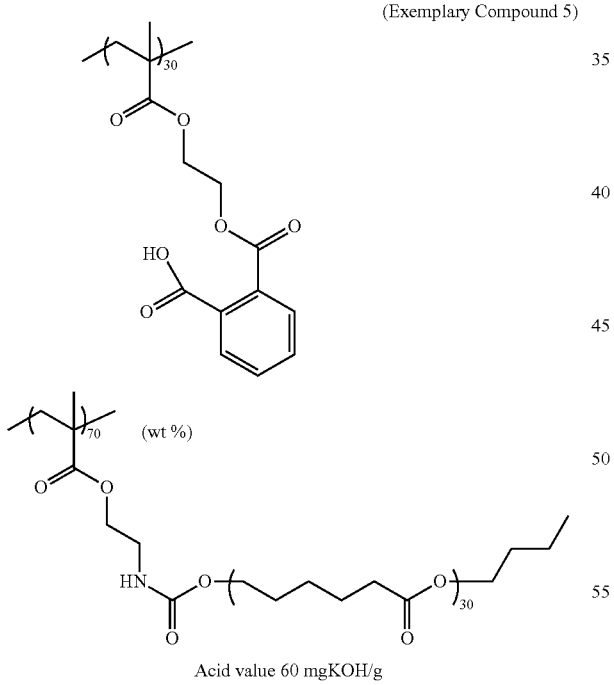
Acid value 60 mgKOH/g
(Exemplary Compound 6)
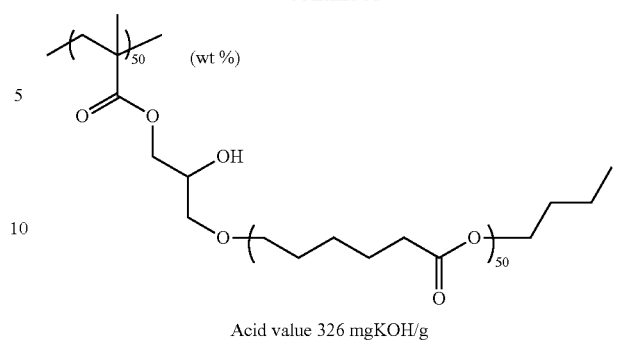
Acid value 326 mgKOH/g
(Exemplary Compound 7)
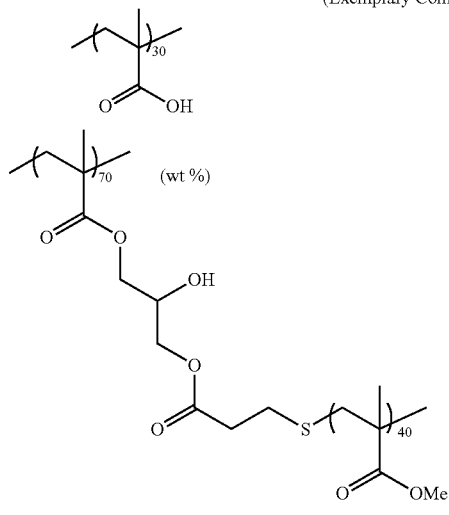
Acid value 196 mgKOH/g
[Chem. 7]
(Exemplary Compound 8)
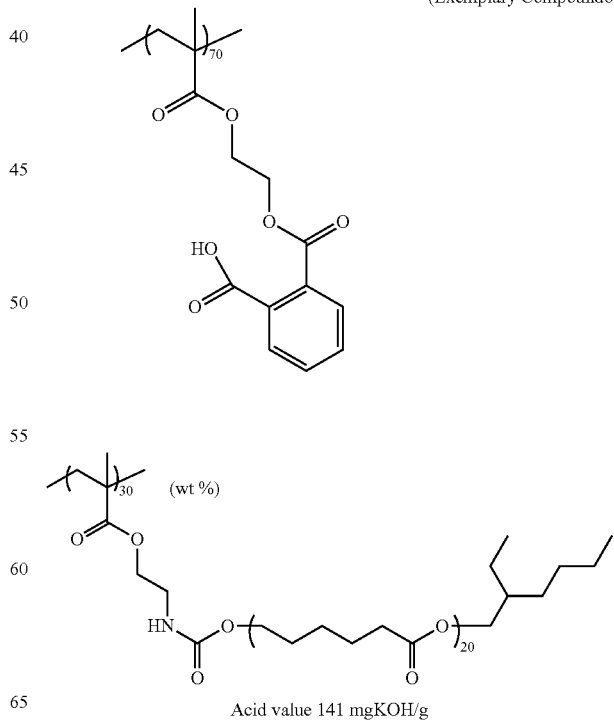
Acid value 141 mgKOH/g (Exemplary Compound9)
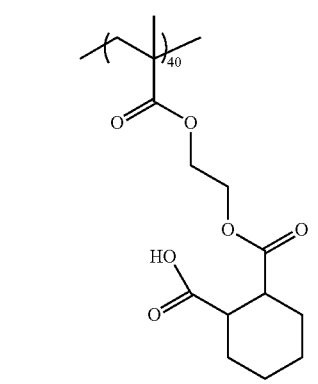
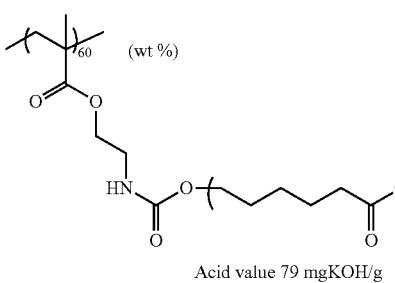
Acid value 79 mgKOH/g
(Exemplary Compound10)
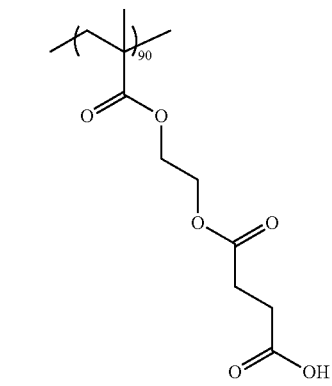
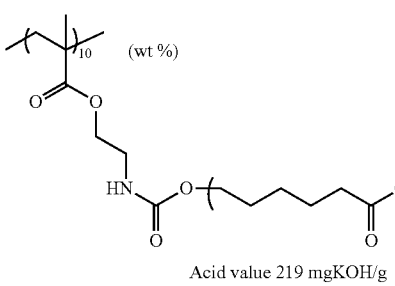
Acid value 219 mgKOH/g
(Exemplary Compound11)
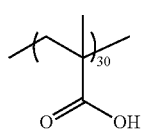
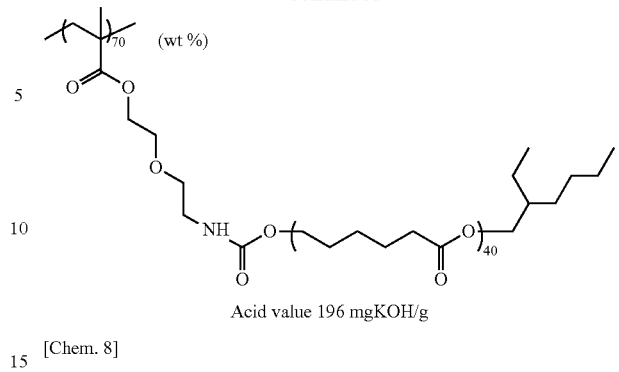
Acid value 196 mgKOH/g
[Chem. 8]
(Exemplary Compound12)
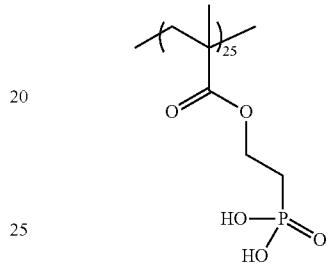
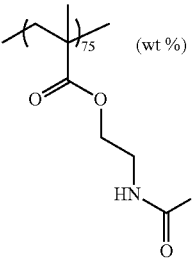
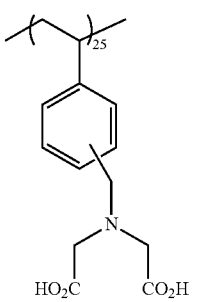
Acid value 144 mgKOH/g
(Exemplary Compound13)
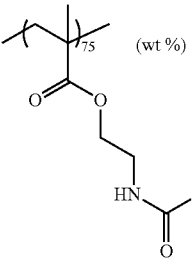
Acid value 113 mgKOH/g

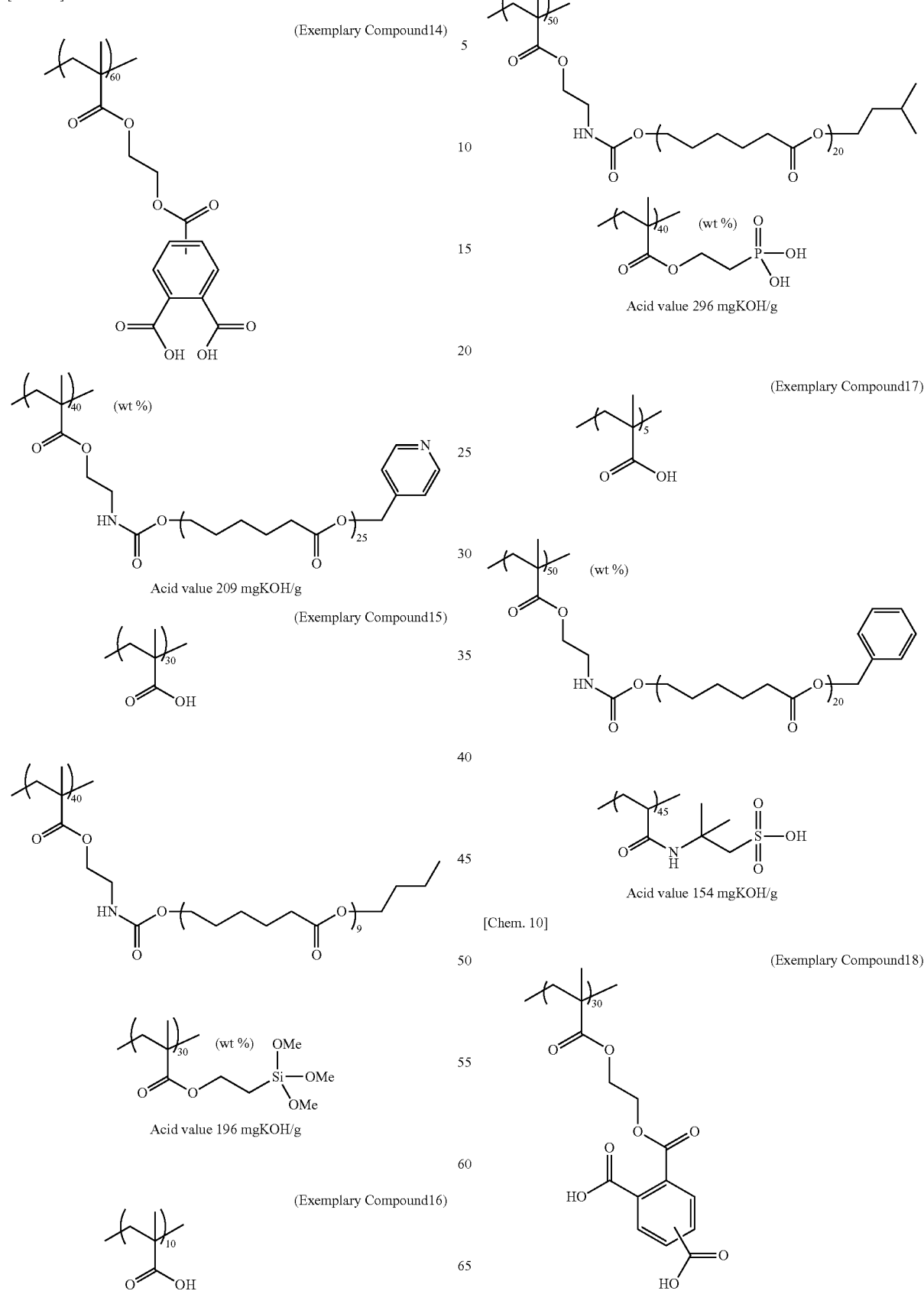

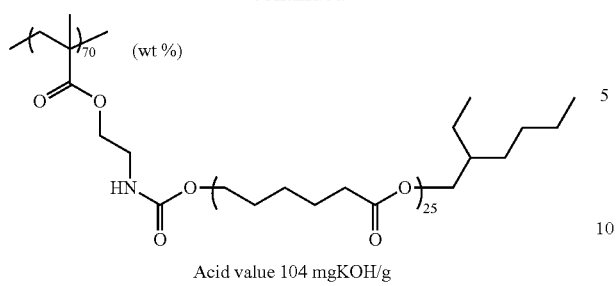
Acid value 104 mgKOH/g
(Exemplary Compound19)
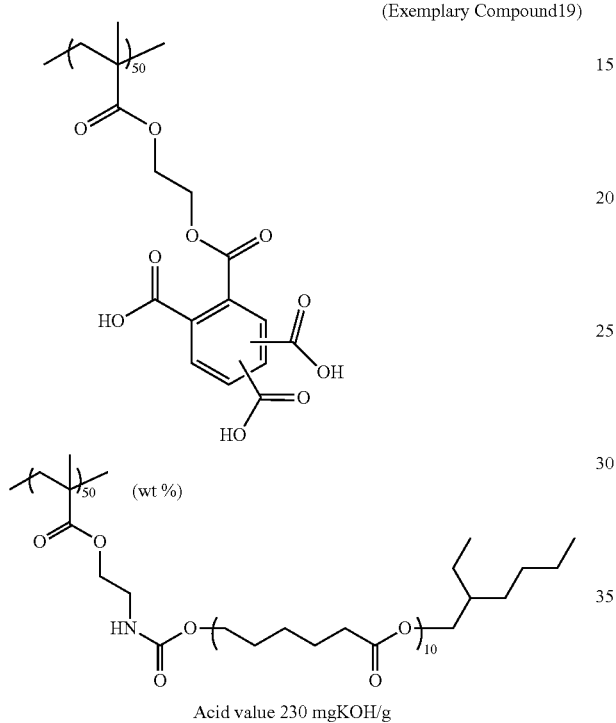
Acid value 230 mgKOH/g
(Exemplary Compound20)
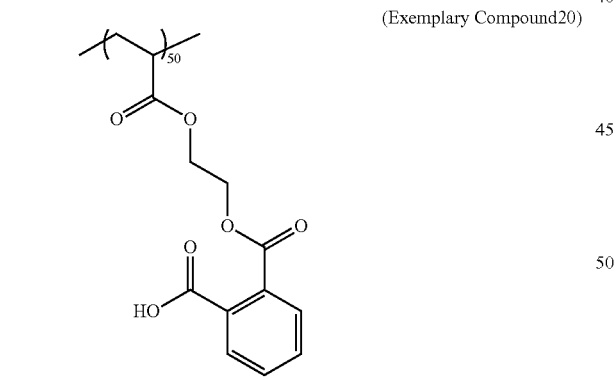
Acid value 101 mgKOH/g
(Exemplary Compound21)
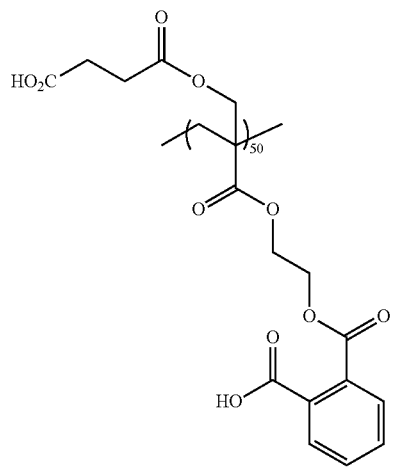
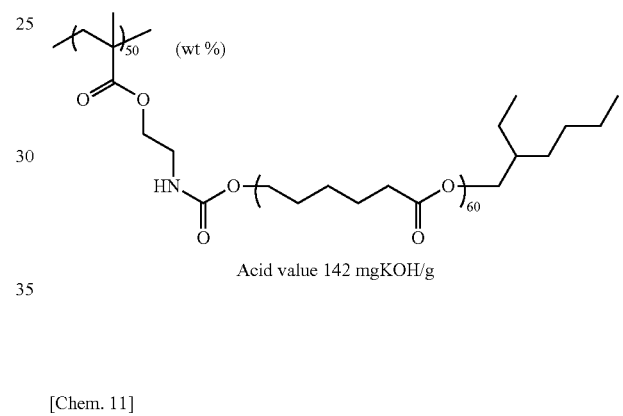
Acid value 142 mgKOH/g
[Chem. 11]
(Exemplary Compound22)
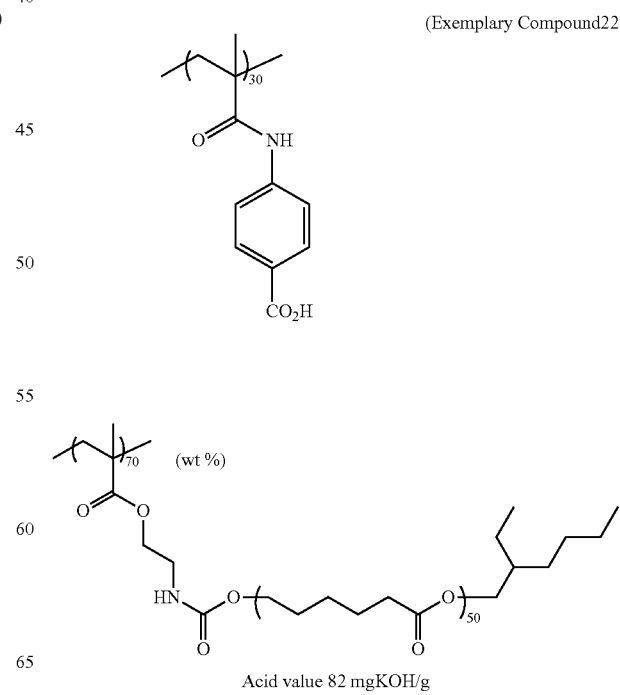
Acid value 82 mgKOH/g (Exemplary Compound23)
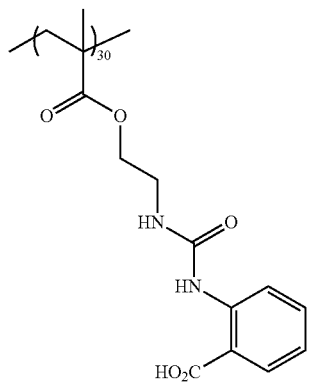
Acid value 58 mgKOH/g
(Exemplary Compound24)
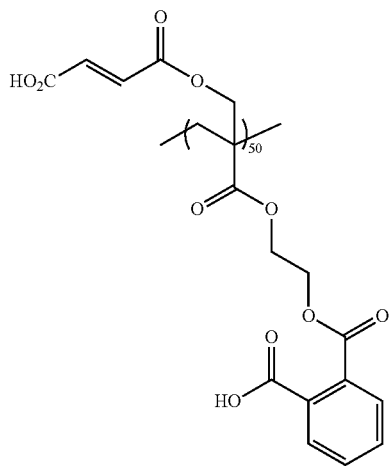
Acid value 143 mgKOH/g
(Exemplary Compound25)
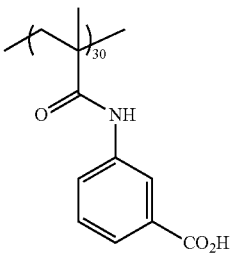
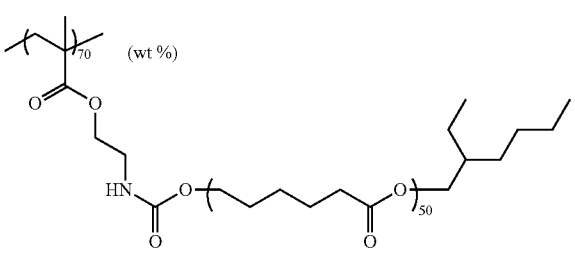
Acid value 82 mgKOH/g
[Chem. 12]
(Exemplary Compound26)
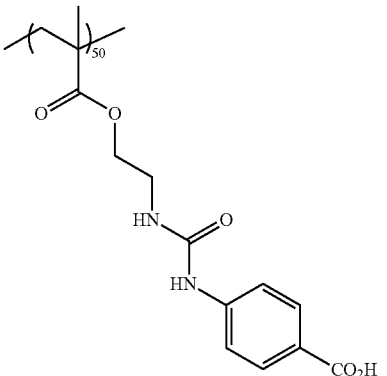
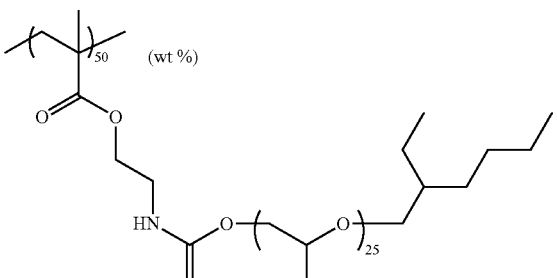
Acid value 96 mgKOH/g (Exemplary Compound27)
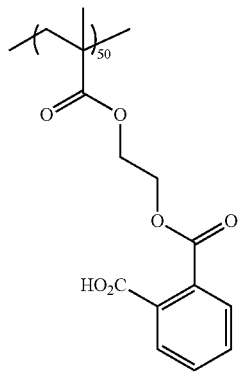
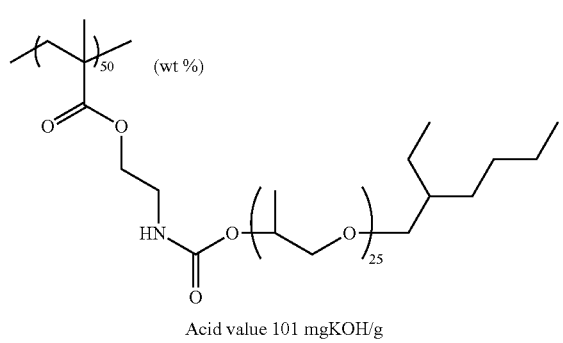
Acid value 101 mgKOH/g
(Exemplary Compound28)
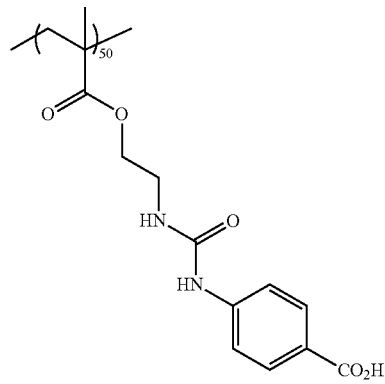
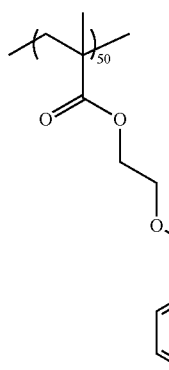
Acid value 96 mgKOH/g
(Exemplary Compound29)
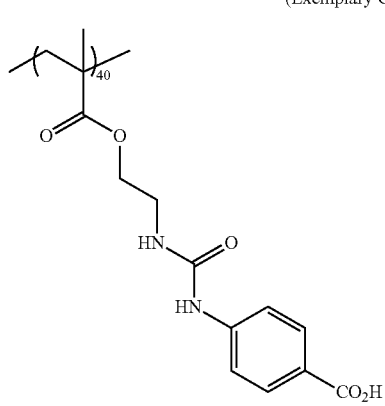
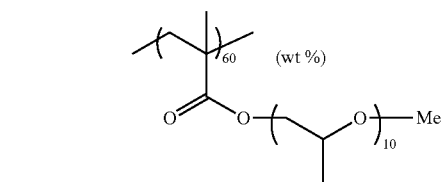
Acid value 77 mgKOH/g
[Chem. 13]
(Exemplary Compound30)
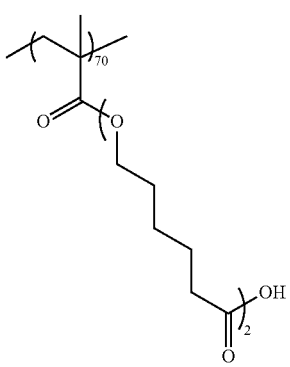
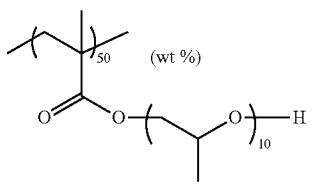
Acid value 101 mgKOH/g
(Exemplary Compound31)

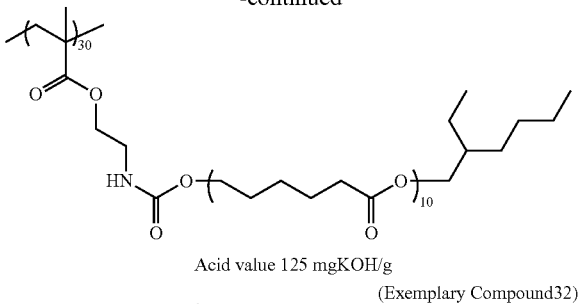

Acid value 125 mgKOH/g (Exemplary Compound 32)

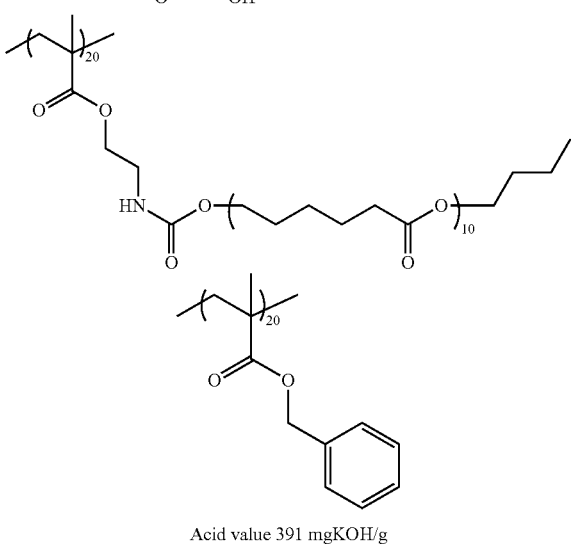

Acid value 391 mgKOH/g

The weight average molecular weight (polystyrene equivalent value measured by the GPC method) of Specific Resin 1 is preferably 5,000 to 300,000, more preferably 7,000 to 100,000, and particularly preferably 10,000 to 50,000.

It is preferred that an oligoimine-based dispersing agent including a nitrogen atom in at least one of the main chain and the side chain is also used as the pigment dispersing agent. As the oligoimine-based dispersing agent, a dispersion resin (hereinafter, appropriately referred to as "Specific Resin 2"), which has a repeating unit having a partial structure X having a functional group with a pKa of 14 or less, and a side chain including a side chain Y having 40 to 10,000 atoms, and also has a basic nitrogen atom in at least one of the main chain or the side chain, is preferred. Here, the basic nitrogen atom is not particularly limited as long as the basic nitrogen atom is a nitrogen atom which exhibits basicity.

Specific Resin 2 may have a partial structure W which pairs up with the partial structure X and the like, and the partial structure W is preferably a structural portion which has a nitrogen atom with $pK_b$ of 14 or less, and more preferably contains a structure which has a nitrogen atom with $pK_b$ of 10 or less. The basic strength $pK_b$ refers to $pK_b$ at a water temperature of 25° C., and is one index for quantitatively representing the strength of the basic group, and has the same meaning as the basicity constant. The basic strength $pK_b$ and the acid strength $PK_a$ to be described below have a relationship of $pK_b=14-pK_a$. Here, when the partial structure X and the partial structure W form a salt structure in pairs, assuming a structure where the partial structure X and the partial structure W are each dissociated, $PK_a$ and $pK_b$ are evaluated as a compound where a proton ($H^+$) to a hydroxide ion ($OH^-$) are ionically bonded to the structure. The details on the partial structure X will be described below.

For the partial structure X, the details on the preferred ranges thereof have the same meaning as those of the partial structure X to be described below. In addition, the details on the preferred ranges of the side chain Y also have the same meaning as those of the side chain Y to be described below. The W described above is preferably a structure where the linking portion of the side chain Y is dissociated and is an ion bonding site.

An example of Specific Resin 2 is a resin represented by the following Formula [B].

[Chem. 14]

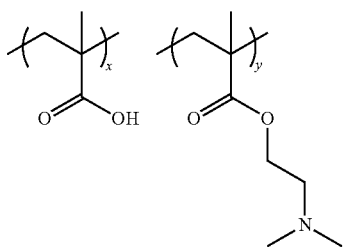

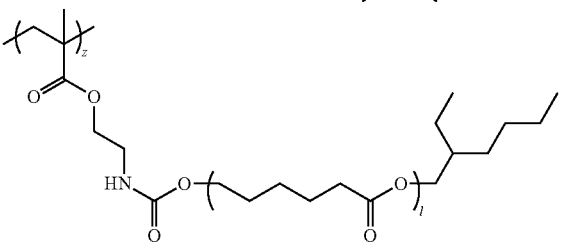

[B]

In the formula, x, y, and z each indicate the polymerization molar ratios of the repeating units, and it is preferred that x is 5 to 50, y is 5 to 60, and z is 10 to 90. 1 represents a linking number of the polyester chains and is an integer which is able to form a side chain with 40 to 10,000 atoms, and 1 is preferably 5 to 100,000, more preferably 20 to 20,000, and still more preferably 40 to 2,000. The repeating unit where the copolymerization ratio is defined by x in the formula is the partial structure X, and the repeating unit where the copolymerization ratio is defined by z in the formula is the partial structure Y.

It is particularly preferred that Specific Resin 2 is at least one repeating unit having a basic nitrogen atom, which is selected from (i) a poly(lower alkyleneimine)-based repeating unit, a polyallylamine-based repeating unit, a polydiallylamine-based repeating unit, a methaxylenediamine-epichlorohydrin polycondensate-based repeating unit, and a polyvinylamine-based repeating unit, and is a dispersion resin (hereinafter, appropriately referred to as "Specific Resin (B1)") which has a repeating unit (i) which has the partial structure X having a functional group with a pKa of 14 or less while being bonded to the basic nitrogen atom, and a side chain (ii) which includes the side chain Y having 40 to 10,000 atoms.

Specific Resin (B1) has the repeating unit (i). Accordingly, it is possible to reduce the interaction among the particles while the adsorptive force of the dispersion resin on the particle surface is improved. The poly(lower alkyleneimine) may have a chain shape or a mesh shape. Here, a lower alkyleneimine means an alkyleneimine which includes an alkylene chain having a carbon number of 1 to 5. It is preferred that the repeating unit (i) forms the main chain moiety in Specific Resin (B1). The number-average molecular weight of the main chain moiety, that is, the number-average molecular weight of portions, except for the side chain including the side chain Y portion in Specific Resin (B1), is preferably 100 to 10,000, more preferably 200 to 5,000, and most preferably 300 to 2,000. The number-average molecular weight of the main chain moiety may be measured by the polystyrene equivalent value according to the GPC method.

Specific Resin (B1) is preferably a dispersion resin which includes a repeating unit represented by the following Formula (I-1) and a repeating unit represented by the following Formula (I-2), or the repeating unit represented by Formula (I-1) and a repeating unit represented by the following Formula (I-2a).

[Chem. 15]

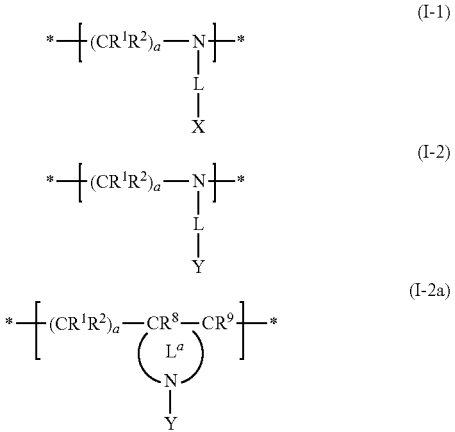

Each of $R^1$ and $R^2$ independently represents a hydrogen atom, a halogen atom or an alkyl group (which preferably has a carbon number of 1 to 6). Each a independently represents an integer of 1 to 5. * represents a linking portion between the repeating units. $R^8$ and $R^9$ are the same groups as $R^1$.

L is a single bond, an alkylene group (which preferably has a carbon number of 1 to 6), an alkenylene group (which preferably has a carbon number of 2 to 6), an arylene group (which preferably has a carbon number of 6 to 24), a heteroarylene group (which preferably has a carbon number of 1 to 6), an imino group (which preferably has a carbon number of 0 to 6), an ether group, a thioether group, a carbonyl group, or a linking group which is related to a combination thereof. Among them, a single bond or —$CR^5R^6$—$NR^7$— (an imino group becomes either X or Y) is preferred. Here, each $R^5R^6$ independently represents a hydrogen atom, a halogen atom or an alkyl group (which preferably has a carbon number of 1 to 6). $R^7$ is a hydrogen atom or an alkyl group having a carbon number of 1 to 6.

$L^a$ is a structural site which forms a ring structure along with $CR^8CR^9$ and N, and is preferably a structural site which forms a non-aromatic heterocycle having a carbon number of 3 to 7 along with the carbon atoms of $CR^8CR^9$. $L^a$ is more preferably a structural site which forms a 5- to 7-membered non-aromatic heterocycle along with the carbon atoms of $CR^8CR^9$ and N (a nitrogen atom), still more preferably a structural site which forms a 5-membered non-aromatic heterocycle, and particularly preferably a structural site which forms pyrrolidino. However, the structural site may further have a substituent such as an alkyl group.

X represents a group having a functional group with a pKa of 14 or less.

Y represents a side chain having 40 to 10,000 atoms.

It is preferred that Specific Resin (B1) also has a repeating unit represented by Formula (I-3), Formula (I-4), or Formula (I-5) as a copolymer component. Specific Resin (B1) may include such a repeating unit, thereby further improving the dispersion performance.

[Chem. 16]

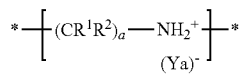

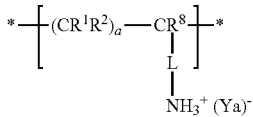

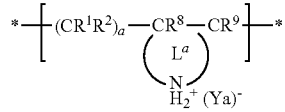

$R^1$, $R^2$, $R^8$, $R^9$, L, La, and * have the same meaning as the definition in Formulae (I-1), (I-2), and (I-2a).

Ya represents a side chain which includes an anion group and has 40 to 10,000 atoms. The repeating unit represented by Formula (I-3) may be formed by causing a reaction by adding an oligomer or a polymer, which has a group forming salt by reacting with amine, to a resin having a primary or secondary amino group in the main chain moiety. Ya is preferably the Formula (III-2) to be described below.

In Formulae (I-1) to (I-5), $R^1$ and $R^2$ are particularly preferably a hydrogen atom. a is preferably 2 from the viewpoint of the availability of raw materials.

Specific Resin (B1) may include a lower alkyleneimine, which contains a primary or tertiary amino group, as a repeating unit. Meanwhile, a group represented by X, Y or Ya may be bonded to a nitrogen atom in such a lower alkyleneimine repeating unit. A resin which includes both a repeating unit to which the group represented by X is bonded and a repeating unit to which Y is bonded in such a main chain structure is also encompassed by Specific Resin (B1).

From the viewpoint of the storage stability and the developability, the repeating unit represented by Formula (I-1) is contained in an amount of preferably 1 to 80 mol % and most preferably 3 to 50 mol % in the entire repeating units included in Specific Resin (B1). From the viewpoint of the storage stability, the repeating unit represented by Formula (I-2) is contained in an amount of preferably 10 to 90 mol % and most preferably 30 to 70 mol % in the entire repeating units included in Specific Resin (B1). From the viewpoint of the balance between the dispersion stability and the hydrophilicity, the content ratio [(I-1):(I-2)] of the repeating unit (I-1) and the repeating unit (I-2) is preferably in a range of 10:1 to 1:100 in the molar ratio, and more preferably in a range of 1:1 to 1:10. From the point of view of the effect, the repeating unit represented by Formula (I-3), which is used in combination as desired, is contained in an amount of preferably 0.5 to 20 mol % and most preferably 1 to 10 mol % in the entire repeating units included in Specific Resin (B1). Meanwhile, it is possible to confirm that the polymer chain Ya is ionically bonded using infrared spectroscopy or base titration.

Meanwhile, the description on the copolymer ratio of Formula (I-2) also applies to the repeating units represented by Formulae (I-2a), (I-4), and (I-5), and the copolymerization ratio means the total amount when both are included.

Partial Structure X

The partial structure X in each of the formulae described above has a functional group where the pKa is 14 or less at a water temperature of 25° C. The definition of "pKa" here mentioned is described in Chemical Manual (II) (Amendment 4th edition, 1993, Chemical Society of Japan, Maruzen Co., Ltd.). The structure of "a functional group with a pKa of 14 or less" and the like are not particularly limited as long as the physical properties thereof satisfy these conditions, and examples thereof may include a publicly known functional group where the pKa satisfies the range described above, but a functional group with a pKa of 12 or less is preferred, and a functional group with a pKa of 11 or less is particularly preferred. The lower limit thereof is not particularly limited, but −5 or more is realistic. Specifically, as the partial structure X, a carboxylic acid group (pKa approximately 3 to 5), a sulfonic acid (pKa: approximately −3 to −2), —COCH$_2$CO— (pKa: approximately 8 to 10), —COCH$_2$CN (pKa: approximately 8 to 11), —CONH$_2$CO—, a phenolic hydroxyl group, —R$_F$CH$_2$OH or —(R$_F$)$_2$CHOH (R$_F$ represents a perfluoroalkylene group or a perfluoroalkyl group. pKa: approximately 9 to 11), and a sulfonamide group (pKa: approximately 9 to 11), and a carboxylic acid group (pKa: approximately 3 to 5), a sulfonic acid group (pKa: approximately −3 to −2) and —COCH$_2$CO— (pKa approximately 8 to 10) are particularly preferred.

The partial structure X may have a functional group with a pKa of 14 or less, thereby achieving the interaction with the highly refractive particles. It is preferred that the partial structure X is directly bonded to a basic nitrogen atom in the repeating unit which has the basic nitrogen atom. The partial structure X may be linked in an aspect where a salt is formed by an ionic bond in addition to a covalent bond. In particular, it is preferred that the partial structure X has a structure represented by the following Formula (V-1), Formula (V-2), or Formula (V-3).

[Chem. 17]

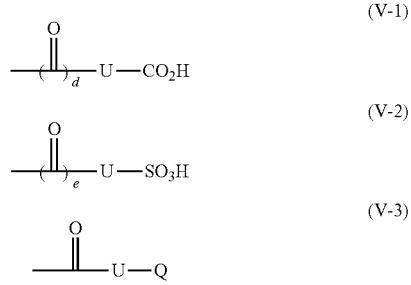

U represents a single bond or a divalent linking group.

Each of d and e independently represents 0 or 1.

Q represents an acyl group or an alkoxycarbonyl group.

Examples of the divalent linking group represented by U may include an alkylene (more specifically, for example, —CH$_2$—, —CH$_2$CH$_2$—, —CH$_2$CHMe- (Me is a methyl group), —(CH$_2$)$_5$—, —CH$_2$CH(n-C$_{10}$H$_{21}$)—, and the like), an alkylene containing oxygen (more specifically, for example, —CH$_2$OCH$_2$—, —CH$_2$CH$_2$OCH$_2$CH$_2$—, and the like), an arylene group (for example, phenylene, tolylene, biphenylene, naphthylene, furanylene, pyrrolylene, and the like), an alkyleneoxy (for example, ethyleneoxy, propyleneoxy, phenyleneoxy, and the like), but an alkylene group having a carbon number of 1 to 30 or an arylene group having a carbon number of 6 to 20 is particularly preferred, and an alkylene group having a carbon number of 1 to 20 or an arylene group having a carbon number of 6 to 15 is most preferred.

In addition, from the viewpoint of productivity, d is preferably 1, and e is preferably 0.

Q represents an acyl group or an alkoxycarbonyl group. The acyl group in Q is preferably an acyl group having a carbon number of 1 to 30 (for example, formyl, acetyl, n-propanoyl, benzoyl, and the like), and particularly preferably acetyl. As the alkoxycarbonyl group in Q, Q is particularly preferably an acyl group, and from the viewpoint of the ease of manufacturing and the availability of the raw materials (X$^a$ which is a precursor of X), an acetyl group is preferred.

It is preferred that the partial structure X is bonded to a basic nitrogen atom in the repeating unit which has the basic nitrogen atom. Accordingly, the dispersibility and dispersion stability of the titanium dioxide particles are remarkably improved. It is considered that the partial structure X also imparts a solvent solubility to suppress the education of the resin as time passes, and accordingly, contributes to the dispersion stability. Furthermore, the partial structure X includes a functional group with a pKa of 14 or less and thus also functions as an alkali-soluble group. Accordingly, it is considered that the developability is improved, and therefore, it is possible to satisfy all of the dispersibility, the dispersion stability, and the developability.

The content of a functional group with a pKa of 14 or less in the partial structure X is not particularly limited, but is preferably 0.01 to 5 mmol, and particularly preferably 0.05 to 1 mmol, based on 1 g of Specific Resin (131). In addition, it is preferred from the viewpoint of the developability that an amount where the acid value of Specific Resin (B1) is approximately 5 mgKOH/g to 50 mgKOH/g is included from viewpoint of the acid value.

Side Chain Y

Examples of Y may include a publicly known polymer chain, such as polyester, polyamide, polyimide and poly(meth)acrylic acid ester, which are able to link with the main chain moiety of Specific Resin (B1). It is preferred that the bonding site with Specific Resin (B1) in Y is the terminal of the side chain Y.

Y is preferably bonded to the nitrogen atom in at least one of the repeating unit having a nitrogen atom, which is selected from a poly(lower alkyleneimine)-based repeating unit, a polyallylamine-based repeating unit, a polydiallylamine-based repeating unit, a metaxylenediamine-epichlorohydrin polycondensate-based repeating unit, and a polyvinylamine-based repeating unit. The bonding mode between Y and the main chain section of a repeating unit which has at least one of basic nitrogen atom which is selected from a poly(lower alkyleneimine)-based repeating unit, a polyallylamine-based repeating unit, a polydiallylamine-based repeating unit, a metaxylenediamino-epichlorohydrin polycondensate-based repeating unit, and a polyvinylamine-based repeating unit, is a covalent bond, an ionic bond, or a mixture of a covalent bond and an ionic bond. The ratio of the bonding mode between Y and the main chain moiety is the covalent bond:the ionic bond=100:0 to 0:100, but is preferably 95:5 to 5:95, and particularly preferably 90:10 to 10:90.

It is preferred that Y is amide-bonded to the nitrogen atom in the repeating unit having the basic nitrogen atom, or ionically bonded as a carboxylic acid salt.

From the viewpoint of the dispersibility, the dispersion stability and the developability, the number of atoms of the side chain Y is preferably 50 to 5,000, and more preferably 60 to 3,000.

In addition, the number-average molecular weight of Y may be measured by the polystyrene equivalent value according to the GPC method. In this case, it is practical to measure the molecular weight of Y in a state before Y is inserted into the resin. The number-average molecular weight of Y is particularly preferably 1,000 to 50,000, and most preferably 1,000 to 30,000 from the point of view of the dispersibility, the dispersion stability, and the developability. It is possible to specify the molecular weight of Y from the polymer compound which is a raw material for Y, and the measurement method thereof is based on the measuring conditions according to the GPC to be described below.

Preferably, two or more of the side chain structures represented by Y and particularly preferably five or more thereof are linked with respect to the main chain linkage, in one molecule of the resin.

In particular, it is preferred that Y has a structure represented by Formula (III-1).

[Chem. 18]

(III-1)

In Formula (III-1), Z is a polymer or an oligomer which has a polyester chain as a partial structure, and represents a residue where a carboxyl group is removed from the polyester which has a free carboxylic acid represented by HO—CO—Z. When Specific Resin (B1) contains the repeating unit represented by Formulae (I-3) to (I-5), Ya is preferably Formula (III-2).

[Chem. 19]

(III-2)

In Formula (III-2), Z has the same meaning as Z in Formula (III-1). For the partial structure Y described above, it is possible to obtain a polyester having a carboxyl group in one terminal by polycondensation of carboxylic acid and lactone, polycondensation of a hydroxy group-containing carboxylic acid, polycondensation of a divalent alcohol and a divalent carboxylic acid (or cyclic acid anhydride), and the like.

Z is preferably $-(L^B)_{nB}-Z^B$.

$Z^B$ represents a hydrogen atom or a monovalent organic group. When $Z^B$ is an organic group, an alkyl group (which preferably has a carbon number of 1 to 30), an aryl group, a heterocyclic group, or the like is preferred. $Z^B$ may further have a substituent, and examples of the substituent may include an aryl group having a carbon number of 6 to 24 and a heterocyclic group having a carbon number of 3 to 24.

$L^B$ is an alkylene group (which preferably has a carbon number of 1 to 6), an alkenylene group (which preferably has a carbon number of 2 to 6), an arylene group (which preferably has a carbon number of 6 to 24), a heteroarylene group (which preferably has a carbon number of 1 to 6), an imino group (which preferably has a carbon number of 0 to 6), an ether group, a thioether group, a carbonyl group, or a linking group which is related to a combination thereof. Among them, an alkylene group (which preferably has a carbon number of 1 to 6), an ether group, a carbonyl group, or a linking group relating to a combination thereof is preferred. The alkylene group may be branched or straight-chained. The alkylene group may have a substituent, and preferred substituents are an alkyl group (which preferably has a carbon number of 1 to 6), an acyl group (which preferably has a carbon number of 2 to 6), an alkoxy group (which preferably has a carbon number of 1 to 6), or an alkoxycarbonyl group (which preferably has a carbon number of 2 to 8). nB is an integer of 5 to 100,000. $L^B$'s of nB number may each have a different structure.

The specific aspect of Specific Resin 2 will be shown below by the specific structures of the repeating units of the resin and combinations thereof, but the present invention is not limited thereto. In the following formulae, k, l, m and n each represent the polymerization molar ratio of the repeating unit, and k is 1 to 80, l is 10 to 90, m is 0 to 80, and n is 0 to 70, and further, k+l+m+n=100. Those defined by k, l, and m and those defined as k and l mean k+l+m=100 and k+l=100, respectively. p and q indicate the number of linkages of the polyester chain, and each independently represent 5 to 100,000. $R^a$ represents a hydrogen atom or an alkylcarbonyl group.

[Chem. 20]

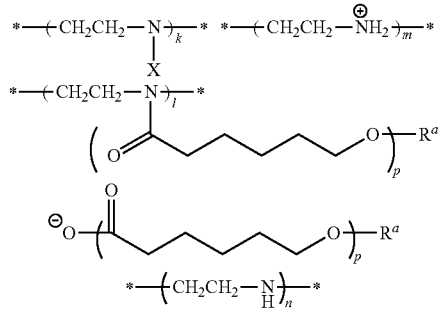

| | X |
|---|---|
| (A-1) | 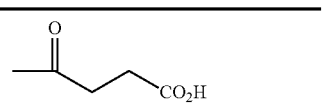 |

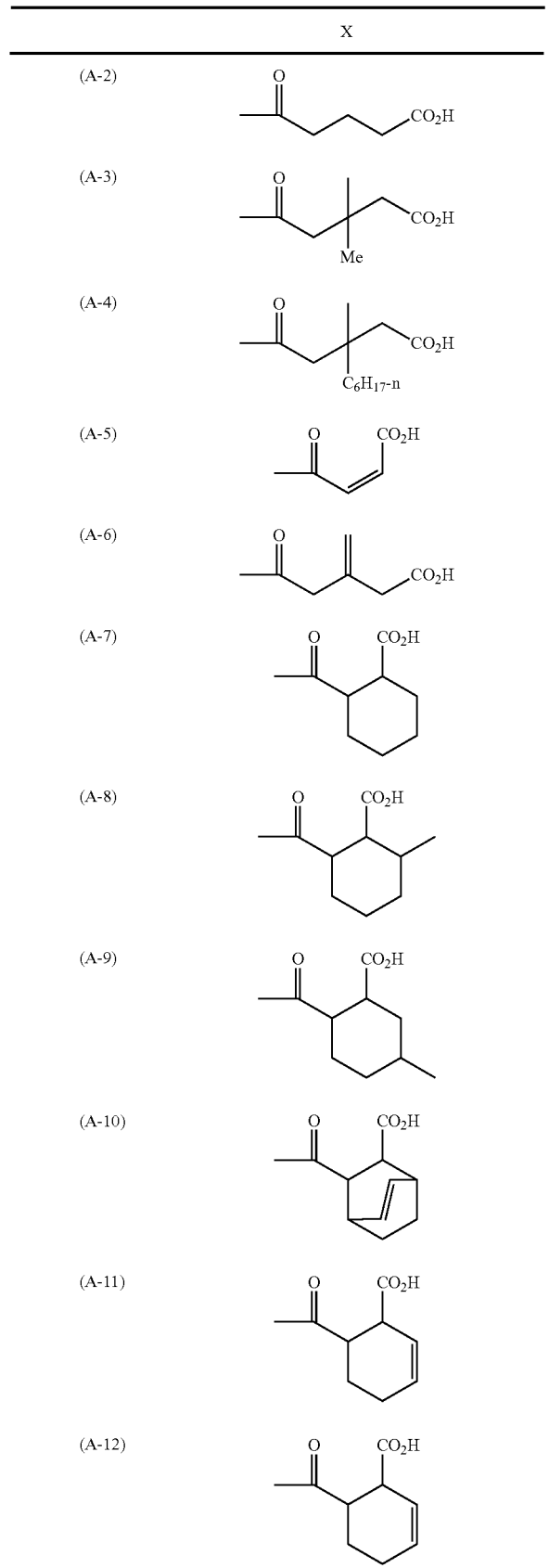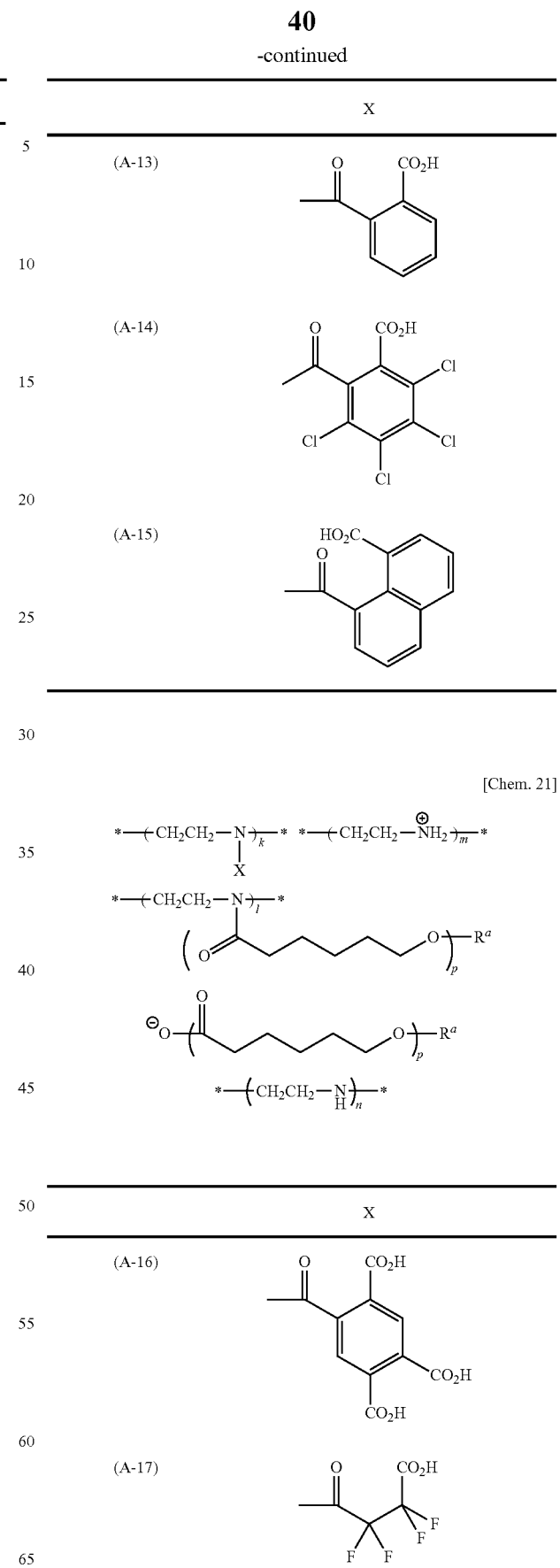

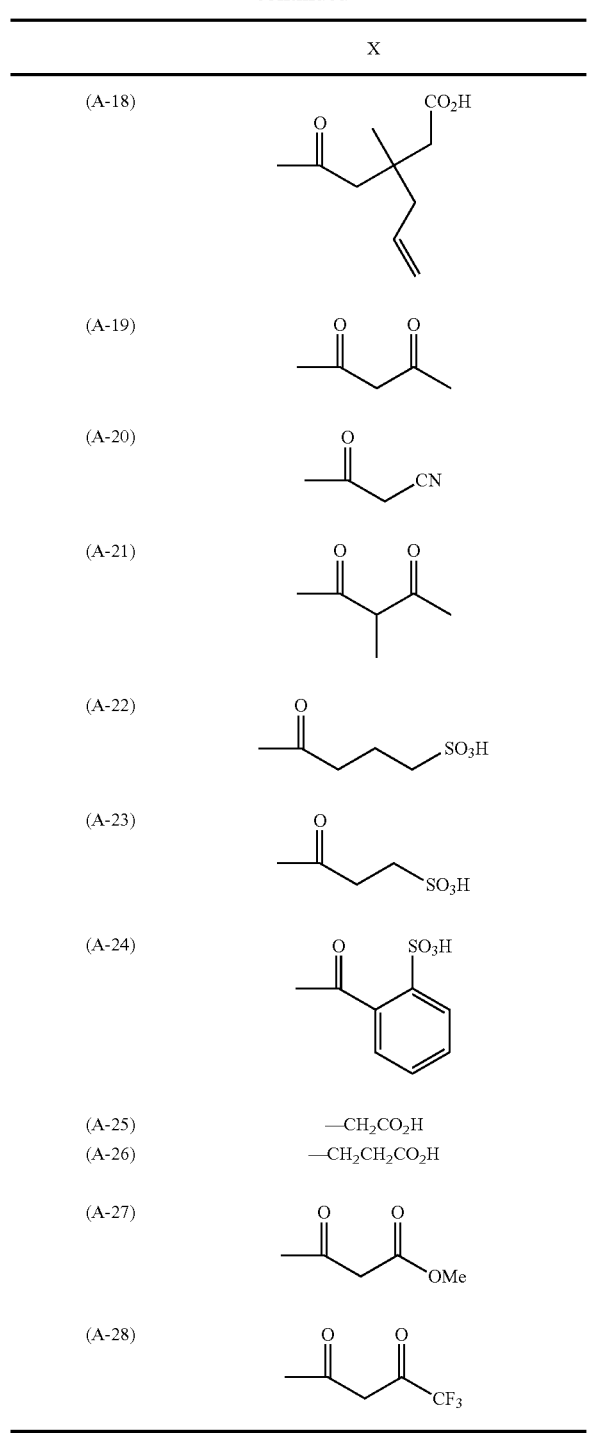
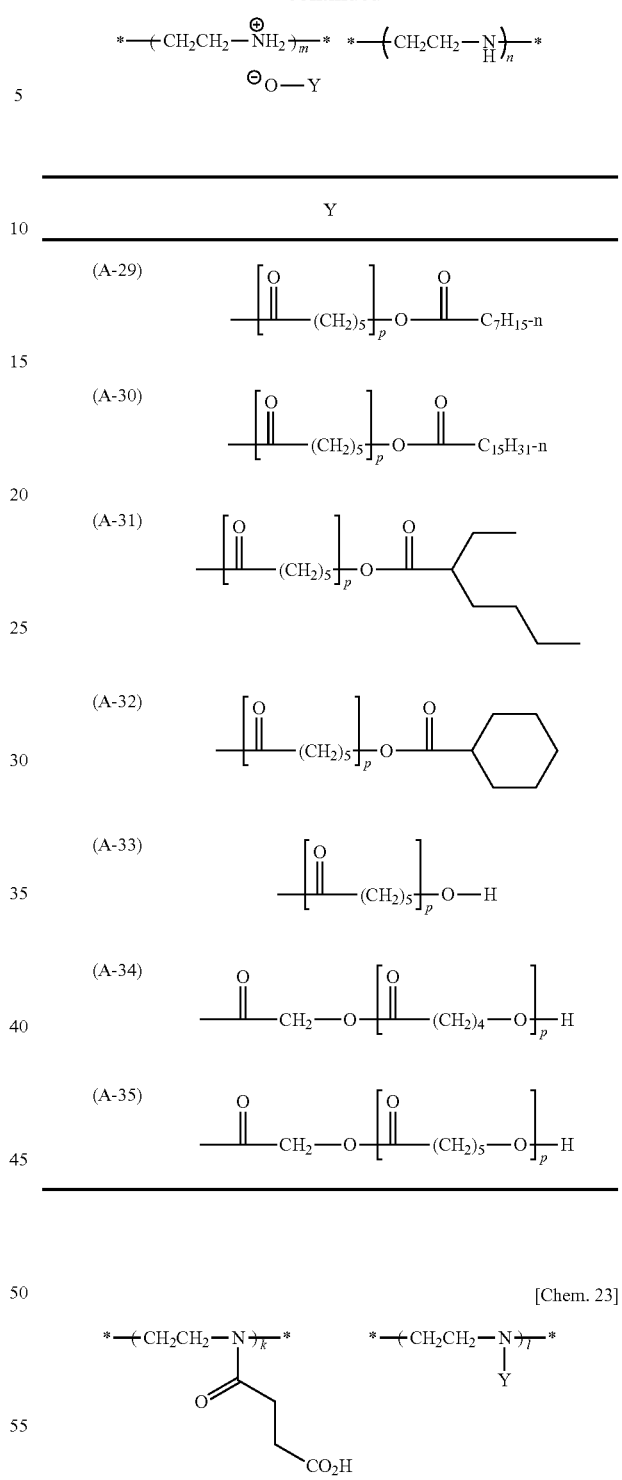
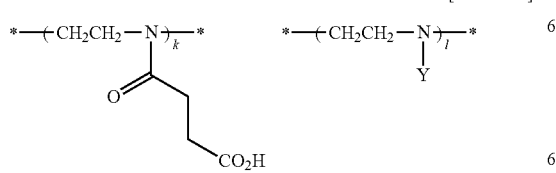

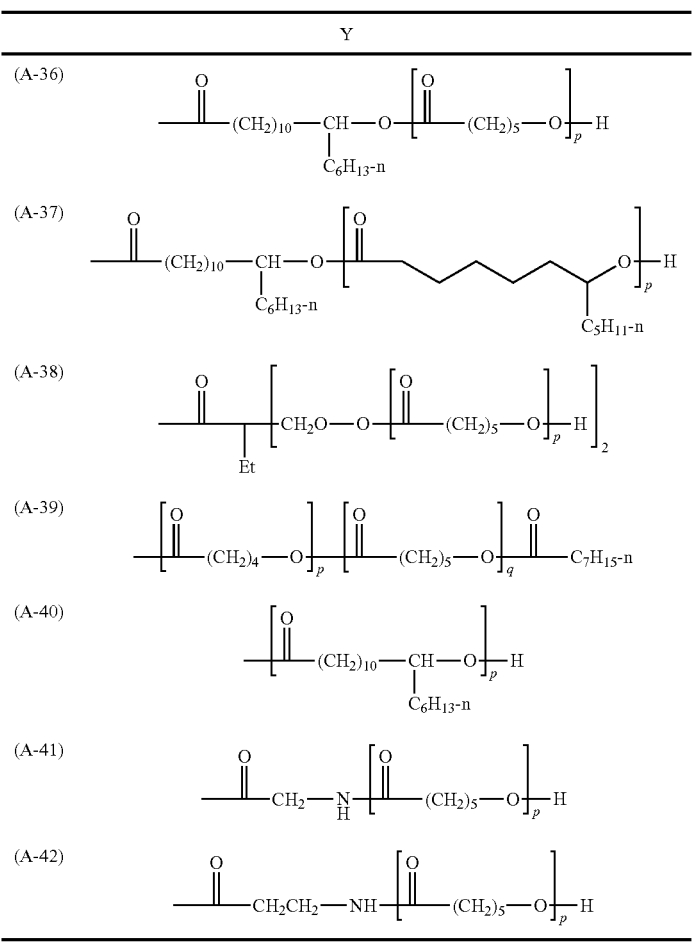
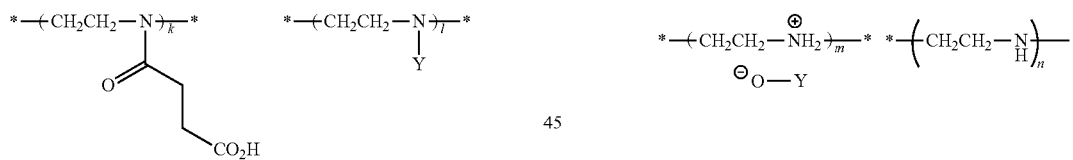
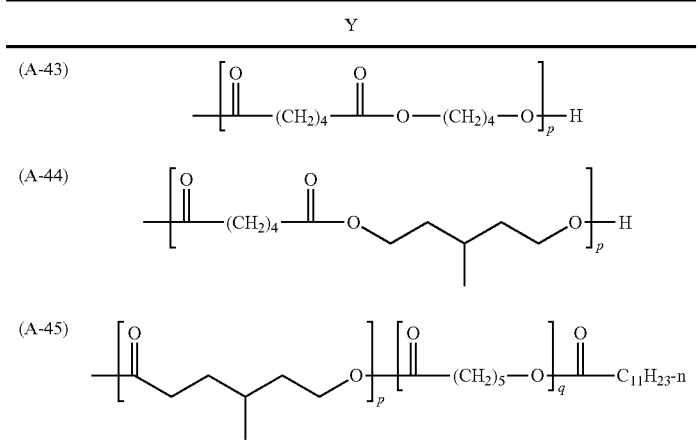

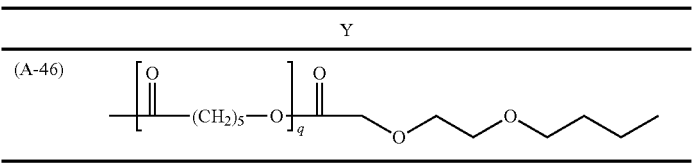
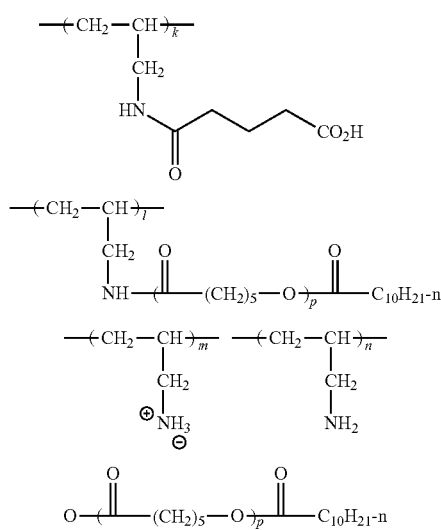
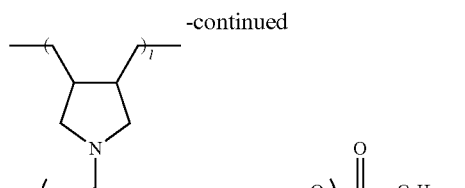

[Chem. 27]
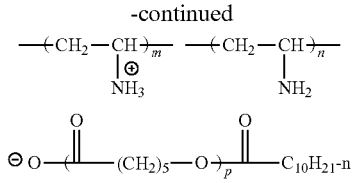
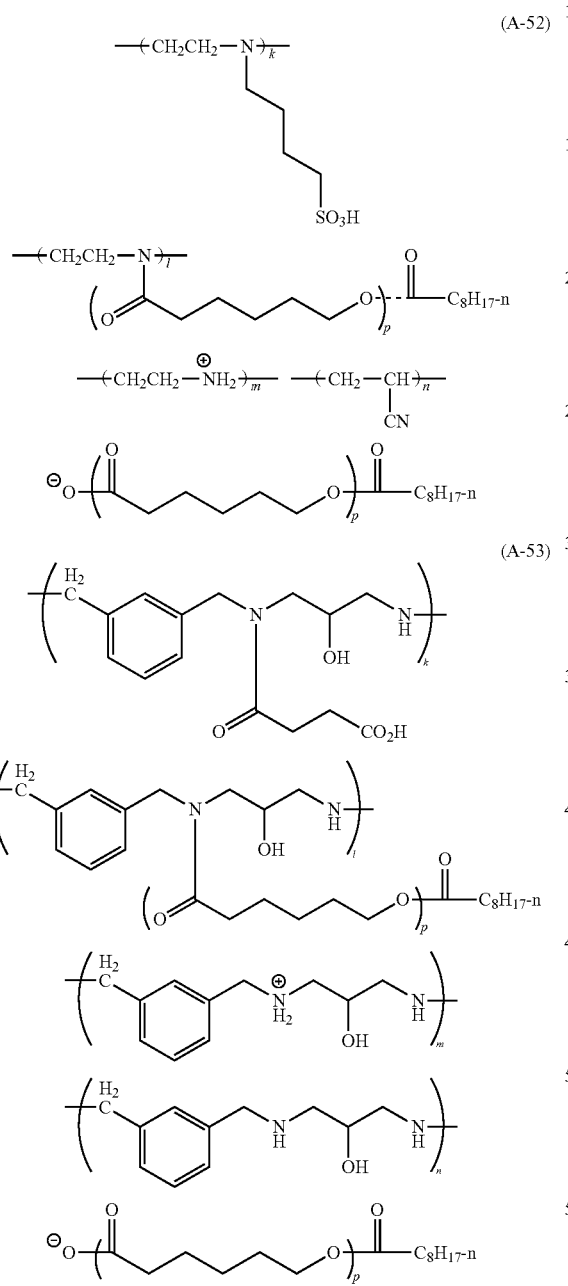
[Chem. 28]
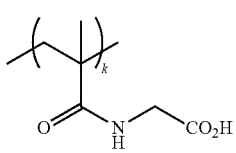
[Chem. 29]
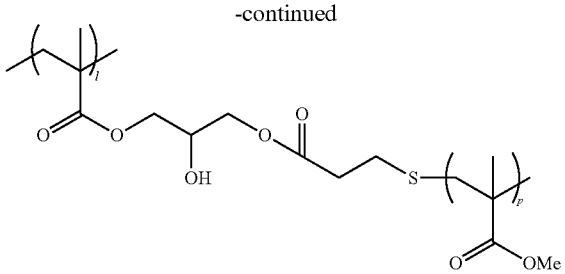
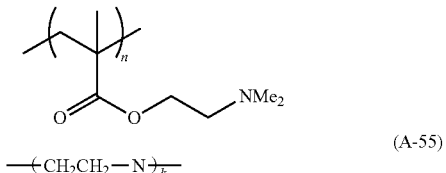
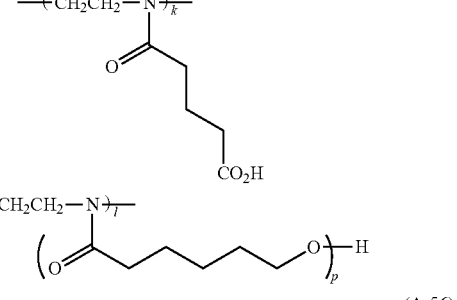
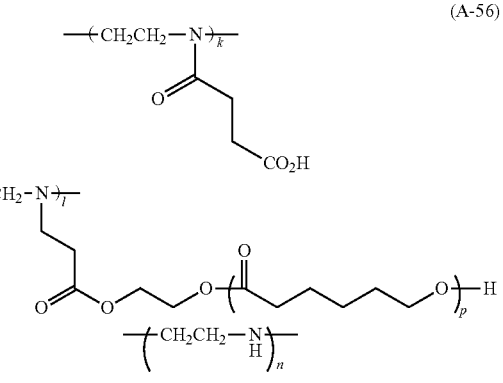
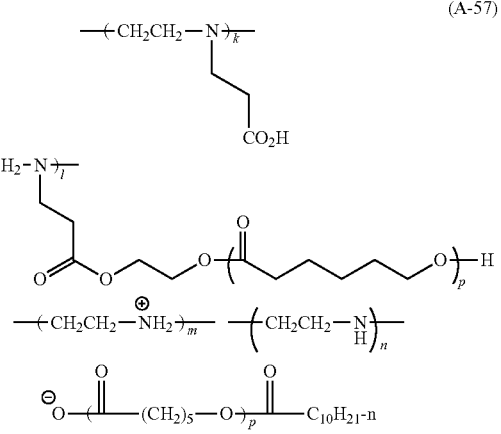
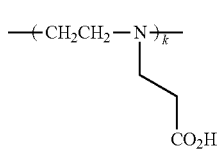

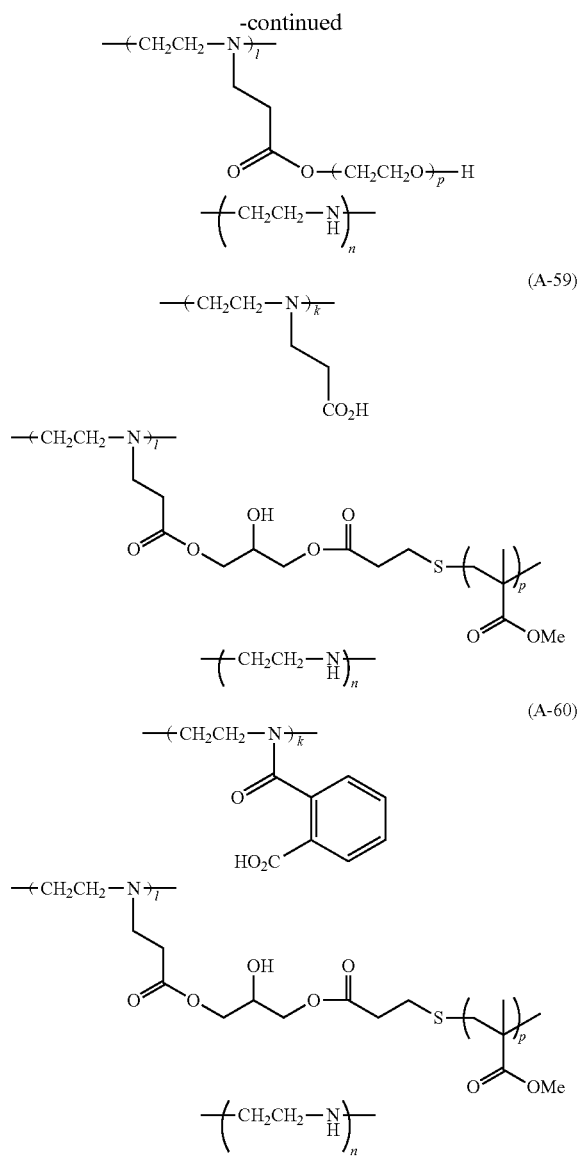

(A-59)

(A-60)

Specific Resin 2 may be synthesized by the method described in Japanese Patent Application Laid-Open No. 2011-190180 as a method for synthesizing Specific Resin 2.

The weight average molecular weight of Specific Resin 2 is a polystyrene equivalent value by the GPC measurement, and is preferably 3,000 to 100,000, and more preferably 5,000 to 55,000. When the weight average molecular weight is within the above range, the effect of the plurality of adsorption sites, which are introduced into the terminals of the polymer, is sufficiently exhibited, so that it is possible to exhibit an excellent performance in adsorptivity to the surface of titanium dioxide particles.

Meanwhile, in the present specification, measurement was performed by using an HLC-8020 GPC (manufactured by TOSOH CORPORATION) for the GPC and TKSgel SuperHZM-H, TSKgel SuperHZ4000, and TSKgel SuperHZ200 (manufactured by TOSOH CORPORATION) for the columns. The carrier may be appropriately selected, but tetrahydrofuran is used as long as the carrier is soluble.

These pigment dispersing agents may be used either alone or in combination of two or more thereof. In the present invention, in particular, it is preferred that a combination of a pigment derivative and a polymer dispersing agent is used. Further, for the pigment dispersing agent, an alkali-soluble resin to be described below as the pigment dispersing agent may also be used in combination with the terminal-modification-type polymer having an anchor moiety to a pigment surface, the graft-type polymer, and the block-type polymer. Meanwhile, as the pigment dispersing agent, the alkali-soluble resin to be described below and a compound represented by Formula (ED) may also be used.

The content of the pigment dispersing agent in the pigment dispersion liquid is preferably 1 to 80 parts by mass, more preferably 5 to 70 parts by mass, and still more preferably 10 to 60 parts by mass, based on 100 parts by mass of the pigment.

Specifically, when a polymer dispersing agent is used, the amount of the polymer dispersing agent used is preferably in a range of 5 to 100 parts, and more preferably in a range of 10 to 80 parts in terms of mass, based on 100 parts by mass of the pigment.

<Pigment Derivative>

It is preferred that the pigment dispersion liquid further contains a pigment derivative.

The pigment derivative is a compound having a structure in which a part of an organic pigment is substituted with an acidic group, a basic group or a phthalimidomethyl group. From the viewpoint of dispersibility and dispersion stability, it is preferred that as the pigment derivative, a pigment derivative having an acidic group or a basic group is contained.

Examples of an organic pigment for constituting the pigment derivative may include a diketopyrrolopyrrole-based pigment, an azo-based pigment, a phthalocyanine-based pigment, an anthraquinone-based pigment, a quinacridone-based pigment, a dioxazine-based pigment, a perynone-based pigment, a perylene-based pigment, a thioindigo-based pigment, an isoindoline-based pigment, an isoindolinone-based pigment, a quinophthalone-based pigment, a threne-based pigment, a metal complex-based pigment, and the like.

Furthermore, the acidic group which the pigment derivative has is preferably sulfonic acid, carboxylic acid, and a quaternary ammonium salt thereof more preferably a carboxylic acid group and a sulfonic acid group, and particularly preferably a sulfonic acid group. The basic group which the pigment derivative has is preferably an amino group, and particularly preferably a tertiary amino group.

As the pigment derivative, in particular, quinolone-based, benzimidazolone-based, and isoindoline-based pigment derivatives are preferred, and quinolone-based and benzimidazolone-based pigment derivatives are more preferred.

The content of the pigment derivative in the pigment dispersion liquid is preferably 1 to 50% by mass, and more preferably 3 to 30% by mass, based on the total mass of the pigment. The pigment derivatives may be used either alone or in combination of two or more thereof.

Further, when the pigment derivatives are used in combination, the amount of the pigment derivatives used is preferably in a range of 1 to 30 parts, more preferably in a range of 3 to 20 parts, and particularly preferably in a range of 5 to 15 parts, in terms of mass, based on 100 parts by mass of the pigment.

<Organic Solvent>

It is preferred that the organic dispersion liquid contains an organic solvent.

The organic solvent is selected by solubility of each component included in the pigment dispersion liquid, or coatability when the pigment dispersion liquid is applied to a coloring radiation-sensitive composition, and the like. As the organic solvent, esters, ethers, ketones, and aromatic hydrocarbons are used. Among them, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, and propylene glycol monomethyl ether acetate are preferred, and it is preferred that (F) an organic solvent, which may be included in a coloring radiation-sensitive composition to be described below, is also used.

The content of the organic solvent in the pigment dispersion liquid is preferably 50 to 95% by mass, and more preferably 70 to 90% by mass.

<Polymer Compound>

The pigment dispersion liquid may further contain a polymer compound in addition to the aforementioned components, from the viewpoint of improving dispersion stability, controlling developability when the pigment dispersion liquid is applied to a coloring radiation-sensitive composition, and the like.

Examples of the polymer compound may include polyamide amine and salts thereof, polycarboxylic acid and salts thereof, high molecular-weight unsaturated acid ester, modified polyurethane, modified polyester, modified poly(meth)acrylate, (meth)acrylic copolymers (in particular, a (meth)acrylic acid-based copolymer containing a carboxylic acid group and a polymerizable group in the side chain is preferred), naphthalene sulfonic acid formalin condensates, and the like. Since the polymer material is adsorbed onto the surface of the pigment, and acts so as to prevent re-aggregation of the pigment, the terminal-modification-type polymer having an anchor moiety to a pigment surface, the graft-type polymer, and the block-type polymer are preferred, and examples thereof may include a graft copolymer including, as a copolymerization unit, a monomer containing a heterocycle and a polymerizable oligomer having an ethylenically unsaturated bond.

Examples of the other polymer materials may also include polyamide amine phosphate salts, a high molecular-weight unsaturated polycarboxylic acid, polyether ester, an aromatic sulfonic acid formalin condensate, polyoxyethylene nonylphenyl ether, polyester amine, polyoxyethylene sorbitan monooleate, polyoxyethylene monostearate, and the like.

These polymer materials may be used either alone or in combination of two or more thereof.

The content of the polymer material in the pigment dispersion liquid is preferably 20 to 80% by mass, more preferably 30 to 70% by mass, and still more preferably 40 to 60% by mass, with respect to the pigment.

[Preparation of Coloring Radiation-Sensitive Composition]

It is preferred that the aforementioned composition (typically the coloring composition containing (A) a colorant (for example, a pigment dispersion liquid)) is a coloring radiation-sensitive composition (more preferably a black radiation-sensitive composition) containing (B) a photopolymerization initiator, (C) a polymerizable compound, and if necessary, respective components such as (D) an ultraviolet absorber, (E) an alkali-soluble resin, (F) an organic solvent, or a surfactant.

These coloring radiation-sensitive compositions are used for forming the infrared transmission filter of the present invention, and for example, a colored cured film obtained by polymerizing and curing the coloring radiation-sensitive composition is used as the infrared transmission filter.

Hereinafter, each component capable of being further contained in the composition (particularly, the coloring radiation-sensitive composition) according to the present invention will be described in detail.

Meanwhile, in the composition according to the present invention, the total solid content refers to a total mass of the components in which an organic solvent is removed from the entire composition of the composition.

In the present specification, the "alkyl group" indicates a "straight-chained, branched, or cyclic" alkyl group, and may also be either substituted with a substituent, or unsubstituted. Further, in the present specification, the "(meth)acrylate" indicates both or any one of acrylate and methacrylate, the "(meth)acryl" indicates both or any one of acryl and methacryl, and the "(meth)acryloyl" indicates both or any one of acryloyl and methacryloyl.

In addition, in the present specification, the "monomeric body" and the "monomer" have the same meaning. The monomeric body in the present specification is distinguished from an oligomer and a polymer, and refers to a compound having a weight average molecular weight of 2,000 or less. In the present specification, the "polymerizable compound" refers to a compound having a polymerizable functional group, and may be either a monomeric body or a polymer. The polymerizable functional group refers to a group involved with a polymerization reaction.

Furthermore, in the notation of a group (an atomic group) in the present specification, a notation in which substituted and unsubstituted are not described includes not only a group having no substituent, but also a group having a substituent. For example, an "alkyl group" includes not only an alkyl group having no substituent (an unsubstituted alkyl group), but also an alkyl group having a substituent (a substituted alkyl group).

In the present specification, the term "step" includes not only a separate step but also a step which may not be clearly distinguished from another step as long as a desired operation of the step is achieved.

The "radiation" in the present invention means including visible light, ultraviolet ray, far ultraviolet ray, electronic beam, X-ray, and the like.

<(B) Photopolymerization Initiator>

It is preferred that the composition of the present invention (typically a coloring radiation-sensitive composition) includes (B) the photopolymerization initiator.

As the photopolymerization initiator (hereinafter, simply referred to as a "polymerization initiator" in some cases) in the present invention, those known as photopolymerization initiators, which are described below, may be used.

The photopolymerization initiator is not particularly limited, and may be appropriately selected from publicly known photopolymerization initiators as long as the photopolymerization initiator has an ability of initiating the polymerization of the polymerizable compound. For example, photopolymerization initiators having sensitivity to visible light from the ultraviolet region are preferred. Further, the photopolymerization initiator may be an activating agent that may cause an action with a photo-excited sensitizer to produce an active radical, or may be an initiator which initiates a cationic polymerization depending on the kind of a monomer.

In addition, it is preferred that the photopolymerization initiator contains at least one compound which has a molecular absorption coefficient of at least about 50 within a range of about 300 nm to about 800 nm (more preferably 330 nm to 500 nm).

Examples of the photopolymerization initiator may include halogenated hydrocarbon derivatives (for example, those having a triazine structure, those having an oxadiazole structure, and the like) acyl phosphine compounds such as acyl phosphine oxide, hexaarylbiimidazole, oxime compounds such as oxime derivatives, organic peroxides, thio compounds, ketone compounds, aromatic onium salts, keto oxime ethers, aminoacetophenone compounds, hydroxyacetophenone, and the like. Among them, oxime compounds are preferred.

Examples of the halogenated hydrocarbon compounds having a triazine structure may include compounds described in Wakabayashi t al., Bull. Chem. Soc. Japan, 42, 2924 (1969), compounds described in British Patent No. 1388492, compounds described in Japanese Patent Application Laid-Open No. S53-133428, compounds described in German Patent No. 3337024, compounds described in F. C. Schaefer et al., J. Org. Chem.; 29, 1527 (1964), compounds described in Japanese Patent Application Laid-Open No. S62-58241, compounds described in Japanese Patent Application Laid-Open No. H5-281728, compounds described in Japanese Patent Application Laid-Open No. H5-34920, compounds described in U.S. Pat. No. 4,212,976, and the like.

Examples of the compound described in U.S. Pat. No. 4,212,976 may include a compound having an oxadiazole structure (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole; 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, or 2-tribromomethyl-5-styryl-1,3,4-oxadiazole, and the like), and the like.

Furthermore, examples of the photopolymerization initiator other than those described above may include acridine derivatives (for example, 9-phenylacridine, 1,7-bis(9,9'-acridinyl)heptane, and the like), N-phenylglycine and the like, polyhalogen compounds (for example, carbon tetrabromide, phenyl tribromomethyl sulfone, phenyl trichloromethyl ketone, and the like), coumarins (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylamino-cinnamoyl)-7-diethylaminocoumarin, 7-methoxy-3-(3-pyridylcarbonyl)coumarin, 3-benzoyl-5,7-dipropoxycoumarin, and 7-benzotriazol-2-yl coumarin, and also coumarin compounds described in Japanese Patent Application Laid-Open Nos. H5-19475, H7-271028, 2002-363206, 2002-363207, 2002-363208, and 2002-363209, and the like), acylphosphine oxides (for example, bis(2,4,6-trimethylbenzoyl)-phenylphosphine oxide, bis(2,6-dimethoxybenzoyl)-2,4,4-trimethyl-pentylphenylphosphine oxide, Lucirin TPO, and the like), metallocenes (for example, bis($\eta$5-2,4-cyclopentadien-1-yl)-bis(2,6-difluoro-3-(1H-pyrrol-1-yl)-phenyl) titanium, $\eta$5-cyclopentadienyl-$\eta$6-cumenyl-iron(1+)-hexafluorophosphate(1−), and the like), compounds described in Japanese Patent Application Laid-Open No. 553-133428, and Japanese Examined Patent Application Publication Nos. S57-1819 and S57-6096, and U.S. Pat. No. 3,615,455, and the like.

Examples of the ketone compound may include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonyl benzophenone, benzophenone tetracarboxylic acid or a tetramethyl ester thereof 4,4'-bis(dialkylamino)benzophenones (for example, 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-t-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, and benzyl dimethyl ketal), acridone, chloroacridone, N-methylacridone, N-butyl acridone, N-butyl-chloro acridone, and the like.

As the photopolymerization initiator, a hydroxyacetophenone compound, an aminoacetophenone compound, and an acyl phosphine compound may also be suitably used. More specifically, for example, aminoacetophenone-based initiators described in Japanese Patent Application Laid-Open No. H10-291969, and acyl phosphine oxide-based initiators described in Japanese Patent No. 4225898 may also be used.

As the hydroxyacetophenone-based initiator, IRGACURE-184, DAROCUR-1173, IRGACURE-500, IRGACURE-2959, and IRGACURE-127 (trade names, all manufactured by BASF Corporation) may be used. As the aminoacetophenone-based initiator, commercially available products IRGACURE-907, IRGACURE-369, and IRGACURE-379 (trade names, all manufactured by BASF Corporation) may be used. As the aminoacetophenone-based initiator, compounds whose absorption wavelength is matched to a long wavelength light source of 365 nm, 405 nm, or the like, described in Japanese Patent Application Laid-Open No. 2009-191179, may be used. Further, as the acyl phosphine-based initiator, a commercially available product IRGACURE-819 or DAROCUR-TPO (trade name, all manufactured by BASF Corporation) may be used.

The photopolymerization initiator is more preferably an oxime compound.

The composition contains the oxime compound as the polymerization initiator, thereby improving the characteristic dependence (hereinafter, simply referred to as "PCD dependence" in some cases) of the pattern with respect to the time from the application of the composition to the exposure (PCD: Post Coating Delay).

As a specific example of the oxime compound, it is possible to use compounds described in Japanese Patent Application Laid-Open Nos. 2001-233842, 2000-80068, and 2006-342166.

Examples of the oxime compound such as an oxime derivative, which is suitably used as the photopolymerization initiator in the present invention, may include 3-benzoyl oxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one, and the like.

Examples of the oxime compound may include compounds described in J. C. S. Perkin II (1979) pp. 1653 to 1660, J. C. S. Perkin II (1979) pp. 156 to 162, Journal of Photopolymer Science and Technology (1995) pp. 202 to 232, and Japanese Patent Application Laid-Open No. 2000-66385, compounds described in Japanese Patent Application Laid-Open No. 2000-80068, Japanese Unexamined Patent Application Publication No. 2004-534797, and Japanese Patent Application Laid-Open No. 2006-342166, and the like.

As a commercially available product, IRGACURE OXE-01 (manufactured by BASF Corporation), IRGACURE OXE-02 (manufactured by BASF Corporation), and TRONLY TR-PBG-304, TRONLY TR-PBG-309, and TRONLY TR-PBG-305 (manufactured by CHANGZHOU TRONLY NEW ELECTRONIC MATERIALS CO., LTD.) are also suitably used.

In addition, as the oxime compounds other than those described above, it is possible to use compounds in which oxime is linked to the N-position of carbazole, as described in Japanese Unexamined Patent Application Publication No. 2009-519904, compounds in which a hetero substituent is introduced into a benzophenone moiety, as described in U.S. Pat. No. 7,626,957, compounds in which a nitro group is introduced into a dye moiety, as described in Japanese Patent Application Laid-Open No. 2010-15025 and U.S. Patent Publication No. 2009-292039, ketooxime-based compounds described in International Publication No. 2009-131189, compounds containing a triazine structure and an oxime structure in the same molecule, as described in U.S. Pat. No. 7,556,910, compounds which have an absorption maximum at 405 nm and have good sensitivity to a g-line light source, as described in Japanese Patent Application Laid-Open No. 2009-221114, and the like.

Preferably, cyclic oxime compounds described in Japanese Patent Application Laid-Open Nos. 2007-231000 and 2007-322744 may also be suitably used. Among the cyclic oxime compounds, cyclic oxime compounds condensed to a carbazole dye, as described in Japanese Patent Application Laid-Open Nos. 2010-32985 and 2010-185072, are particularly preferred from the viewpoint of achieving a high sensitivity due to high light absorptivity thereof.

Furthermore, compounds having an unsaturated bond at a specific moiety of an oxime compound, as described in Japanese Patent Application Laid-Open No. 2009-242469, may also be suitably used because a high sensitivity may be achieved by regenerating an active radical from a polymerization inactive radical.

Most preferred examples thereof may include oxime compounds having a specific substituent, as described in Japanese Patent Application Laid-Open No. 2007-269779, or oxime compounds having a thioaryl group, as described in Japanese Patent Application Laid-Open No. 2009-191061.

Specifically, as the oxime compound, a compound represented by the following Formula (OX-1) is preferred. Meanwhile, the oxime compound may be an oxime compound in which the N—O bond of the oxime is in the (E) form, an oxime compound in which the N—O bond of the oxime is in the (Z) form, or a mixture of the (E) form and the (Z) form.

[Chem. 30]

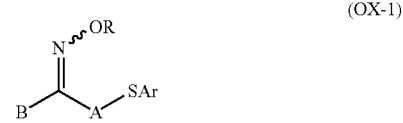

(OX-1)

In Formula (OX-1), each of R and B independently represents a monovalent substituent, A represents a divalent organic group, and Ar represents an aryl group.

In Formula (OX-1), the monovalent substituent represented by R is preferably a monovalent nonmetallic atomic group.

Examples of the monovalent nonmetallic atomic group may include an alkyl group, an aryl group, an acyl group, an alkoxycarbonyl group, an aryloxycarbonyl group, a heterocyclic group, an alkylthiocarbonyl group, an arylthiocarbonyl group, and the like. Further, these groups may have one or more substituents. In addition, the substituents described above may be substituted with another substituent.

Examples of the substituent may include a halogen atom, an aryloxy group, an alkoxycarbonyl group or an aryloxycarbonyl group, an acyloxy group, an acyl group, an alkyl group, an aryl group, and the like.

The alkyl group which may have a substituent is preferably an alkyl group having a carbon number of 1 to 30, and specific examples thereof may include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having a carbon number of 6 to 30, and specific examples thereof may include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, and a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having a carbon number of 2 to 20, and specific examples thereof may include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethyiaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having a carbon number of 2 to 20, and specific examples thereof may include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent may include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocycle including a nitrogen atom, an oxygen atom, a sulfur atom, or a phosphorous atom.

Specific examples thereof may include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a P-carbolinyl group, a phenanthridinyl group, an acridinyl group, a perimidinyl group, a phenanthrolinyl group, a phenazinyl group, a phenalsazinyl group, an isothiazolyl group, a phenothiazinyl group, an isooxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxantolyl group.

Specific examples of the alkylthiocarbonyl group which may have a substituent may include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent may include a 1-naphthylthiocarbonyl group, a 2-naphthylthiocarbonyl group, a 4-methylsufanylphenylthiocarbonyl group, a 4-phenylsulfanylphenylthiocarbonyl group, a 4-dimethylaminophenylthiocarbonyl group, a 4-diethylaminophenylthiocarbonyi group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

In Formula (OX-1), the monovalent substituent represented by B represents an aryl group, a heterocyclic group, an arylcarbonyl group, or a heterocyclic carbonyl group. Further, these groups may have one or more substituents. Examples of the substituents may include the substituents described above. In addition, the substituents described above may be substituted with another substituent.

Among them, the structures shown below are particularly preferred.

In the structures described below, Y, X, and n have the same meaning as Y, X, and n in Formula (OX-2) to be described below, and preferred examples are also the same.

[Chem. 31]

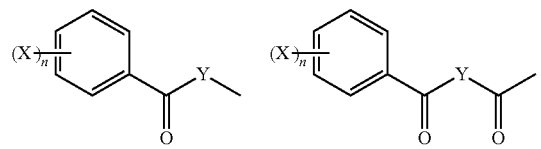

In Formula (OX-1), examples of the divalent organic group represented by A may include an alkylene group having a carbon number of 1 to 12, a cycloalkylene group, and an alkynylene group. Furthermore, these groups may have one or more substituents. Examples of the substituents may include the substituents described above. Further, the substituents described above may be substituted with another substituent.

Among them, from the viewpoint of enhancing the sensitivity, and suppressing coloring as the heating time passes, A in Formula (OX-1) is preferably an unsubstituted alkylene group, an alkylene group substituted with an alkyl group (for example, a methyl group, an ethyl group, a tert-butyl group, or a dodecyl group), an alkylene group substituted with an alkenyl group (for example, a vinyl group or an allyl group), and an alkylene group substituted with an aryl group (for example, a phenyl group, a p-tolyl group, a xylyl group, a cumenyl group, a naphthyl group, an anthryl group, a phenanthryl group, and a styryl group).

In Formula (OX-1), the aryl group represented by Ar is preferably an aryl group having a carbon number of 6 to 30, and may have a substituent. Examples of the substituent may include the same substituents as the substituents introduced into the substituted aryl groups, which are exemplified above as the specific examples of the aryl group which may have a substituent.

Among them, from the viewpoint of enhancing the sensitivity and suppressing coloring as the heating time passes, a substituted or unsubstituted phenyl group is preferred.

In Formula (OX-1), the structure of "SAr", which is formed by Ar and S adjacent thereto in Formula (OX-1), is preferably the structure shown below, from the viewpoint of sensitivity. Meanwhile, Me represents a methyl group, and Et represents an ethyl group.

[Chem. 32]

[Chem. 33]

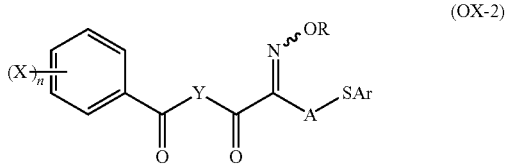

(OX-2)

(In Formula (OX-2), each of R and X independently represents a monovalent substituent, each of A and Y independently represents a divalent organic group, Ar represents an aryl group, and n represents an integer of 0 to 5.)

R, A, and Ar in Formula (OX-2) have the same meaning as R, A, and Ar in Formula (OX-1), and preferred examples thereof are also the same.

In Formula (OX-2), examples of the monovalent substituent represented by X may include an alkyl group, an aryl group, an alkoxy group, an aryloxy group, an acyloxy group, an acyl group, an alkoxy carbonyl group, an amino group, a heterocyclic group, and a halogen atom. In addition, these groups may have one or more substituents. Examples of the substituents may include the substituents described above. Furthermore, the substituents described above may be substituted with another substituent.

Among them, X in Formula (OX-2) is preferably an alkyl group, from the viewpoint of improving the solvent solubility and absorption efficiency in a long wavelength region.

Further, n in Formula (OX-2) represents an integer of 0 to 5, and preferably an integer of 0 to 2.

Examples of the divalent organic group represented by Y in Formula (OX-2) may include the structures shown below. Meanwhile, in the groups shown below, the "*" sign indicates a bonding position with a carbon atom adjacent to Y in Formula (OX-2).

[Chem. 34]

The oxime compound is preferably a compound represented by the following Formula (OX-2).

From the viewpoint of achieving high sensitivity, it is preferred that the photopolymerization initiator has the structures shown below.

[Chem. 35]

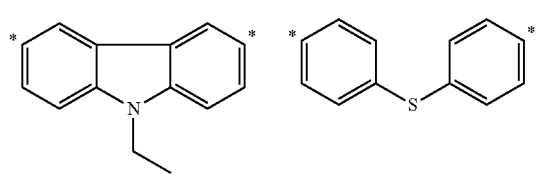

Furthermore, the oxime compound is preferably a compound represented by the following Formula (OX-3).

[Chem. 36]

(OX-3)

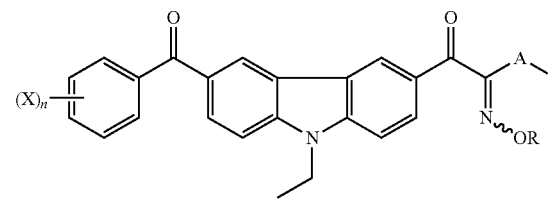

In Formula (OX-3), each of R and X independently represents a monovalent substituent, A represents a divalent organic group, Ar represents an aryl group, and n represents an integer of 0 to 5.

R, X, A, Ar, and n in Formula (OX-3) have the same meaning as R, X, A, Ar, and n in Formula (OX-2), respectively, and preferred examples thereof are also the same.

Hereinafter, specific examples of the oxime compound which is suitably used will be shown below, but the present invention is not limited thereto.

[Chem. 37]

(C-4)

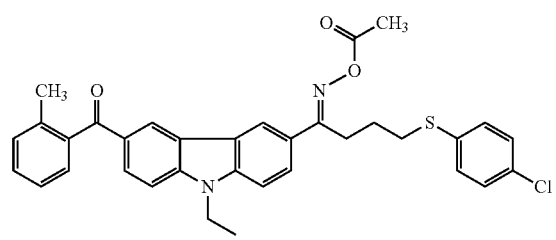

(C-5)

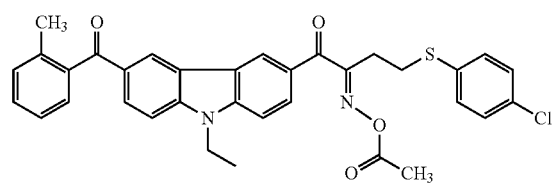

(C-6)

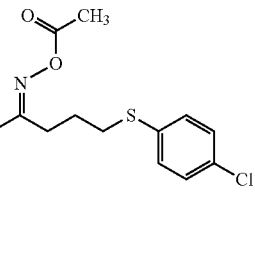

(C-7)

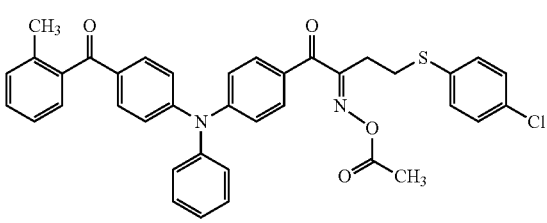

(C-8)

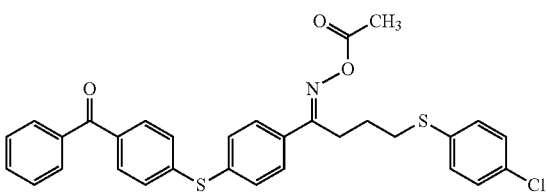

(C-9)

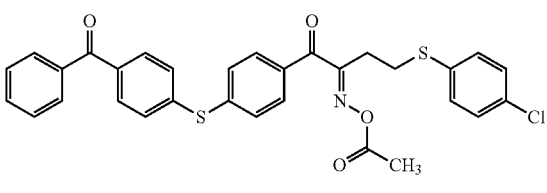

(C-10)

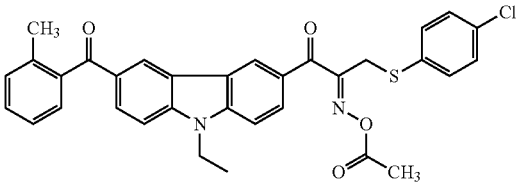

(C-11)

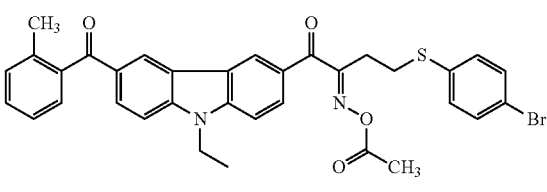

(C-12)

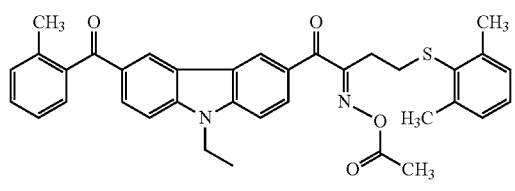

(C-13)

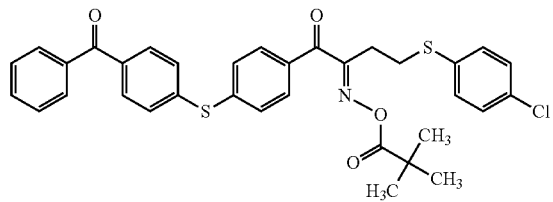

[Chem. 38]

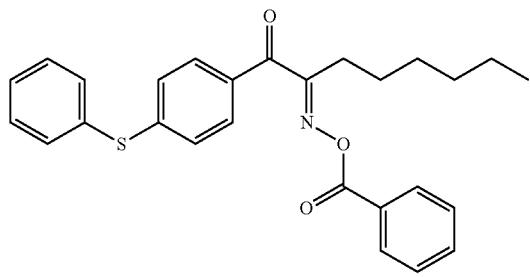

The oxime compound has a maximum absorption wavelength in a wavelength region of 350 nm to 500 nm, preferably has an absorption wavelength in a wavelength region of 360 nm to 480 nm, and particularly preferably has a high absorbance at 365 nm and 455 nm.

The molar absorption coefficient of the oxime compound at 365 nm or 405 nm is preferably 1,000 to 300,000, more preferably 2,000 to 300,000, and particularly preferably 5,000 to 200,000, from the viewpoint of the sensitivity.

The molar absorption coefficient of a compound may be determined by using a publicly known method, and specifically, it is preferred that measurement is made by using, for example, an ultraviolet/visible light spectrophotometer (Carry-5 spectrophotometer manufactured by Varian, Inc.) at a concentration of 0.01 g/L using an ethyl acetate solvent.

The photopolymerization initiators used in the present invention may be used in combination of two or more thereof, if necessary.

The content of the photopolymerization initiator in the composition (total content in the case of two or more thereof) is preferably in a range of 0.1 to 20% by mass, more preferably in a range of 0.5 to 10% by mass, and particularly preferably in a range of 1 to 8% by mass, based on a total solid content of the composition. When the content is within these ranges, good sensitivity and pattern formability may be obtained.

The composition may contain a sensitizer for the purpose of improving radical generation efficiency of the photopolymerization initiator, and shifting the sensitive wavelength to a longer wavelength. The sensitizer which may be used in the present invention is preferably a sensitizer which sensitizes (C) the photopolymerization initiator described above by an electron transfer mechanism or an energy transfer mechanism.

Examples of the sensitizer used in the composition may include compounds described in paragraph nos. [0101] to [0154] of Japanese Patent Application Laid-Open No. 2008-32803.

From the viewpoint of light absorption efficiency to the deep portion and the initiation decomposition efficiency, the content of the sensitizer in the composition is preferably 0.1% by mass to 20% by mass, and more preferably 0.5% by mass to 15% by mass, in terms of a solid content.

The sensitizers may be used either alone or in combination of two or more thereof.

<(C) Polymerizable Compound>

It is preferred that the composition of the present invention (typically a coloring radiation-sensitive composition) includes (C) the polymerizable compound.

Specifically, the polymerizable compound is selected from compounds having at least one, preferably two or more, terminal ethylenically unsaturated bonds. Among them, a tetra or higher polyfunctional polymerizable compound is preferred, and a penta or higher functional polymerizable compound is more preferred.

Such compound groups are widely known in the art, and in the present invention, these compounds may be used without any particular limitation. These compounds may have any chemical form such as a monomer, a prepolymer, that is, a dimer, a trimer or an oligomer, or mixtures thereof, or multimers thereof. The polymerizable compounds in the present invention may be used either alone or in combination of two or more thereof.

More specifically, examples of the monomer and the prepolymer thereof may include an unsaturated carboxylic acid (for example, acrylic acid, methacrylic acid, itaconic acid, crotonic acid, isocrotonic acid, maleic acid, and the like) and esters and amides thereof and multimers thereof, and preferred examples thereof may include esters of an unsaturated carboxylic acid and an aliphatic polyhydric alcohol compound, amides of an unsaturated carboxylic acid and an aliphatic polyvalent amine compound, and multimers thereof. Further, an addition-reaction product of unsaturated carboxylic acid esters or amides, which have a nucleophilic substituent such as a hydroxyl group, an amino group, or a mercapto group, with monofunctional or polyfunctional isocyanates or epoxies, or a dehydration condensation product of the unsaturated carboxylic acid esters or amides with a monofunctional or polyfunctional carboxylic acid, is suitably used. In addition, an addition-reaction product of unsaturated carboxylic acid esters or amides, which have an electrophilic substituent such as an isocyanate group or an epoxy group, with monofunctional or polyfunctional alcohols, amines or thiols, and a substitution-reaction product of unsaturated carboxylic acid esters or amides, which have a leaving substituent such as a halogen group or a tosyloxy group, with monofunctional or polyfunctional alcohols, amines or thiols, is also suitable. Furthermore, as another example, it is also possible to use a group of compounds substituted with a vinylbenzene derivative such as an unsaturated phosphonic acid and styrene, vinyl ether, allyl ether, and the like instead of the unsaturated carboxylic acid described above.

As specific compounds thereof, compounds described in paragraph nos. [0095] to [0108] of Japanese Patent Application Laid-Open No. 2009-288705 may be suitably used even in the present invention.

Further, the polymerizable compound is also preferably a compound which has an ethylenically unsaturated group having at least one addition-polymerizable ethylene group and a boiling point of 100° C. or more under normal pressure. Examples thereof may include: a monofunctional acrylate or methacrylate such as polyethylene glycol mono(meth)acrylate, polypropylene glycol mono(meth)acrylate, and phenoxyethyl(meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri (acryloyloxypropyl) ether, tri(acryloyloxyethyl) isocyanurate; a compound formed by adding ethylene oxide or propylene oxide to a polyfunctional alcohol such as glycerin or trimethylolethane, and then (meth)acrylating the resultant adduct; urethane(meth)acrylates, such as those described in Japanese Examined Patent Application Publication Nos. S48-41708 and S50-6034 and Japanese Patent Application Laid-Open No. 51-37193; polyester acrylates described in Japanese Patent Application Laid-Open No. S48-64183 and Japanese Examined Patent Application Publication Nos. 349-43191 and S52-30490; polyfunctional acrylates or methacrylates such as epoxyacrylates which are the reaction product of an epoxy resin with (meth)acrylic acid; and mixtures thereof.

Examples thereof also may include a polyfunctional (meth)acrylate obtained by reacting a polyfunctional carboxylic acid with a compound having a cyclic ether group and ethylenically unsaturated group, such as glycidyl(meth)acrylate, and the like.

In addition, as a preferred polymerizable compound, it is also possible to use compounds having two or more functional ethylenically unsaturated groups and a fluorene ring, as described in Japanese Patent Application Laid-Open Nos. 2010-160418 and 2010-129825 and Japanese Patent No. 4364216; and a cardo resin.

Furthermore, as the compound which has a boiling point of 100° C. or more under normal pressure and at least one addition-polymerizable ethylenically unsaturated group, compounds described in paragraph nos. [0254] to [0257] of Japanese Patent Application Laid-Open No. 2008-292970 are also suitable.

In addition to those described above, radical polymerizable monomers represented by the following Formulae (MO-1) to (MO-5) may also be suitably used. Meanwhile, in the formulae, when T is an oxyalkylene group, the terminal at the carbon atoms side thereof is bonded to R.

[Chem. 39]

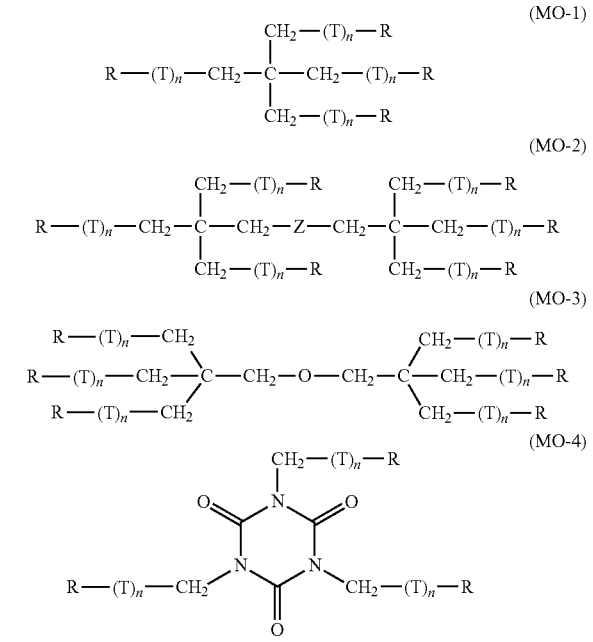

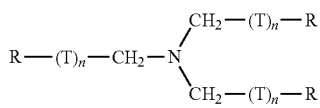

[Chem. 40]

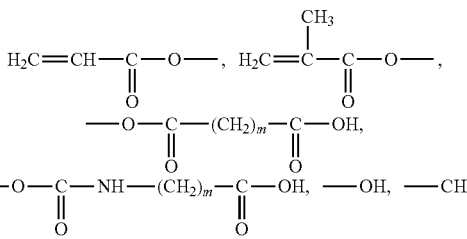

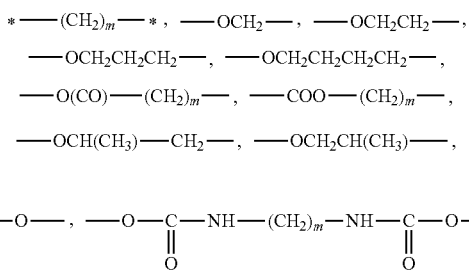

In the formulae, n is 0 to 14, and m is 1 to 8. The plurality of R's and T's present in one molecule may be the same as or different from one another.

In each of the polymerizable compounds represented by Formulae (MO-1) to (MO-5), at least one of the plurality of R's present represents a group represented by —OC(=O)CH=CH$_2$ or —OC(—O)C(CH$_3$)=CH$_2$.

As a specific example of the polymerizable compounds represented by Formulae (MO-1) to (MO-5), compounds described in paragraph nos. 0248 to 0251 of Japanese Patent Application Laid-Open No. 2007-269779 may be suitably used even in the present invention.

Further, it is also possible to use, as the polymerizable compound, compounds obtained by adding ethyleneoxide or propyleneoxide to a polyfunctional alcohol, and then (meth)acrylating the resultant adduct, as described as Formulae (1) and (2) in Japanese Patent Application Laid-Open No. H10-62986 with specific examples thereof.

Among them, as the polymerizable compound, dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as a commercially available product, KAYARAD DPHA; manufactured by Nippon Kayaku Co., Ltd.), and structures in which a (meth)acryloyl group thereof is linked via an ethylene glycol or propylene glycol residue are preferred.

In addition, suitable examples of the polymerizable compound may include 2-(meth)acryloyloxy ethyl caproate acid phosphate (as a commercially available product, PM-20 manufactured by Nippon Kayaku Co., Ltd.), urethane acrylate (as a commercially available product, U-6LPA manufactured by Shin-Nakamura Chemical Co., Ltd.), and the like.

The oligomer types thereof may also be used. Hereinafter, preferred aspects of the polymerizable compound will be described.

The polymerizable compound is a polyfunctional monomer, and may have an acid group such as a carboxyl group, a sulfonic acid group, and a phosphoric acid group. When the ethylenic compound has an unreacted carboxyl group as in the case of being a mixture described above, the ethylenic compound may be used as it is, but if necessary, an acid group may be introduced by reacting a hydroxyl group of the aforementioned ethylenic compound with a non-aromatic carboxylic acid anhydride. In this case, specific examples of the non-aromatic carboxylic acid anhydride may include anhydrous tetrahydrophthalic acid, alkylated anhydrous tetrahydrophthalic acid, anhydrous hexahydrophthalic acid, alkylated anhydrous hexahydrophthalic acid, anhydrous succinic acid, and anhydrous maleic acid.

In the present invention, a monomer having an acid group is an ester of an aliphatic polyhydroxy compound with an unsaturated carboxylic acid, and is preferably a polyfunctional monomer which is allowed to have an acid group by reacting a non-aromatic carboxylic acid anhydride with an unreacted hydroxyl group of an aliphatic polyhydroxy compound, and particularly preferably, the aliphatic polyhydroxy compound is pentaerythritol and/or dipentaerythritol in this ester. Examples of the commercially available products may include M-5120, M-520, and the like as polybasic acid modified-acrylic oligomers manufactured by TOAGOSEI CO., LTD.

In the composition in the present invention, these polymerizable compounds may be used alone, but may be used in combination of two or more thereof, because it is difficult to use a single compound in the preparation of the polymerizable compound.

Furthermore, if necessary, a polyfunctional monomer which does not have an acid group as a polymerizable compound may be used in combination with a polyfunctional monomer which has an acid group.

The acid value of the polyfunctional monomer which has an acid group is preferably 0.1 to 40 mg-KOH/g, and particularly preferably 5 to 30 mg-KOH/g. When the acid value of the polyfunctional monomer is too low, the development dissolution characteristics deteriorate, and when the acid value is too high, it becomes difficult to prepare or handle the monomer so that the photopolymerization performance deteriorates, thereby leading to deterioration in the curability such as the surface smoothness of a pixel. Accordingly, when the polyfunctional monomers having different acid groups are used in combination of two or more thereof, or the polyfunctional monomers which do not have an acid group are used in combination, it is preferred that the acid group as the total polyfunctional monomer is adjusted within the aforementioned range.

Further, it is also a preferred aspect that the polymerizable compound contains a polyfunctional monomeric body having a caprolactone structure.

The polymerizable compound having a caprolactone structure is not particularly limited as long as the polymerizable compound has a caprolactone structure in a molecule thereof, but examples thereof may include ε-caprolactone modified polyfunctional(meth)acrylates obtained by esterifying a polyhydric alcohol, such as trimethylolethane, ditrimethylolethane, trimethylolpropane, ditrimethylolpropane, pentaerythritol, dipentaerythritol, tripentaerythritol, glycerin, diglycerol and trimethylolmelamine, (meth)acrylic acid and ε-caprolactone. Among them, a polyfunctional monomeric body having a caprolactone structure represented by the following Formula (Z-1) is preferred.

[Chem. 41]

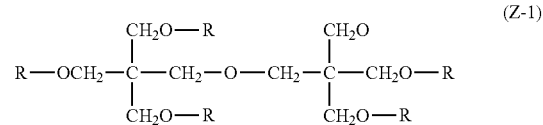

(Z-1)

In Formula (Z-1), all of six R's are a group represented by the following Formula (Z-2), or one to five of six R's is/are a group represented by the following Formula (Z-2) and the rest thereof is/are a group represented by the following Formula (Z-3).

[Chem. 42]

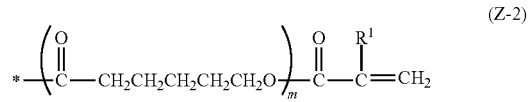

(Z-2)

In Formula (Z-2), $R^1$ represents a hydrogen atom or a methyl group, m represents 1 or 2, and "*" represents a bonding hand.

[Chem. 43]

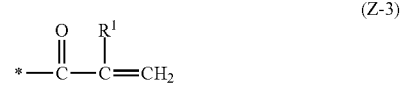

(Z-3)

In Formula (Z-3), $R^1$ represents a hydrogen atom or a methyl group, and "*" represents a bonding hand.

The polyfunctional monomeric body having such a caprolactone structure is commercially available as KAYARAD DPCA series from Nippon Kayaku Co., Ltd., and examples thereof may include DPCA-20 (in Formulae (Z-1) to (Z-3), a compound in which m=1, the number of groups represented by Formula (Z-2)=2, and all of $R^1$'s are a hydrogen atom), DPCA-30 (in the same formulae, a compound in which m=1, the number of groups represented by Formula (Z-2)=3, and all of $R^1$'s are a hydrogen atom), DPCA-60 (in the same formulae, a compound in which m=1, the number of groups represented by Formula (Z-2)=6, and all of $R^1$'s are a hydrogen atom), DPCA-120 (in the same formulae, a compound in which m=2, the number of groups represented by Formula (Z-2)=6, and all of $R^1$'s are a hydrogen atom), and the like.

In the present invention, a polyfunctional monomeric body having a caprolactone structure may be used either alone or in combination of two or more thereof.

As the polymerizable compound in the present invention, polymerizable compounds which contain an alkyleneoxy group having two or more carbon atoms (an ethyleneoxy group, a propyleneoxy group, a butyleneoxy group, and the like) are preferred.

Among the polymerizable compounds which contain an alkyleneoxy group having two or more carbon atoms, at least one selected from the group of compounds represented by the following Formula (i) or (ii) is particularly preferred.

[Chem. 44]

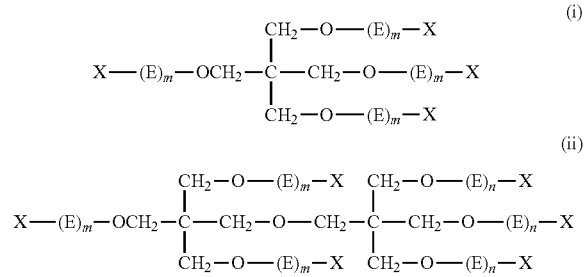

In Formulae (i) and (ii), each E independently represents —$((CH_2)_yCH_2O)$— or —$((CH_2)_yCH(CH_3)O)$—, each y independently represents an integer of 0 to 10, each X independently represents an acryloyl group, a methacryloyl group, a hydrogen atom or a carboxyl group.

In Formula (i), the sum of an acryloyl group and a methacryloyl group represented by X is 3 or 4, each m independently represents an integer of 0 to 10, and the sum of each m is an integer of 0 to 40. However, when the sum of each m is 0, any one of X's is a carboxyl group.

In Formula (ii), the sum of an acryloyl group and a methacryloyl group represented by X is 5 or 6, each n independently represents an integer of 0 to 10, and the sum of each n is an integer of 0 to 60. However, when the sum of each n is 0, any one of X's is a carboxyl group.

In Formula (i), m is preferably an integer of 0 to 6, and more preferably an integer of 0 to 4. In addition, the sum of each m is preferably an integer of 2 to 40, more preferably an integer of 2 to 16, and particularly preferably an integer of 4 to 8.

In Formula (ii), n is preferably an integer of 0 to 6, and more preferably an integer of 0 to 4. Furthermore, the sum of each n is preferably an integer of 3 to 60, more preferably an integer of 3 to 24, and particularly preferably an integer of 6 to 12.

Further, —$((CH_2)_yCH_2O)$— or —$((CH_2)_yCH(CH_3)O)$— in Formula (i) or (ii) is preferably a form in which the terminal at the oxygen atom side is bonded to X.

The compounds represented by Formula (i) or (ii) may be used either alone or in combination of two or more thereof. In particular, in Formula (ii), a form in which all of six X's are an acryloyl group is preferred.

The compound represented by Formula (i) or (ii) may be synthesized from a step of bonding a ring-opening structure of ethylene oxide or propylene oxide to pentaerythritol or dipentaerythritol by means of a ring-opening addition reaction and a step of introducing a (meth)acryloyl group by reacting, for example, (meth)acryloylchloride with a terminal hydroxyl group of the ring-opening structure, which are steps publicly known in the related art. Each step is a well known step, and the person skilled in the art may easily synthesize the compound represented by Formula (i) or (ii).

Among the compounds represented by Formulae (i) and (ii), pentaerythrol derivatives and/or dipentaerythritol derivatives are more preferred.

Specific examples thereof may include compounds represented by the following Formulae (a) to (f) (hereinafter, also referred to as "exemplary compounds (a) to (f)"), and among them, exemplary compounds (a), (b), (e) and (f) are preferred.

In particular, as the polymerizable compound, exemplary compound (b) is effective, and may significantly improve the effects of the present invention.

[Chem. 45]

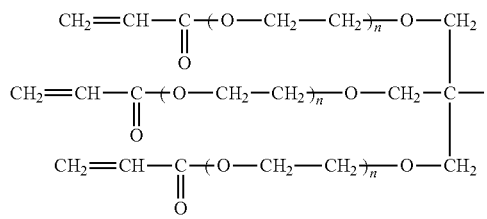 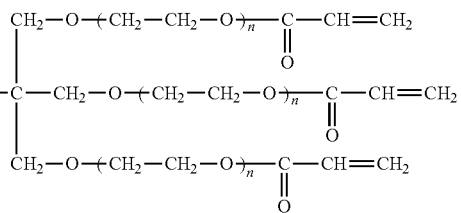

(a)

(The sum of each n is 6)

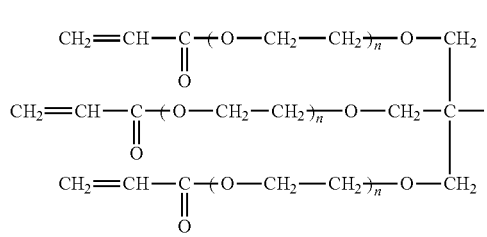 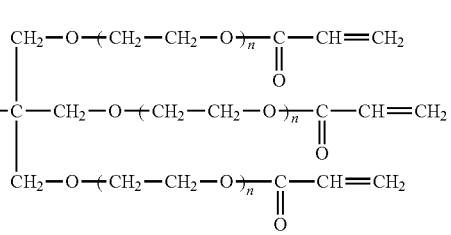

(b)

(The sum of each n is 12)

-continued

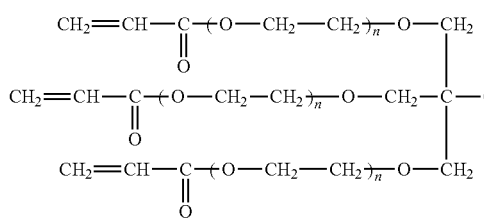
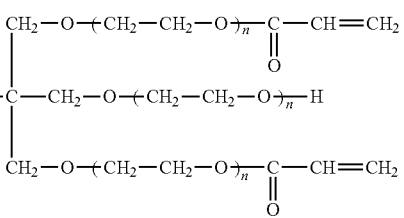

(c)

(The sum of each n is 12)

[Chem. 46]

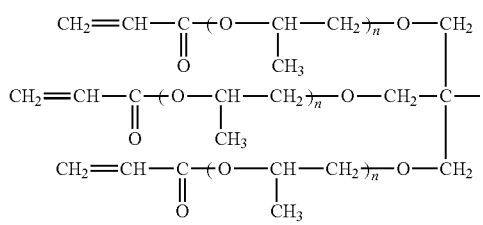
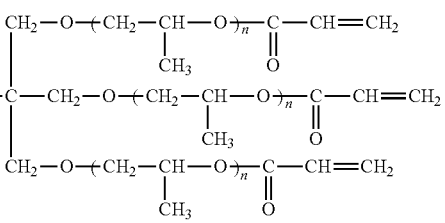

(d)

(The sum of each n is 6)

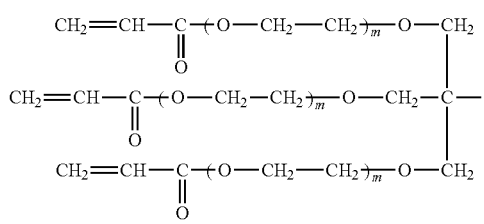

(e)

(The sum of each m is 4)

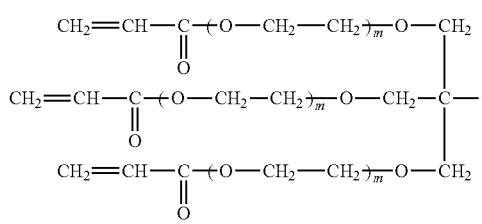

(f)

(The sum of each m is 12)

Examples of the commercially available products of the polymerizable compounds represented by Formulae (i) and (ii) may include SR-494, which is a tetrafunctional acrylate having four ethyleneoxy chains, manufactured by Sartomer Company Inc., DPCA-60, which is a hexafunctional acrylate having six pentyleneoxy chains, manufactured by Nippon Kayaku Co., Ltd., TPA-330, which is a trifunctional acrylate having three isobutyleneoxy chains, and the like.

In addition, as the polymerizable compound, those introduced as photocurable monomers or oligomers in Journal of the Adhesion Society of Japan, Vol. 20, No. 7 (pages 300 to 308) may also be used.

The content of the polymerizable compound in the composition is preferably 2 to 50% by mass, more preferably 2 to 30% by mass, and furthermore, more preferably 2 to 25% by mass, based on the total solid content of the composition.

<(D) Ultraviolet Absorber>

Furthermore, it is preferred that the composition of the present invention (typically a coloring-radiation sensitive composition) includes (D) an ultraviolet absorber.

The ultraviolet absorber is a compound whose absorption coefficient per gram exceeds 100 at a wavelength of 365 nm and is 10 or less at a wavelength of 400 nm or more. Meanwhile, the absorption coefficient is a value determined by using an ultraviolet/visible light spectrophotometer (Carry-5 spectrophotometer, manufactured by Varian, Inc.) at a concentration of 0.01 g/L using an ethyl acetate solvent.

When the absorption coefficient per gram is 100 or less at a wavelength of 365 nm, the amount of the ultraviolet absorber added in order to obtain the ultraviolet absorption effect is increased, and thus the formulation likelihood is decreased, and when the absorption coefficient per gram exceeds 10 at a wavelength of 400 nm or more, the device spectrum in the visible region is affected, which is not preferred.

The ultraviolet absorber in the present invention is preferably a compound represented by the following Formula (I), which is a conjugated diene compound. When this conjugated diene compound is used, it is possible to suppress the fluctuation in the development performance especially after performing the exposure with a low illuminance, and to more effectively suppress the dependence on the exposure illuminance, which relates to pattern formability such as a line width of a pattern, a film thickness, and a spectroscopic spectrum.

[Chem. 47]

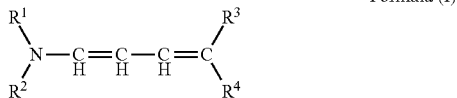

Formula (I)

In Formula (I), each of $R^1$ and $R^2$ independently represents a hydrogen atom, an alkyl group having a carbon number of 1 to 20, or an aryl group having a carbon number of 6 to 20, and $R^1$ and $R^2$ may be the same as or different from each other, but do not simultaneously represent a hydrogen atom.

Examples of the alkyl group having a carbon number of 1 to 20, which is represented by $R^1$ or $R^2$, may include a methyl group, an ethyl group, a propyl group, an n-butyl group, an n-hexyl group, a cyclohexyl group, an n-decyl group, an n-dodecyl group, an n-octadecyl group, an eicosyl group, a methoxyethyl group, an ethoxypropyl group, a 2-ethylhexyl group, a hydroxyethyl group, a chloropropyl group, an N,N-diethylamino propyl group, a cyanoethyl group, a phenethyl group, a benzyl group, a p-t-butylphenethyl group, a p-t-octylphenoxyethyl group, a 3-(2,4-di-t-amylphenoxy)propyl group, an ethoxycarbonylmethyl group, a 2-(2-hydroxyethoxy)ethyl group, a 2-furylethyl group, and the like, and a methyl group, an ethyl group, a propyl group, an n-butyl group, and an n-hexyl group are preferred.

The alkyl group, which is represented by $R^1$ or $R^2$, may have a substituent, and examples of the substituent of an alkyl group having a substituent may include an alkyl group, an aryl group, an alkoxy group, an aryloxy group, an acyloxy group, a halogen atom, an acylamino group, an acyl group, an alkylthio group, an arylthio group, a hydroxyl group, a cyano group, an alkyloxy carbonyl group, an aryloxy carbonyl group, a substituted carbamoyl group, a substituted sulfamoyl group, a nitro group, a substituted amino group, an alkyl sulfonyl group, an aryl sulfonyl group, and the like.

The aryl group having a carbon number of 6 to 20, which is represented by $R^1$ or $R^2$, may be a monocyclic or condensed ring, and may be either a substituted aryl group having a substituent or an unsubstituted aryl group. Examples thereof may include a phenyl group, a 1-naphthyl group, a 2-naphthyl group, an anthryl group, a phenanthryl group, an indenyl group, an acenabutenyl group, a fluorenyl group, and the like. Examples of the substituent of a substituted aryl group having a substituent may include an alkyl group, an aryl group, an alkoxy group, an aryloxy group, an acyloxy group, a halogen atom, an acylamino group, an acyl group, an alkylthio group, an arylthio group, a hydroxyl group, a cyano group, an alkyloxy carbonyl group, an aryloxy carbonyl group, a substituted carbamoyl group, a substituted sulfamoyl group, a nitro group, a substituted amino group, an alkyl sulfonyl group, an aryl sulfonyl group, and the like. Among them, a substituted or unsubstituted phenyl group, a 1-naphthyl group, and a 2-naphthyl group are preferred.

Furthermore, $R^1$ and $R^2$ may form a cyclic amino group together with a nitrogen atom. Examples of the cyclic amino group may include a piperidino group, a morpholino group, a pyrrolidino group, a hexahydroazepino group, a piperazino group, and the like.

Among those described above, as $R^1$ and $R^2$, a lower alkyl group having a carbon number of 1 to 8 (for example, methyl, ethyl, isopropyl, butyl, sec-butyl, tert-butyl, pentyl, tert-pentyl, hexyl, octyl, 2-ethylhexyl, tert-octyl, and the like), or a substituted or unsubstituted phenyl group (for example, a tolyl group, a phenyl group, an anisyl group, a mesityl group, a chlorophenyl group, a 2,4-di-t-amylphenyl group, and the like) are preferred. Further, it is also preferred that $R^1$ and $R^2$ combine with each other to form a ring (for example, a piperidine ring, a pyrrolidine ring, a morpholine ring, and the like) including the nitrogen atom represented by N in the formula.

In Formula (I), $R^3$ and $R^4$ represent an electron withdrawing group. Here, the electron withdrawing group is an electron withdrawing group whose Hammett substituent constant $\sigma_p$ value (hereinafter, simply referred to as "$\sigma_p$ value") is 0.20 to 1.0. Preferably, the electron withdrawing group is an electron withdrawing group whose $\sigma_p$ value is 0.30 to 0.8.

The Hammett rule is an empirical rule which was proposed by L. P. Hammett in 1935 in order to quantitatively discuss an influence of a substituent group on a reaction or equilibrium of benzene derivatives, and the validity of this rule is widely admitted these days. Substituent constants obtained by the Hammett rule include the $\sigma_p$ value and the $\sigma_m$ value, and these values are described in many general documents, but are described in detail in, for example, "Lange's Handbook of Chemistry" 12th edition, edited by J. A. Dean, 1979 (McGraw-Hill), or "Journal of Japanese Chemistry special edition", Vol. 122, pp. 96 to 103, 1979 (Nankodo Co., Ltd.), and "Chemical Reviews", Vol. 91, pp. 165 to 195, 1991. In the present invention, it does not mean that the substituent is limited to substituents with values already known by these documents, which are described in these documents, and it is natural that as long as the values is within the above ranges when measured based on the Hammett rule, the substituent with such value is included in the electron withdrawing group even though the value is not described in these documents.

Specific examples of the electron withdrawing group with the up value of 0.20 to 1.0 may include an acyl group, an acyloxy group, a carbamoyl group, an alkyloxy carbonyl group, an aryloxy carbonyl group, a cyano group, a nitro group, a dialkyl phosphono group, a diaryl phosphono group, a diaryl phosphinyl group, an alkyl sulfinyl group, an aryl sulfinyl group, an alkyl sulfonyl group, an aryl sulfonyl group, a sulfonyloxy group, an acylthio group, a sulfamoyl group, a thiocyanate group, a thiocarbonyl group, an alkyl group substituted with at least two or more halogen atoms, an alkoxy group substituted with at least two or more halogen atoms, an aryloxy group substituted with at least two or more halogen atoms, an alkylamino group substituted with at least two or more halogen atoms, an alkylthio group substituted with at least two or more halogen atoms, and an aryl group, a heterocyclic group, a chlorine atom, a bromine atom, an azo group, or a selenocyanate group substituted with another electron withdrawing group having an $\sigma_p$ value of 0.20 or more. Among these substituents, substituents which may further have a substituent may further have the substituent as previously exemplified.

Among those described above, in the present invention, $R^3$ is preferably a group selected from a cyano group, —COOR⁵, —CONHR⁵, —COR⁵, and —SO₂R⁵, and further, $R^4$ is preferably a group selected from a cyano group, —COOR⁶, —CONHR⁶, —COR⁶, and —SO₂R⁶. Each of $R^5$ and $R^6$ independently represents an alkyl group having a carbon number of 1 to 20, or an aryl group having a carbon number of 6 to 20. The alkyl group having a carbon number of 1 to 20 and the aryl group having a carbon number of 6 to 20, which are represented by $R^5$ and $R^6$, respectively, have the same meaning as those in $R^1$ and $R^2$, and preferred aspects thereof are also the same.

Among them, $R^3$ and $R^4$ are preferably an acyl group, a carbamoyl group, an alkyloxy carbonyl group, an aryloxy carbonyl group, a cyano group, a nitro group, an alkyl sulfonyl group, an aryl sulfonyl group, a sulfonyloxy group, or a sulfamoyl group; and particularly preferably an acyl group, a carbamoyl group, an alkyloxy carbonyl group, an aryloxy carbonyl group, a cyano group, an alkyl sulfonyl group, an aryl sulfonyl group, a sulfonyloxy group, or a sulfamoyl group.

In addition, $R^3$ and $R^4$ may combine with each other to form a ring.

Furthermore, at least one of $R^1$, $R^2$, $R^3$, and $R^4$ may be a form of a polymer derived from a monomer bonded to a vinyl group via a linking group. Further, at least one of $R^1$, $R^2$, $R^3$, and $R^4$ may be a copolymer with another monomer.

In the case of the copolymer, examples of the another monomer may include acrylic acids, α-chloroacrylic acids, α-alacrylic acids (for example, esters derived from acrylic acids such as a methacrylic acid, preferably lower alkyl esters and amides (for example, acrylamide, methacrylamide, t-butyl acrylamide, methyl acrylate, methyl methacrylate, ethyl acrylate, ethyl methacrylate, n-propyl acrylate, n-butyl acrylate, 2-ethylhexyl acrylate, n-hexyl acrylate, octyl methacrylate and lauryl methacrylate, methylene bisacrylamide, and the like)), vinyl esters (for example, vinyl acetate, vinyl propionate, vinyl laurate, and the like), acrylonitrile, methacrylonitrile, aromatic vinyl compounds (for example, styrene and derivatives thereof; for example, vinyl toluene, divinyl benzene, vinyl acetophenone, sulfostyrene, styrene sulfinic acid, and the like), itaconic acid, citraconic acid, crotonic acid, vinylidene chloride, vinyl alkyl ethers (for example, vinyl ethyl ether, and the like), maleic acid esters, N-vinyl-2-pyrrolidone, N-vinyl pyridine, 2-vinyl pyridine, 4-vinyl pyridine, and the like.

Among them, acrylic acid esters, methacrylic acid esters, and aromatic vinyl compounds are particularly preferred.

Two or more of comonomer compounds may be used in combination. For example, n-butyl acrylate and divinyl benzene, styrene and methyl methacrylate, methyl acrylate and methacrylic acid, and the like may be used.

Hereinafter, preferred specific examples (Exemplary Compounds (1) to (14)) of the compound represented by Formula (I) will be shown. However, the invention is not limited thereto.

[Chem. 48]

(1)
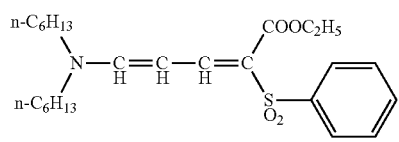

(2)
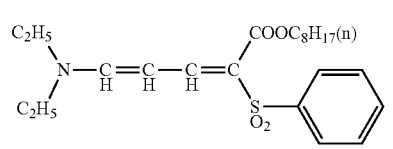

-continued (3)
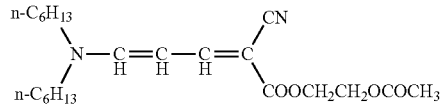

(4)
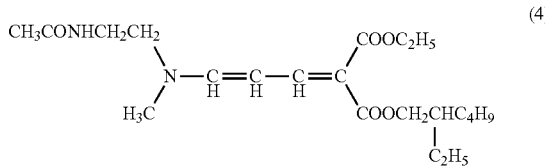

(5)
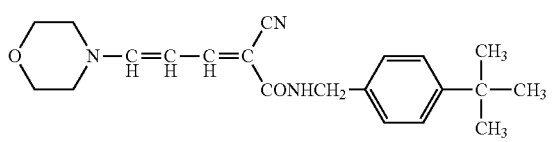

(6)
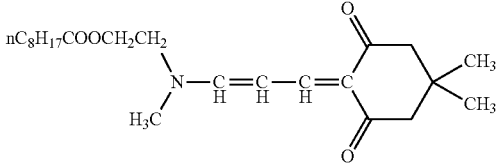

[Chem. 49]

(7)
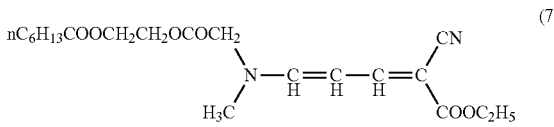

(8)
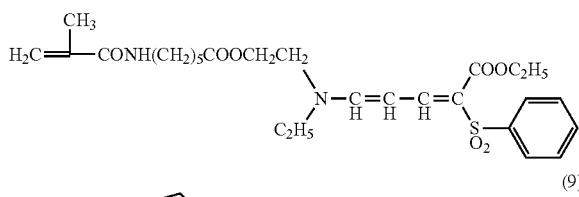

(9)
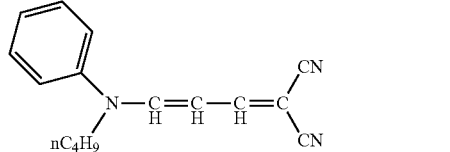

(10)
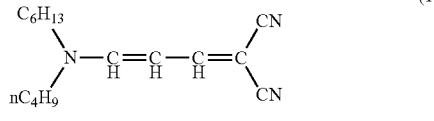

(11)
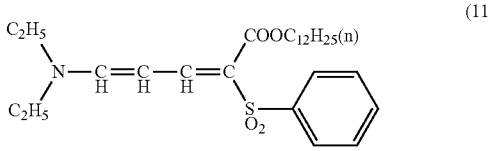

(12)
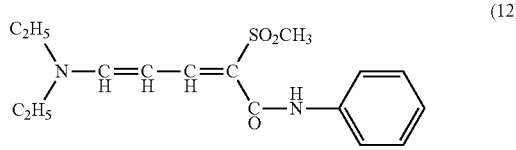

-continued

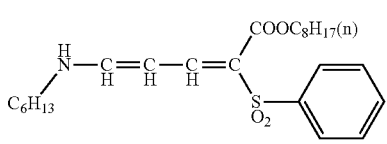
(13)

[Chem. 50]

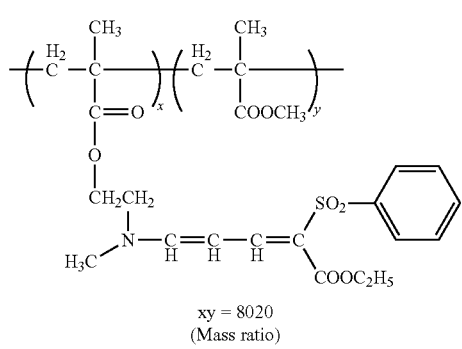
(14)

xy = 8020
(Mass ratio)

The compound represented by Formula (I) may be synthesized by methods described in Japanese Examined Patent Application Publication No. S44-29620, and Japanese Patent Application Laid-Open Nos. S53-128333, S61-169831, S63-53543, S63-53544, and S63-56651.

Hereinafter, a method for synthesizing Exemplary Compound (1) as a representative compound of the present invention will be described in detail. That is, 3-anilino acroleinanile (13.3 g) and ethylphenyl sulfonyl acetate (14.3 g) are heated to 85 to 90° C. in anhydrous acetic acid (40 ml) for 2 hours. The anhydrous acetic acid is removed by drying under reduced pressure, and then ethanol (40 ml) and di-n-hexylamine (24.1 g) are added thereto, and the mixture is refluxed for 2 hours. After removing the ethanol, the residue is purified with column chromatography, and then recrystallized from ethanol, thereby obtaining an target product (melting point=95 to 96° C.).

In the present invention, the various ultraviolet absorbers may be used either alone or in combination of two or more thereof.

The composition may or may not include the ultraviolet absorber, but when the composition includes the ultraviolet absorber, the content of the ultraviolet absorber is preferably 0.01% to 10%, and more preferably from 0.01% to 5%, in terms of mass, based on a total solid content of the composition of the present invention.

When the content of the ultraviolet absorber is less than the above ranges, sidewall roughness in a color pattern is aggravated, so that a minute pattern shape (in particular, a rectangular shape) may not be formed precisely, and when the content exceeds the above ranges, the sensitivity is reduced.

In addition, the ratio (D/B) of (D) the ultraviolet absorber to (B) the photopolymerization initiator is 0.25 to 1.25 based on mass. When the ratio (D/B) is less than 0.25, sidewall roughness in the color pattern is aggravated, so that a minute pattern shape (in particular, a rectangular shape) may not be formed precisely, and when the ratio (D/B) exceeds 1.25, the sensitivity is reduced. Among them, for the same reason as described above, the ratio (D/B) is preferably in a range of 0.3 to 1.1, and more preferably in a range of 0.4 to 1.0.

Furthermore, the composition of the present invention may include a component such as (E) an alkali-soluble resin, an organic solvent, and a surfactant.

<(E) Alkali-Soluble Resin>

It is also preferred that the composition of the present invention (typically a coloring radiation-sensitive composition) also contains (E) an alkali-soluble resin. When the composition contains the alkali-soluble resin, developability and pattern formability are improved.

The alkali-soluble resin may be a linear organic high molecular weight polymer, and may be appropriately selected from alkali-soluble resins which have at least one group promoting alkali solubility, in the molecule (preferably, a molecule that contains an acrylic copolymer or a styrene-based copolymer as the main chain).

The alkali-soluble resin will be described.

As the alkali-soluble resin, from the viewpoint of heat resistance, a polyhydroxy styrene-based resin, a polysiloxane-based resin, an acrylic resin, an acrylamide-based resin, and an acryl/acrylamide copolymer resin are preferred, and from the viewpoint of controlling the developability, an acrylic resin, an acrylamide-based resin, and an acryl/acrylamide copolymer resin are preferred.

Examples of the group which promotes alkali solubility (hereinafter, also referred to as an acid group) may include a carboxyl group, a phosphoric acid group, a sulfonic acid group, a phenolic hydroxyl group, and the like, and a group which promotes alkali solubility, which is soluble in an organic solvent and developable by a weakly alkali aqueous solution, is preferred, and particularly preferred examples thereof may include (meth)acrylic acid. These acid groups may be used either alone or in combination of two or more thereof.

Examples of the monomer capable of imparting an acid group after polymerization may include a monomer having a hydroxyl group, such as 2-hydroxyethyl(meth)acrylate, a monomer having an epoxy group, such as glycidyl(meth)acrylate, a monomer having an isocyanate group, such as 2-isocyanatoethyl(meth)acrylate, and the like. These monomeric bodies for introducing an acid group may be used either alone or in combination of two or more thereof. In order to introduce an acid group into an alkali-soluble binder, for example, a monomer having an acid group and/or a monomer capable of imparting an acid group after polymerization (hereinafter, also referred to as a "monomeric body for introducing an acid group" in some cases) are used as monomer components for polymerization. Meanwhile, when an acid group is introduced by using a monomer capable of imparting an acid group after polymerization as a monomeric body component, it is necessary to perform, for example, a treatment for imparting an acid group to be described below, after polymerization.

For example, a publicly known radical polymerization method may be applied to the preparation of the alkali-soluble resin. When the alkali-soluble resin is prepared by a radical polymerization method, the polymerization conditions such as temperature, pressure, the type and amount of radical initiator, and the type of solvent may be easily set by the person skilled in the art, and the conditions may be determined experimentally.

The alkali-soluble resin is preferably a polymer having a carboxylic acid group in a side chain thereof, and examples thereof may include a methacrylic acid copolymer, an acrylic acid copolymer, an itaconic acid copolymer, a crotonic acid copolymer, a maleic acid copolymer, a partially esterified maleic acid copolymer, and an alkali-soluble phenolic resin such as a Novolac-type resin, as well as an acidic cellulose derivative having a carboxylic acid in a side chain thereof, and a compound obtained by adding an acid anhydride to a polymer having a hydroxyl group. Particularly, a copolymer of (meth)acrylic acid and another monomeric body copolymerizable with (meth)acrylic acid is suitable as the alkali-soluble resin. Examples of the another monomeric body copolymerizable with (meth)acrylic acid may include alkyl(meth)acrylate, aryl(meth)acrylate, a vinyl compound, and the like. Examples of the alkyl(meth)acrylate and the aryl(meth)acrylate may include methyl(meth)acrylate, ethyl (meth)acrylate, propyl(meth)acrylate, butyl(meth)acrylate, isobutyl(meth)acrylate, pentyl(meth)acrylate, hexyl(meth) acrylate, octyl(meth)acrylate, phenyl(meth)acrylate, benzyl (meth)acrylate, tolyl(meth)acrylate, naphthyl(meth)acrylate, cyclohexyl(meth)acrylate, and the like, examples of the vinyl compound may include styrene, a-methylstyrene, vinyl toluene, glycidyl methacylate, acrylonitrile, vinyl acetate, N-vinylpyrrolidone, tetrahydrofurfuryl methacrylate, a polystyrene macromonomer, a polymethyl methacrylate macromonomer, and the like, and examples of an N-substituted maleimide monomer described in Japanese Patent Application Laid-Open No. H10-300922 may include N-phenylmaleimide, N-cyclohexylmaleimide, and the like. Meanwhile, these monomeric bodies copolymerizable with (meth)acrylic acid may be used either alone or in combination of two or more thereof.

The alkali-soluble phenol resin may be suitably used when the coloring radiation-sensitive composition of the present invention is prepared as a positive-type composition. Examples of the alkali-soluble phenol resin may include a Novolac resin or a vinyl polymer, and the like.

Examples of the Novolac resin may include those obtained by condensation of phenols and aldehydes in the presence of an acid catalyst. Examples of the phenols may include phenol, cresol, ethyl phenol, butyl phenol, xylenol, phenyl phenol, catechol, resorcinol, pyrogallol, naphthol, or bisphenol A, and the like.

Examples of the aldehydes may include formaldehyde, paraformaldehyde, acetaldehyde, propionaldehyde, or benzaldehyde, and the like.

The phenols and aldehydes may be used either alone or in combination of two or more thereof, respectively.

Specific examples of the Novolac resin may include a condensation product of metacresol, paracresol, or a mixture thereof and formalin.

The molecular weight distribution of the Novolac resin may be adjusted by using a means such as fractionation. Furthermore, a low molecular weight component having a phenolic hydroxyl group such as bisphenol C or bisphenol A may also be mixed with the Novolac resin.

Further, in order to improve the crosslinking efficiency of the composition of the present invention, an alkali-soluble resin having a polymerizable group may be used. As the alkali-soluble resin having a polymerizable group, an alkali-soluble resin, which contains an allyl group, a (meth)acryl group, an allyloxy alkyl group, and the like, in a side chain thereof, is useful. Examples of the polymer containing a polymerizable group as described above may include DIANAL NR series (manufactured by Mitsubishi Rayon Co, Ltd.), Photomer 6173 (COOH-containing polyurethane acrylic oligomer, manufactured by Diamond Shamrock Co., Ltd.), VISCOAT R-264 and KS RESIST 106 (all manufactured by OSAKA ORGANIC CHEMICAL INDUSTRY LTD.), CYCLOMER P series and PRAXEL CF200 series (all manufactured by Daicel Chemical Industries, Ltd.), EBECRYL 3800 (manufactured by Daicel-UCB Co., Ltd.), and the like.

Preferred examples of the alkali-soluble resins containing a polymerizable group may include a urethane-modified polymerizable double bond-containing acrylic resin, which is obtained by the reaction of an acrylic resin including a carboxyl group with a compound in which an isocyanate group and an OH group have been reacted with each other in advance to leave one unreacted isocyanate group and which also has a (meth)acryloyl group, an unsaturated group-containing acrylic resin obtained by the reaction of an acrylic resin including a carboxyl group with a compound having both an epoxy group and a polymerizable double bond in the molecule thereof, an acid pendant-type epoxy acrylate resin, a polymerizable double bond-containing acrylic resin obtained by the reaction of an acrylic resin including an OH group with a dibasic acid anhydride having a polymerizable double bond, a resin obtained by the reaction of acrylic resin including an OH group with a compound having an isocyanate group and a polymerizable group, a resin obtained by subjecting a resin having, in a side chain thereof an ester group having a leaving group such as a halogen atom or a sulfonate group at the a-position or β-position, to a basic treatment, as described in Japanese Patent Application Laid-Open Nos. 2002-229207 and 2003-335814, and the like.

As the alkali-soluble resin, in particular, a benzyl(meth) acrylate/(meth)acrylic acid copolymer or a multi-component copolymer composed of benzyl(meth)acrylate/(meth)acrylic acid/another monomer is suitable. Examples of other alkali-soluble resins may include those obtained by copolymerizing 2-hydroxyethyl methacrylate, and a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrylate/methacrylic acid copolymer, which are described in Japanese Patent Application Laid-Open No. H7-140654, and the like.

It is preferred that the alkali-soluble resin contains (a) a resin having a repeating unit derived from a compound represented by the following Formula (ED) (hereinafter, also appropriately referred to as "ether dimer").

By using (a) the resin, the composition in the present invention may be improved in view of PCD dependence.

[Chem. 51]

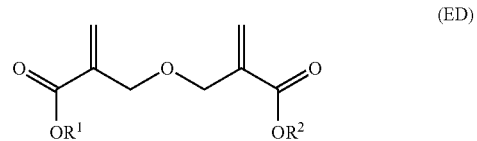

(ED)

In Formula (ED), each of $R^1$ and $R^2$ independently represents a hydrogen atom or a hydrocarbon group.

In Formula (ED), the hydrocarbon group represented by $R^1$ and $R^2$ is preferably a hydrocarbon group having a carbon number of 1 to 25.

In addition, the hydrocarbon group may have a substituent.

The hydrocarbon group is not particularly limited, but examples thereof may include a straight-chained or branched alkyl group such as methyl, ethyl, n-propyl, iso-propyl, n-butyl, isobutyl, t-butyl, t-amyl, stearyl, lauryl, and 2-ethylhexyl; an aryl group such as phenyl; an alicyclic group such as cyclohexyl, t-butylcyclohexyl, dicyclopentadienyl, tricyclodecanyl, isobornyl, adamantly, and 2-methyl-2-adamantyl; an alkyl group substituted with alkoxy such as 1-methoxyethyl and 1-ethoxyethyl; an alkyl group substituted with an aryl group such as benzyl; and the like. Among them, in particular, a substituent of primary or secondary carbon, which is difficult to desorb by heat or acid, such as methyl, ethyl, cyclohexyl and benzyl, is preferred from the viewpoint of heat resistance.

Specific examples of the ether dimer may include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-(oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricylodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, di(2-methyl-2-adamantyl)-2,2'-[oxybis(methylene)]bis-2-propenoate, and the like. Among them, in particular, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferred. These ether dimers may be used either alone or in combination of two or more thereof.

The ratio of the ether dimer in the monomeric body for obtaining Resin (a) is not particularly limited, but is preferably 2 to 60% by mass, more preferably 5 to 55% by mass, and still more preferably 5 to 50% by mass, in the total monomeric body components.

Resin (a) may be a copolymer in which other monomeric bodies are copolymerized, together with the ether dimer.

Examples of the other monomeric bodies copolymerizable with the ether dimer include a monomeric body for introducing an acid group, a monomeric body for introducing a radical polymerizable double bond, a monomer for introducing an epoxy group, and other copolymerizable monomeric bodies other than these. The monomeric bodies may be used either alone or in combination of two or more thereof.

Examples of the monomeric body for introducing an acid group may include a monomer having a carboxyl group, such as (meth)acrylic acid or itaconic acid, a monomer having a phenolic hydroxyl group, such as N-hydroxyphenylmaleimide, a monomer having a carboxylic acid anhydride group, such as anhydrous maleic acid and anhydrous itaconic acid, and the like. Among them, (meth)acrylic acid is particularly preferred.

Furthermore, the monomeric body for introducing an acid group may be a monomeric body capable of imparting an acid group after polymerization, and examples thereof may include a monomeric body having a hydroxyl group, such as 2-hydroxyethyl(meth)acrylate, a monomeric body having an epoxy group, such as glycidyl(meth)acrylate, a monomeric body having an isocyanate group, such as 2-isocyanatoethyl (meth)acrylate, and the like. When using the monomeric body for introducing a radical polymerizable double bond is used or when using a monomeric body capable of imparting an acid group after polymerization, it is necessary to perform a processing of imparting the acid group after polymerization. The processing of imparting the acid group after polymerization varies depending on the types of monomeric body, and examples thereof may include the following processings. When a monomeric body having a hydroxyl group is used, examples thereof may include a processing of adding an acid anhydride such as succinic anhydride, tetrahydrophthalic acid anhydride, or maleic acid anhydride. When a monomeric body having an epoxy group is used, examples thereof may include a processing of adding a compound having an amino group and an acid group, such as N-methylaminobenzoic acid or N-methylaminophenol, or a processing of adding an acid anhydride, such as succinic anhydride, tetrahydrophthalic anhydride, or maleic anhydride, to a hydroxyl group produced after adding an acid such as (meth)acrylic acid. When a monomeric body having an isocyanate group is used, examples thereof may include a processing of adding a compound having a hydroxyl group and an acid group, such as 2-hydroxybutyric acid.

When the monomeric body for obtaining Resin (a) includes the monomeric body for introducing an acid group, the content ratio thereof is not particularly limited, but is preferably 5 to 70% by mass, and more preferably 10 to 60% by mass, in the total monomeric body components.

Examples of the monomeric body for introducing a radical polymerizable double bond may include a monomer having a carboxyl group, such as (meth)acrylic acid and itaconic acid; a monomer having a carboxylic acid anhydride group such as anhydrous maleic acid and anhydrous itaconic acid; a monomer having an epoxy group, such as glycidyl(meth)acrylate, 3,4-epoxycycolhexylmethyl(meth)acrylate, and o-(or m-, or p-)vinylbenzyl glycidyl ether; and the like. When the monomeric body for introducing a radical polymerizable double bond is used, it is necessary to perform a processing for imparting the radical polymerizable double bond after polymerization. The processing for imparting the radical polymerizable double bond after polymerization varies depending on the type of monomer capable of imparting the radical polymerizable double bond to be used, and examples thereof may include the following processings. When the monomer having a carboxyl group such as (meth)acrylic acid or itaconic acid is used, examples thereof may include a processing of adding a compound having a radical polymerizable double bond to an epoxy group such as glycidyl(meth)acrylate, 3,4-epoxycycolhexylmethyl(meth)acrylate, or o-(or m-, or p-)vinylbenzyl glycidyl ether. When the monomer having a carboxylic acid anhydride such as anhydrous maleic acid or anhydrous itaconic acid is used, examples thereof may include a processing of adding a compound having a radical polymerizable double bond to a hydroxyl group such as 2-hydroxyethyl(meth)acrylate. When the monomer having an epoxy group such as glycidyl(meth)acrylate, 3,4-epoxycycolhexylmethyl(meth)acrylate, and o-(or m-, or p-)vinylbenzyl glycidyl ether is used, examples thereof may include a processing of adding a compound having a radical polymerizable double bond to an acid group such as (meth)acrylic acid.

When the monomeric body for obtaining Resin (a) includes the monomeric body for introducing a radical polymerizable double bond, the content ratio thereof is not particularly limited, but is preferably 5 to 70% by mass, and more preferably 10 to 60% by mass, in the total monomeric body components.

Examples of the monomer for introducing an epoxy group may include glycidyl(meth)acrylate, 3,4-epoxycycolhexyl-methyl(meth)acrylate, o-(or m-, or p-)vinylbenzyl glycidyl ether, and the like.

When the monomeric body for obtaining Resin (a) includes the monomeric body for introducing an epoxy group, the content ratio thereof is not particularly limited, but is preferably 5 to 70% by mass, and more preferably 10 to 60% by mass, in the total monomeric body components.

Examples of the other copolymerizable monomeric bodies may include: (meth)acrylic esters such as methyl(meth)acrylate, ethyl(meth)acrylate, n-propyl(meth)acrylate, iso-propyl(meth)acrylate, n-butyl(meth)acrylate, isobutyl(meth)acrylate, t-butyl(meth)acrylate, 2-ethylhexyl methyl(meth)acrylate, cyclohexyl(meth)acrylate, benzyl(meth)acrylate, or 2-hydroxyethyl(meth)acrylate; aromatic vinyl compounds such as styrene, vinyltoluene, or α-methylstyrene; N-substituted maleimides such as N-phenylmaleimide and N-cyclohexylmaleimide; butadiene or substituted butadiene compounds such as butadiene and isoprene; ethylene or ethylene substituted compounds such as ethylene, propylene, vinyl chloride and acrylonitrile; vinyl esters such as vinyl acetate; and the like. Among them, methyl(meth)acrylate, cyclohexyl(meth)acrylate, benzyl(meth)acrylate, or styrene is preferred from the viewpoint of good transparency and difficulty in impairing heat resistance.

When the monomer for obtaining Resin (a) includes the other copolymerizable monomeric bodies, the content ratio is not particularly limited, but is preferably 95% by mass or less and more preferably 85% by mass or less.

The weight average molecular weight of Resin (a) is not particularly limited, but is preferably 2,000 to 200,000, more preferably 5,000 to 100,000, and still more preferably 5,000 to 20,000, from the viewpoint of viscosity of the coloring radiation-sensitive composition and heat resistance of the coating film formed by the composition.

Further, when Resin (a) has an acid group, the acid value is preferably 30 to 500 mgKOH/g, and more preferably 50 to 400 mgKOH/g.

Resin (a) may be at least easily obtained by polymerizing the monomeric body which essentially has the ether dimer. In this case, a tetrahydropyran ring structure is formed by performing a cyclization reaction of the ether dimer simultaneously with polymerization.

The polymerization method applied to the synthesis of Resin (a) is not particularly limited, and various publicly known polymerization methods in the related art may be adopted, but particularly, a method by a solution polymerization method is preferred. In detail, Resin (a) may be synthesized, for example, in accordance with the synthesis methods of Resin (a) described in Japanese Patent Application Laid-Open No. 2004-300204.

Hereinafter, exemplary compounds of Resin (a) will be shown, but the present invention is not limited thereto. The composition ratio of the exemplary compounds shown below is mol %.

[Chem. 52]

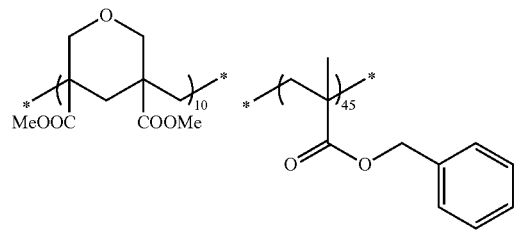

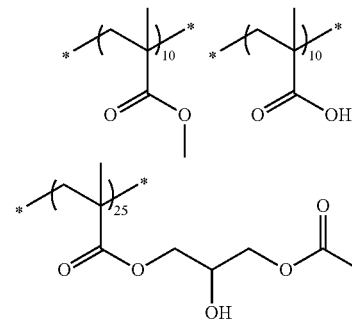

Mw = 12000

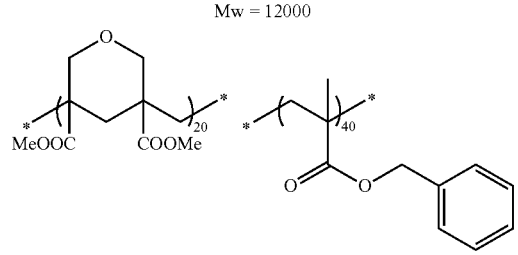

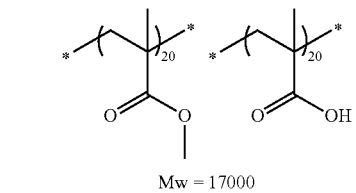

Mw = 17000

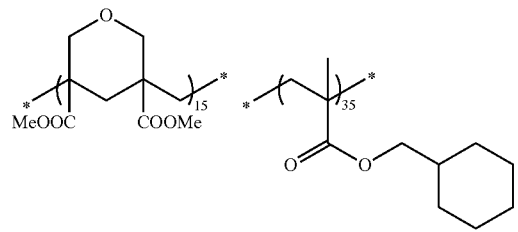

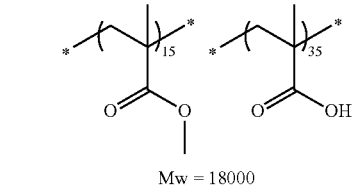

Mw = 18000

[Chem. 53]

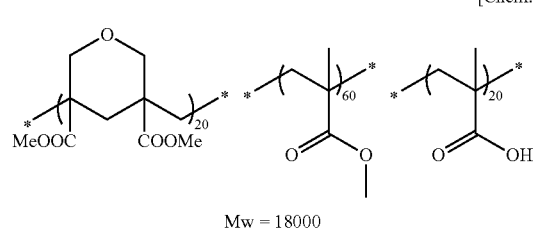

Mw = 18000

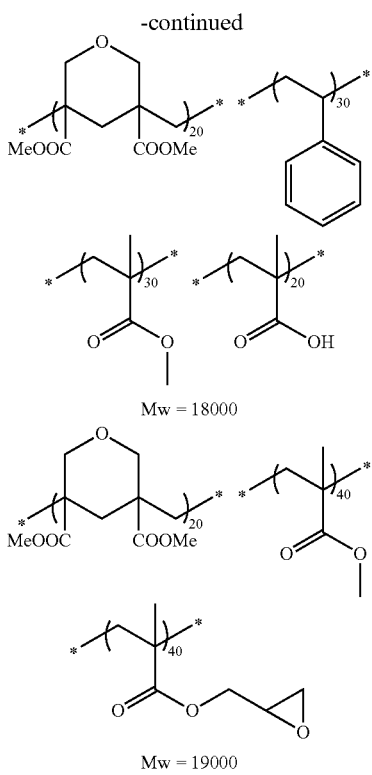

Mw = 18000

Mw = 19000

Suitable examples of the alkali-soluble resin may include particularly a benzyl(meth)acrylate/(meth)acrylic acid copolymer or a multi-component copolymer composed of benzyl (meth)acrylate/(meth)acrylic acid/another monomer. In addition, examples thereof may include a copolymer in which 2-hydroxyethylmethacrylate is copolymerized, or a 2-hydroxypropyl(meth)acrylate/polystyrene macromonomer/benzyl methacrylate/methacrylic acid copolymer, a 2-hydroxy-3-phenoxy propyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, a 2-hydroxyethyl methacrylate/polystyrene macromonomer/benzyl methacrate/methacrylic acid copolymer and the like, which are described in Japanese Patent Application Laid-Open No. H7-140654.

Furthermore, in order to improve the crosslinking efficiency of the composition according to the present invention, an alkali-soluble resin having a polymerizable group may be used.

As the alkali-soluble resin having a polymerizable group, an alkali-soluble resin, which contains in a side chain thereof an allyl group, a (meth)acryl group, an allyloxy alkyl group, and the like, is useful. Preferred examples of the alkali-soluble resin containing a polymerizable group may include a urethane-modified polymerizable double bond-containing acrylic resin, which is obtained by the reaction of an acrylic resin including a carboxyl group with a compound in which an isocyanate group and an OH group have been reacted with each other in advance to leave one unreacted isocyanate group and which also has a (meth)acryloyl group, an unsaturated group-containing acrylic resin obtained by the reaction of an acrylic resin including a carboxyl group with a compound having both an epoxy group and a polymerizable double bond in the molecule thereof, an acid pendant-type epoxy acrylate resin, a polymerizable double bond-containing acrylic resin obtained by the reaction of an acrylic resin including an OH group with a dibasic acid anhydride having a polymerizable double bond, a resin obtained by the reaction of acrylic resin including an OH group with a compound having an isocyanate group and a polymerizable group, a resin obtained by subjecting a resin having, in a side chain thereof, an ester group having a leaving group such as a halogen atom or a sulfonate group at the a-position or β-position, to a basic treatment, as described in Japanese Patent Application Laid-Open Nos. 2002-229207 and 2003-335814, and the like.

The acid value of the alkali-soluble resin is preferably 30 mgKOH/g to 200 mgKOH/g, more preferably 50 mgKOH/g to 150 mgKOH/g, and most preferably 70 mgKOH/g to 120 mgKOH/g.

Further, the weight average molecular weight (Mw) of the alkali-soluble resin is preferably 2,000 to 50,000, more preferably 5,000 to 30,000, and the most preferably 7,000 to 20,000.

As the alkali-soluble resin, it is also possible to use a resin including a structural unit derived from (a) an ethylenically unsaturated monomeric body represented by the following Formula (X).

[Chem. 54]

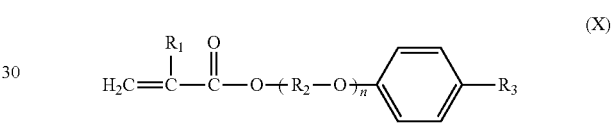

(X)

(In Formula (X), $R_1$ represents a hydrogen atom or a methyl group, $R_2$ represents an alkylene group having a carbon number of 2 to 10, and $R_3$ represents a hydrogen atom or an alkyl group having a carbon number of 1 to 20, which may include a benzene ring. n represents an integer of 1 to 15.)

In Formula (X), the carbon number of the alkylene group of $R_2$ is preferably 2 to 3. In addition, the carbon number of the alkyl group of $R_3$ is 1 to 20, but more preferably 1 to 10, and the alkyl group of $R_3$ may include a benzene ring. Examples of the alkyl group including a benzene ring represented by $R_3$, may include a benzyl group, a 2-phenyl (iso)propryl group, and the like.

Specific examples of the resin including a structural unit derived from (a) the ethylenically unsaturated monomeric body represented by Formula (X) may include resins described in Japanese Patent Application Laid-Open Nos. 2012-247591 and 2013-24934, and the like.

The content thereof in the alkali-soluble resin composition is preferably 1 to 15% by mass, more preferably 2 to 12% by mass, and particularly preferably 3 to 10% by mass, based on the total solid content of the composition.

<(F) Organic Solvent>

It is preferred that the composition of the present invention (typically a coloring radiation-sensitive composition) contains (F) an organic solvent.

(F) Examples of the organic solvent include those exemplified below.

Examples of esters may include ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetates (for example, methyl oxyacetate, ethyl oxyacetate, and butyl oxyacetate (for example, methyl methoxyacetate, ethyl methoxyacetate, butyl methoxyacetate, methyl ethoxyacetate, ethyl ethoxyacetate, and the like)), alkyl 3-oxypropionate esters (for example, methyl 3-oxy propionate, ethyl 3-oxy propionate, and the like (for example, methyl 3-methoxy propionate, ethyl 3-methoxy propionate, methyl 3-ethoxy propionate, ethyl 3-ethoxy propionate, and the like)), alkyl 2-oxypropionate esters (for example: methyl 2-oxy propionate, ethyl 2-oxy propionate, propyl 2-oxy propionate, and the like (for example, methyl 2-methoxypropionate, ethyl 2-methoxy propionate, propyl 2-methoxypropionate, methyl 2-ethoxypropionate, and ethyl 2-ethoxy propionate)), methyl 2-oxy-2-methylpropionate and ethyl 2-oxy-2-methylpropionate (for example, methyl 2-methoxy-2-methylpropionate, ethyl 2-ethoxy-2-methylpropionate, and the like), methyl pyruvate, ethyl pyruvate, propyl pyruvate, methyl acetoacetate, ethyl acetoacetate, methyl 2-oxobutanoate, ethyl 2-oxobutanoate, and the like, examples of ethers may include diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, and the like, examples of ketones may include methyl ethyl ketone, cyclohexanone, 2-heptanone, 3-heptanone, and the like, and suitable examples of aromatic hydrocarbons may include toluene, xylene, and the like.

The organic solvents may be used either alone or in combination of two or more thereof.

When organic solvents are used in combination of two or more thereof, a mixed solution composed of two or more selected from the aforementioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate is particularly preferred.

The amount of the organic solvent included in the composition is preferably 10% by mass to 90% by mass, more preferably 20% by mass to 80% by mass, and still more preferably 25% by mass to 75% by mass, based on the total amount of the composition.

<Sensitizer>

The composition of the present invention (typically a coloring radiation-sensitive composition) may contain a sensitizer for the purpose of improving the generation efficiency of starting species of a polymerization initiator and shifting the photosensitive wavelength to a longer wavelength. Examples of the sensitizer may include the sensitizers which have an absorption wavelength in the wavelength region of 300 nm to 450 nm.

Examples of the sensitizer may include polynuclear aromatics such as phenanthrene, anthracene, pyrene, perylene, triphenylene, and 9,10-dialkoxyanthracene, xanthenes such as fluorescein, eosin, erythrosin, Rhodamine B, and Rose Bengal, thioxantones, cyanines, merocyanines, phthalocyanines, thiazines such as thionine, methylene blue, and toluidine blue, acridines, anthraquinones, squaryliums, coumarins, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives; aromatic ketone compounds such as acetophenone, benzophenone, and Michler's ketone, heterocyclic compounds such as N-aryloxazolidinone, and the like.

<Chain Transfer Agent>

It is preferred that a chain transfer agent is added to the composition of the present invention (typically a coloring radiation-sensitive composition) depending on a photopolymerization initiator used. Examples of the chain transfer agent may include N,N-dialkyl amino benzoic acid alkyl esters or thiol-based compounds, and as the thiol-based compounds, 2-mercapto benzothiazole, 2-mercapto-1-phenyl benzimidazole, 3-mercapto propionate, and the like may be used either alone or in combination of two or more thereof.

<Polymerization Inhibitor>

It is preferred that a small amount of a polymerization inhibitor is added to the composition of the present invention (typically a coloring radiation-sensitive composition) in order to suppress unnecessary thermal polymerization of a polymerizable compound during the preparation or storage of the coloring radiation-sensitive composition.

Examples of the polymerization inhibitor which may be used in the present invention may include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), a primary cerium salt of N-nitrosophenylhydroxyamine, and the like. Among them, p-methoxyphenol is preferred.

The amount of the polymerization inhibitor added is preferably about 0.01% by mass to about 5% by mass, based on a mass of the composition.

<Substrate Adhesion Agent>

Furthermore, in the present invention, a substrate adhesion agent which may improve the substrate adhesion may be added to the composition (typically a coloring radiation-sensitive composition).

It is preferred that as the substrate adhesion agent, a silane-based coupling agent, a titanate-based coupling agent, and an aluminum-based coupling agent are used. Examples of the silane-based coupling agent may include γ-methacryloxypropyltrimethoxysilane, γ-methacryloxypropyltriethoxysilane, γ-acryloxypropyltrimethoxysilane, γ-acryloxypropyltriethoxysilano, γ-mercaptopropyltrimethoxysilane, γ-aminopropyltriethoxysilane, phenyltrimethoxy silane, and the like. Among them, γ-methacryloxypropyltrimethoxysilane is preferred as the substrate adhesion agent.

From the viewpoint of preventing the residue from remaining in an unexposed portion when the composition is exposed and developed, the content of the substrate adhesion agent is preferably 0.1% by mass to 30% by mass, more preferably 0.5% by mass to 20% by mass, and particularly preferably 1% by mass to 10% by mass, based on a total solid content of the coloring radiation-sensitive composition of the present invention.

<Surfactant>

Various surfactants may be added to the composition of the present invention (typically a coloring radiation-sensitive composition) from the viewpoint of further improving the coatability. Various surfactants such as a fluorine-based surfactant, a non-ionic surfactant, a cationic surfactant, an anionic surfactant, and a silicone-based surfactant may be used as the surfactant.

In particular, by incorporating a fluorine-based surfactant into the composition, the liquid properties (in particular, fluidity) may be further improved when the composition is prepared as a coating solution, thereby further improving uniformity in coating thickness or the liquid-saving properties.

That is, when a film is formed by using a coating solution to which a composition containing a fluorine-based surfactant is applied, the interfacial tension between the surface to be coated and the coating solution is lowered, and as a result, wettability to the surface to be coated is improved, thereby leading to improvement in coatability onto the surface to be coated. For this reason, even when a thin film having a thickness of approximately several micrometers is formed with a small amount of the coating solution, the coating solution is effective in that a film having a little thickness unevenness and uniform thickness may be more suitably formed.

The content ratio of fluorine in the fluorine-based surfactant is suitably 3% by mass to 40% by mass, more preferably 5% by mass to 30% by mass, and particularly preferably 7% by mass to 25% by mass. The fluorine-based surfactant having the content ratio of fluorine within the above ranges is effective from the viewpoint of the uniformity in thickness of the coating film or the liquid-saving properties, and the solubility thereof in the composition is also good.

Examples of the fluorine-based surfactant may include Megafac F171, Megafac F172, Megafac F173, Megafac F176, Megafac F177, Megafac F141, Megafac F142, Megafac F143, Megafac F144, Megafac R30, Megafac F437, Megafac F475, Megafac F479, Megafac F482, Megafac F554, Megafac F780, and Megafac F781 (all manufactured by DIC Corporation), Fluorad FC430, Fluorad FC431, and Fluorad FC171 (all manufactured by Sumitomo 3M Ltd.), Surflon S-382, Surflon SC-101, Surflon SC-103, Surflon SC-104, Surflon SC-105, Surflon SC-1068, Surflon SC-381, Surflon SC-383, Surflon S393, and Surflon KH-40 (all manufactured by Asahi Glass Co., Ltd.), and the like.

Specific examples of the non-ionic surfactant may include glycerol, trimethylolpropane, trimethylolethane, and ethoxylates or propoxylates thereof (for example, glycerol propoxylate, glycerin ethoxylate, and the like), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters (Pluronic L10, L31, L61, L62, 10R5, 17R2, and 25R2, and Tetronic 304, 701, 704, 901, 904, and 150R1, which are manufactured by BASF Corporation, SOLSPERSE 20000 (manufactured by Lubrizol Japan Ltd.), and the like.

Specific examples of the cationic surfactant may include phthalocyanine derivatives (trade name: EFKA-745, manufactured by MORISHITA & CO., LTD.), organosiloxane polymer KP341 (manufactured by Shin-Etsu Chemical Co., Ltd.), (meth)acrylic (co)polymers Polyflow No. 75, No. 90, and No. 95 (manufactured by KYOEISHA CHEMICAL Co., Ltd.), W001 (manufactured by Yusho Co., Ltd.), and the like.

Specific examples of the anionic surfactant may include W004, W005, and W017 (manufactured by Yusho Co., Ltd.), and the like.

Examples of the silicone-based surfactant may include Toray silicone DC3PA, Toray silicone SH7PA, Toray silicone DC11PA, Toray silicone SH21PA, Toray silicone SH28PA, Toray silicone SH29PA, Toray silicone SH30PA, and Toray silicone SH8400 (all manufactured by Dow Corning Toray Silicone Co., Ltd.), TSF-4440, TSF-4300, TSF-4445, TSF-4460, and TSF-4452 (all manufactured by Momentive Performance Materials Inc.), KP341, KF6001, and KF6002 (all manufactured by Shin-Etsu Silicone Co., Ltd.), BYK307, BYK323, and BYK330 (all manufactured by BYK Chemie GmbH), and the like.

The surfactants may be used either alone or in combination of two or more thereof. The amount of the surfactant added is preferably 0.001% by mass to 2.0% by mass, and more preferably 0.005% by mass to 1.0% by mass, based on a total mass of the composition.

<Other Components>

The composition of the present invention (typically a coloring radiation-sensitive composition) may contain, if necessary, various additives, such as a chain transfer agent such as N,N-dialkyl amino benzoic acid alkyl ester or 2-mercapto benzothiazole, a thermal polymerization initiator such as an azo-based compound or a peroxide-based compound, a thermal polymerization component, a polyfunctional thiol or an epoxy compound for the purpose of enhancing strength and sensitivity of a film, a UV absorber such as alkoxy benzophenone, a plasticizer such as dioctyl phthalate, an agent for improving developability such as a low-molecular weight organic carboxylic acid, other fillers, a polymer compound other than the aforementioned specific binder and alkali-soluble resin, an anti-oxidant, and an anti-aggregation agent.

Further, in order to enhance the degree of cure of a film by post-heating after development, a thermal curing agent may be added. Examples of the thermal curing agent may include a thermal polymerization initiator such as an azo compound or peroxide; a Novolac resin, a resol resin, an epoxy compound, a styrene compound, and the like.

[Preparation of Coloring Radiation-Sensitive Composition]

For the coloring radiation-sensitive composition in the present invention, the coloring radiation-sensitive composition may be prepared by being mixed and stirred together with respective components such as the colorant (in case where a colorant is a pigment, a pigment dispersion is preferably prepared in advance and used), the photopolymerization initiator, the polymerizable compound, and optionally the UV absorber, the alkali-soluble resin, and the surfactant, and if necessary, carrying out the filtration as described below.

It is preferred that the coloring radiation-sensitive composition in the present invention is filtered with a filter for the purpose of removing impurities or reducing defects, and the like. Any filter may be used without particular limitation, as long as the filter is used in the related art for filtering purpose, and the like. Examples of the filter may include a filter made of a fluorine resin such as PTFE (polytetrafluoroethylene), a polyamide-based resin such as Nylon-6 or Nylon-6,6, and a polyolefin resin such as polyethylene or polypropylene (including high density and ultrahigh molecular weight resins), and the like. Among these materials, polypropylene (including high density polypropylene) is preferred.

The pore size of the filter is suitably 0.01 to about 7.0 µm, preferably 0.01 to 2.5 µm, and still more preferably 0.01 to 2.0 µm. By adjusting the pore size within the above ranges, it is possible to securely remove fine impurities which inhibit the preparation of uniform and smooth coloring radiation-sensitive composition in a subsequent step.

When the filter is used, a combination of different filters may be used. In such a case, filtering in a first filter may be carried out either once or two or more times.

In addition, a plurality of first filters having different pore diameters within the above-described ranges may be used in combination. As used herein, the pore diameter may be determined with reference to the nominal value provided by the manufacturer of a filter. A commercially available filter may be selected from various filters provided by, for example, Nihon Pall Ltd., Advantec Toyo Kaisha, Ltd., Entegris Japan Inc. (formerly, Microlith Japan, Inc.), or Kitz Micro Filter Corporation, and the like.

As a second filter, those formed of the same material as the above-described first filter and the like may be used.

For example, filtering in the first filter is performed with only a dispersion liquid, other components are mixed with the filtered dispersion liquid, and then a second filtering may be carried out.

[Manufacture of Infrared Transmission Filter Using Coloring Radiation-Sensitive Composition]

Subsequently, the infrared transmission filter of the present invention and the method for manufacturing the same will be described.

The infrared transmission filter of the present invention has, on a substrate, a colored region (colored pattern) (preferably a black region (black pattern)) formed by using the above-described composition (preferably, the coloring radiation-sensitive composition).

Hereinafter, the infrared transmission filter of the present invention will be described in detail through the manufacturing method thereof (that is, method for manufacturing the infrared transmission filter of the present invention).

A method for forming a colored pixel constituting the infrared transmission filter according to the present invention may adopt a method for forming the colored pixel by preparing the aforementioned coloring radiation-sensitive composition, and then performing a photolithography method, or a method for forming the colored pixel by preparing the aforementioned coloring radiation-sensitive composition, and then performing an inkjet method, and the like.

Among them, the method for forming the colored pixel by preparing the aforementioned coloring radiation-sensitive composition and then performing a photolithography method is a preferred aspect because fine patterns may be easily formed into an arbitrary shape.

Hereinafter, the method for manufacturing an infrared transmission filter for a solid-state imaging device will be described by a method for forming each colored pixel by preparing a coloring radiation-sensitive composition, and then performing a photolithography method, but the infrared transmission filter of the present invention is not limited thereto.

The method for manufacturing an infrared transmission filter according to the present invention includes a step of forming an infrared transmission composition layer (a colored layer) by imparting the above-described coloring radiation-sensitive composition onto a substrate (a colored layer forming step), a step of pattern-wise exposing the infrared transmission composition layer (an exposure step), and a step of forming a pattern by developing the infrared transmission composition layer after the exposure (a development step).

<Colored Layer Forming Step>

In the colored layer forming step, a coloring radiation-sensitive composition is applied onto a substrate body, thereby forming a colored layer (an infrared transmission composition layer) formed of the coloring radiation-sensitive composition.

Examples of the substrate which may be used for this step may include photoelectric conversion device substrates, silicon substrates and the like in CCD, CMOS, and organic CMOS, which are used for a solid-state imaging device, and alkali-free glass, soda glass, PYREX (registered trademark), glass, and quartz glass, and those to which a transparent electroconductive film has been attached, which are used for a liquid crystal display device, and the like. A black matrix which separates each pixel may be formed on these substrates in some cases.

Further, if necessary, an undercoat layer may be formed on these substrates, for the purpose of improving the adhesion with upper layers, preventing materials from being diffused, or flattening the substrate surface.

As a method for applying the coloring radiation-sensitive composition of the present invention on the substrate, it is possible to apply various application methods such as slit coating, an inkjet method, spin coating, flow casting, roll coating, and a screen printing method.

Drying (prebaking) of the colored layer (the infrared transmission composition layer) applied on the substrate may be performed at a temperature of 50° C. to 140° C. for 10 sec to 300 sec using a hot plate, an oven, and the like.

The film thickness of the colored layer after drying (after prebaking) is in a range of 0.55 µm to 1.8 µm, preferably 0.60 µm or more and less than 1.8 µm, more preferably 0.70 µm to 1.6 µm, and particularly preferably 0.80 µm to 1.4 µm.

<Exposure Step>

In the exposure step, the colored layer (the infrared transmission composition layer) formed in the colored layer forming step is pattern-wise exposed.

In the exposure in the present step, it is preferred that the colored layer is exposed through a predetermined mask pattern, and is exposed by curing only a portion of the colored layer, which is light-irradiated. As the radiation which may be used during the exposure, in particular, radiation such as g-line, h-line, or i-line, is preferably used, and i-line is particularly preferred. The irradiation dose is preferably 30 mJ/cm$^2$ to 1,500 mJ/cm$^2$, more preferably 50 mJ/cm$^2$ to 1,000 mJ/cm$^2$, and most preferably 80 mJ/cm$^2$ to 500 mJ/cm$^2$.

<Development Step>

Subsequent to the exposure step, the alkali development treatment (the development step) is performed, thereby eluting a developer into an uncured portion after the exposure, and allowing the photocured portion to be left. By the development step, a pattern-type coating film composed of colored pixels may be formed.

The development system may be any of a dip system, a shower system, a spray system, or a paddle system, and a swing system, a spin system, an ultrasonic system, and the like may be combined with these systems.

Unevenness of development may also be prevented by dipping a surface to be developed in advance in water and the like before the surface is brought into contact with the developer.

As the developer, an organic alkaline developer, which does not damage an underlying circuit, is preferred. The development temperature is usually 20° C. to 30° C., and the development time is 20 sec to 90 sec.

Examples of the alkaline agent included in the developer may include organic alkaline compounds such as aqueous ammonia, ethylamine, diethylamine, dimethylethanolamine, tetramethylammonium hydroxide, tetraethylammonium hydroxide, tetrabutylammonium hydroxide, benzyltrimethylammonium hydroxide, choline, pyrrole, piperidine, and 1,8-diazabicyclo-[5.4.0]-7-undecene, inorganic compounds such as sodium hydroxide, potassium hydroxide, sodium hydrogen carbonate, and potassium hydrogen carbonate, and the like.

As the developer, an aqueous alkaline solution, in which these alkaline agents are diluted with pure water to a concentration of 0.001% by mass to 10% by mass, and preferably 0.01% by mass to 1% by mass, is preferably used. Meanwhile, when the developer composed of the aqueous alkaline solution is used, generally, development is performed, and then, cleaning (rinsing) with pure water is performed to clean and remove an excess developer, followed by drying.

Meanwhile, after the colored layer forming step, the exposure step, and the development step, which are described above, are carried out, the manufacturing method of the present invention may include a curing step of curing the formed colored pattern by post-heating (post-baking) or post-exposure, if necessary. The post-baking is a heat treatment performed after development for the purpose of completing the curing, and the heat curing treatment is performed usually at 100° C. to 270° C.

When light is used, the curing step may be performed by g-line, h-line, i-line, an excimer laser such as KrF or ArF, electronic beam, X-ray, or the like, but the curing step is preferably performed at a low temperature such as 20° C. to 50° C. using the existing high pressure mercury lamp, and the irradiation time is 10 sec to 180 see, and preferably 30 sec to 60 sec. When post exposure and post heating are carried out in combination, it is preferred that post exposure is first performed.

An infrared transmission filter is manufactured by performing the colored layer forming step, the exposure step, and the development step (also, the curing step, if necessary), which have been described above.

Meanwhile, the infrared transmission filter may be configured with only a colored pixel exhibiting the specific spectral characteristics according to the present invention, and a color filter having the aforementioned colored pixel exhibiting the spectral characteristics and a colored pixel such as red, green, blue, magenta, yellow, cyan, black or colorless may be configured. When the color filter is configured with a combination of the colored pixel having the specific spectral characteristics and a pixel of another color, the colored pixel having the specific spectral characteristics according to the present invention may be formed before or after the formation of the pixel of another color.

The coloring radiation-sensitive composition according to the present invention may be easily cleaned and removed using a publicly known cleaning liquid, even when the coloring radiation-sensitive composition adheres to a nozzle of a discharge part of an application device, a piping portion of the application device, inside of the application device, and the like. In this case, in order to perform cleaning and removing more efficiently, the above-described organic solvent as an organic solvent included in the coloring radiation-sensitive composition is preferably used as a cleaning liquid.

In addition, it is also possible to suitably use the cleaning liquids, which are described in Japanese Patent Application Laid-Open Nos. H7-128867, H7-146562, H8-278637, 2000-273370, 2006-85140, 2006-291191, 2007-2101, 2007-2102, and 2007-281523, and the like, as the cleaning liquid for cleaning and removing the coloring radiation-sensitive composition of the present invention.

As the cleaning liquid, an alkylene glycol monoalkyl ether carboxylate or an alkylene glycol monoalkyl ether is preferably used.

These organic solvents which may be used as a cleaning liquid may be used either alone or in combination of two or more thereof.

When two or more organic solvents are mixed, a mixed solvent obtained by mixing an organic solvent which has a hydroxyl group and an organic solvent which does not have a hydroxyl group is preferred. The mass ratio of the organic solvent which has a hydroxyl group and the organic solvent which does not have a hydroxyl group is 1/99 to 99/1, preferably 10/90 to 90/10, and more preferably 20/80 to 80/20. The mixed solvent is a mixed solvent of propylene glycol monomethyl ether acetate (PGMEA) and propylene glycol mono methyl ether (PGME), and is particularly preferred a mixed solvent with a mixing ratio of PGMEA/PGME of 60/40.

Meanwhile, in order to improve the permeability of the cleaning liquid into the coloring radiation-sensitive composition, as a surfactant which the coloring radiation-sensitive composition may contain, the surfactant previously mentioned may be added to the cleaning liquid.

Further, the infrared transmission filter of the present invention which is manufactured by the method for manufacturing the infrared transmission filter according to the present invention is suitably loaded into a solid-state imaging device, such as a CCD sensor, a CMOS sensor, an organic CMOS sensor, and a CIGS image sensor. In particular, the infrared transmission filter of the present invention is suitably loaded into the solid-state imaging device, such as a CCD sensor, a CMOS sensor, or an organic CMOS sensor with high resolution exceeding 1,000,000 pixels. The infrared transmission filter of the present invention may be disposed, for example, between a light-receiving portion of each pixel for constituting a CCD device and a microlens for condensing light.

[Infrared Sensor]

An infrared sensor of the present invention includes the infrared transmission filter of the present invention. The configuration of the infrared sensor of the present is not particularly limited as long as the infrared sensor includes an infrared transmission filter, and functions as a sold-state imaging device, but examples thereof are as follows.

The configuration is a configuration in which a plurality of photodiodes and transfer electrodes formed of polysilicon or the like, which form light-receiving regions of a (solid-state imaging device (such as a CCD sensor, a CMOS sensor, or an organic CMOS sensor), are provided on a substrate, a light-shielding film, of which only light-receiving portions of photodiodes is opened and which is formed of tungsten or the like, is formed on the photodiodes and the transfer electrodes, a device protection film formed of silicon nitride or the like and formed to cover the entire surface of the light-shielding film and the light-receiving portions of photodiodes is provided on the light-shielding film, and the infrared transmission filter of the present invention is provided on the device protection film.

Furthermore, the configuration may be a configuration in which a light-condensing means (for example, a micro lens or the like, and hereinafter, the same also applies) is provided on the device protection film and under the infrared transmission filter (the side close to the substrate), or a configuration in which the light-condensing means is provided on the infrared transmission filter, and the like.

Meanwhile, the organic CMOS sensor has a two-layered hybrid structure including a thin-film panchromatic photosensitive organic photoelectric conversion film, as a photoelectric conversion layer and a CMOS signal read-out substrate, in which an organic material serves to trap light and convert the trapped light into an electric signal, and an inorganic material serves to output the electric signal to the outside, and in principle, an aperture ratio may be set to 100% with respect to incident light Since the organic photoelectric conversion film may be overlaid on the CMOS signal read-out substrate as a structure-free continuous film, an expensive fine processing process is not required, so that the organic photoelectric conversion film is suitable for micronizing the pixels.

EXAMPLES

Hereinafter, the present invention will be described more specifically with reference to Examples, but the present invention is not limited to the following Examples as long as the scope does not exceed the main point of the present invention. Meanwhile, "part(s)" and "%" are based on mass unless indicated otherwise.

[Dispersion Resin 1]

As Dispersion Resin 1, Alkali-Soluble Resin-3 described in paragraph nos. [0172] and [0173] of Japanese Patent Application Laid-Open No. 2009-69822 was used.

[Dispersion Resin 2]

As Dispersion Resin 2, a compound (the ratio in the repeating unit is a molar ratio) shown below was used.

[Chem. 55]

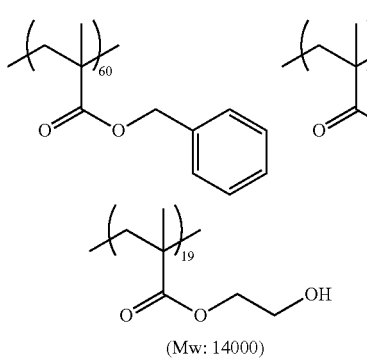

(Mw: 14000)

[Dispersion Resin 3]

As Dispersion Resin 3, a compound (the ratio in the repeating unit is a molar ratio, and the numerical value written after the repeating moiety of the side chain indicates a repeating number of the repeating moiety) shown below was used.

[Chem. 56]

Dispersion Resin 3

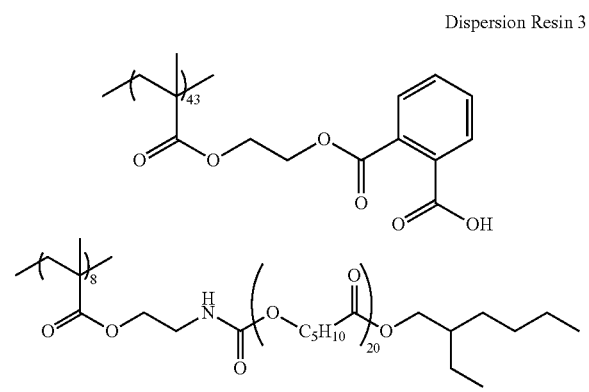

-continued

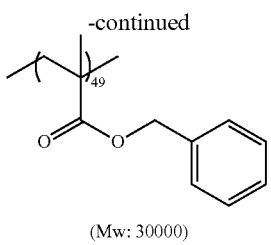

(Mw: 30000)

[Dispersion Resin 4]

As Dispersion Resin 4, a compound (the ratio in the repeating unit is a molar ratio, and the numerical value written after the repeating moiety of the side chain indicates a repeating number of the repeating moiety) shown below was used.

[Chem. 57]

Dispersion Resin 4

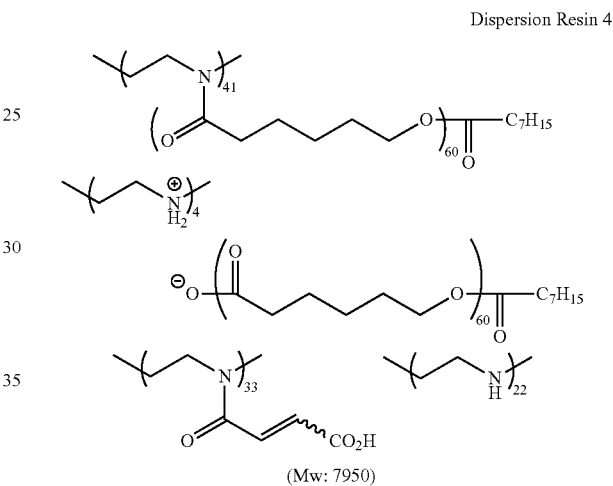

(Mw: 7950)

[Dispersing Agent 1]

As Dispersing Agent 1, Dispersing Agent-1 described in paragraph no. [0175] of Japanese Patent Application Laid-Open No. 2009-69822 was used.

[Preparation of Pigment Dispersion Liquid B-1]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-1.

| | |
|---|---|
| Mixed pigment composed of Red Pigment (C.I. Pigment Red 254) and Yellow Pigment (C.I. Pigment Yellow 139) | 11.8 parts |
| Dispersing agent: BYK-111 manufactured by BYK Chemie GmbH | 9.1 parts |
| Organic solvent: Propylene glycol methyl ether acetate | 79.1 parts |

[Preparation of Pigment Dispersion Liquid B-2]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-2.

| | |
|---|---|
| Mixed pigment composed of Blue Pigment (C.I. Pigment Blue 15:6) and Violet Pigment (C.I. Pigment Violet 23) | 12.6 parts |
| Dispersing agent: BYK-111 manufactured by BYK Chemie GmbH | 2.0 parts |
| Dispersion Resin 2 | 3.3 parts |
| Organic solvent: Cyclohexanone | 31.2 parts |
| Organic solvent: Propylene glycol methyl ether acetate (PGMEA) | 50.9 parts |

[Preparation of Pigment Dispersion Liquid B-3]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-3.

| | |
|---|---|
| Mixed pigment composed of Red Pigment (C.I. Pigment Red 254), Yellow Pigment (C.I. Pigment Yellow 150), Blue Pigment (C.I. Pigment Blue 15:6), Violet Pigment (C.I. Pigment Violet 23), and Green Pigment (C.I. Pigment Green 36) | 13.5 parts |
| Dispersing Agent 1 | 2.2 parts |
| Dispersion aid: S12000 manufactured by Lubrizol, Inc. | 0.5 parts |
| Dispersion Resin 1 | 3.8 parts |
| Organic solvent: PGMEA | 80.0 parts |

[Preparation of Pigment Dispersion Liquid B-4]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-4.

| | |
|---|---|
| Mixed pigment composed of Red Pigment (C.I. Pigment Red 254), Yellow Pigment (C.I. Pigment Yellow 150), Blue Pigment (C.I Pigment Blue 15:6), Violet Pigment (C.I. Pigment Violet 23), and Green Pigment (C.I Pigment Green 36) | 12.1 parts |
| Dispersing agent: BYK-161 manufactured by BYK Chemie GmbH | 6.7 parts |
| Dispersion aid: S12000 manufactured by Lubrizol, Inc. | 0.7 parts |
| Organic solvent: PGMEA | 80.5 parts |

[Preparation of Pigment Dispersion Liquid B-5]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-5.

| | |
|---|---|
| Black pigment (Carbon black; C.I. Pigment Black 7) | 16.3 parts |
| Dispersing agent: BYK-161 manufactured by BYK Chemie GmbH | 2.9 parts |
| Dispersion aid: S12000 manufactured by Lubrizol, Inc. | 0.8 parts |
| Organic solvent: PGMEA | 80.0 parts |

[Preparation of Pigment Dispersion Liquid B-6]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-6.

| | |
|---|---|
| Mixed pigment composed of Red Pigment (C.I. Pigment Red 254), Yeilow Pigment (C.I. Pigment Yellow 139), Bine Pigment (C.I. Pigment Blue 15:6), and Violet Pigment (C.I. Pigment Violet 23) | 20.0 parts |
| Dispersing agent 1 | 3.4 parts |
| Dispersion Resin 1 | 6.4 parts |
| Organic solvent: PGMEA | 70.2 parts |

[Preparation of Pigment Dispersion Liquid B-7]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-7.

| | |
|---|---|
| Blue Pigment (C.I. Pigment Blue 15:6) | 10.6 parts |
| Dispersing agent: Dispersion Resin 3 | 3.2 parts |
| Organic solvent: PGMEA | 86.2 parts |

[Preparation of Pigment Dispersion Liquid B-8]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-8.

| | |
|---|---|
| Red Pigment (C.I. Pigment Red 254) | 13.1 parts |
| Dispersing agent: Dispersion Resin 4 | 3.9 parts |
| Organic solvent: PGMEA | 83.0 parts |

[Preparation of Pigment Dispersion Liquid B-9]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-9.

| | |
|---|---|
| Yellow Pigment (C.I. Pigment Yellow 139) | 15.0 parts |
| Dispersing agent: BYK-111 manufactured by BYK Chemie GmbH | 2.3 parts |
| The following Alkali-Soluble Resin 1 | 3.0 parts |
| Organic solvent: PGMEA | 79.7 parts |

[Preparation of Pigment Dispersion Liquid B-10]

A mixed solution having the following composition was mixed and dispersed for 3 hours using a bead mill (a high pressure disperser equipped with a pressure-reducing system NANO-3000-10 (manufactured by Nippon BEE Chemical Co., Ltd.)) using zirconia beads having a diameter of 0.3 mm, thereby preparing pigment dispersion liquid B-10.

| | |
|---|---|
| Violet Pigment (C.I. Pigment Violet 23) | 15.0 parts |
| Dispersing agent: BYK-111 manufactured by BYK Chemie GmbH | 1.5 parts |
| The following Alkali-Soluble Resin 1 | 3.8 parts |
| Organic solvent: PGMEA | 79.7 parts |

Example 1

[Preparation of Coloring Radiation-Sensitive Composition]

The following components were mixed, thereby preparing a coloring radiation-sensitive composition of Example 1.

| | |
|---|---|
| Pigment Dispersion Liquid B-1 (see the following Table 1 for the mass ratio of each pigment) | 46.5 parts |
| Pigment Dispersion Liquid B-2 (see the following Table 1 for the mass ratio of each pigment) | 37.1 parts |
| The following Alkali-Soluble Resin 1 | 1.1 parts |
| The following Polymerizable Compound 1 | 1.8 parts |
| The following Polymerizable Compound 2 | 0.6 parts |
| Polymerization initiator: the following Polymerization Initiator 1 | 0.9 parts |
| Surfactant 1: PGMEA solution of 1.00% by mass of Megafae F-781 F manufactured by DIC Corporation | 4.2 parts |
| Polymerization initiator: p-methoxyphenol | 0.001 parts |
| Organic solvent 1: PGMEA | 7.8 parts |

[Chem. 58]

Alkali-Soluble Resin 1

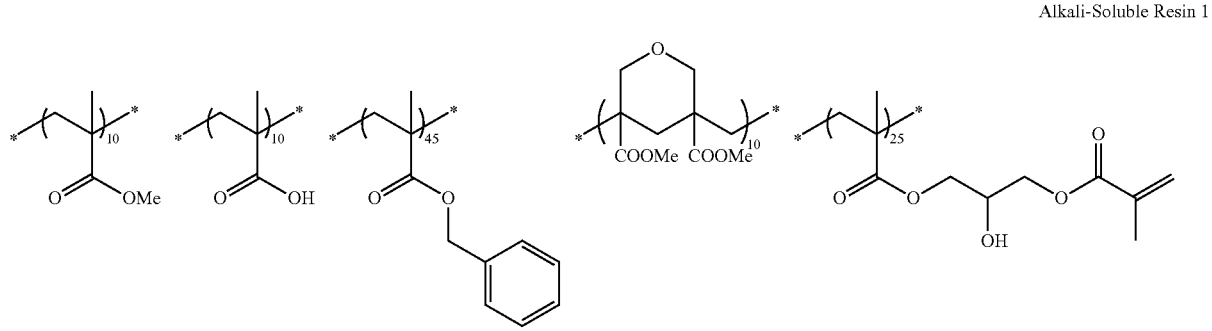

(the ratio in the repeating unit is a molar ratio) Mw: 11,000

[Chem. 59]

Polymerizable Compound 1

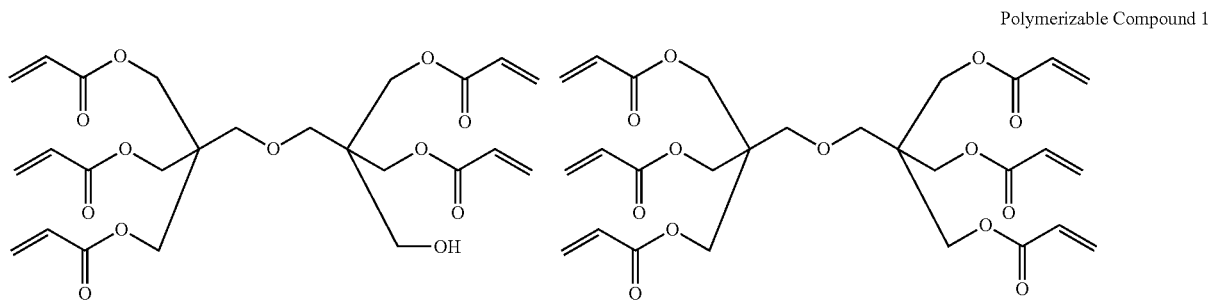

(A mixture of the left compound and the right compound with a molar ratio of 7:3)

[Chem. 60]

Polymerizable Compound 2

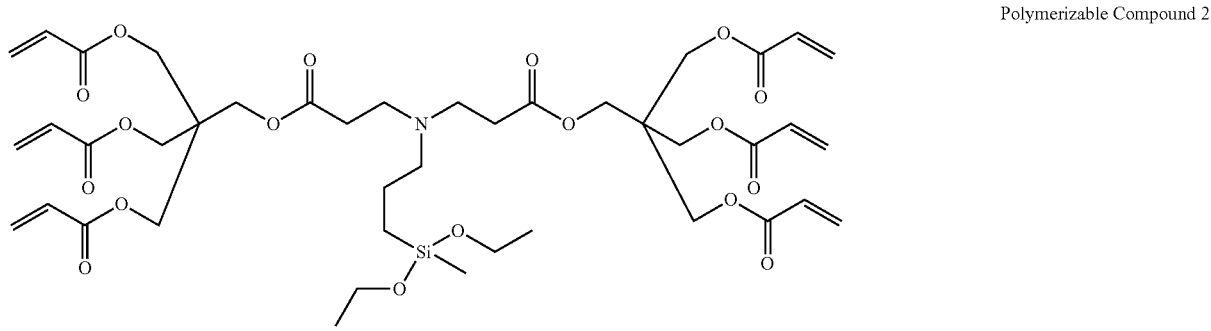

[Chem. 61]

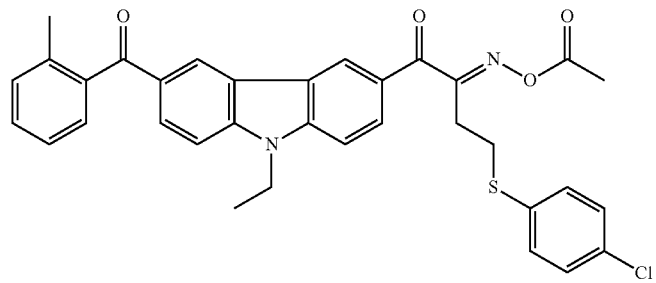

Polymerization Initiator 1

TABLE 1

|  | Red pigment ratio | Yellow pigment ratio | Blue pigment ratio | Violet pigment ratio | Green pigment ratio | Black pigment ratio | Sum |
|---|---|---|---|---|---|---|---|
| Example 1 | 0.37 | 0.17 | 0.36 | 0.10 | | | 1.00 |
| Example 2 | 0.37 | 0.17 | 0.36 | 0.10 | | | 1.00 |
| Example 3 | 0.41 | 0.19 | 0.32 | 0.08 | | | 1.00 |
| Example 4 | 0.28 | 0.12 | 0.48 | 0.12 | | | 1.00 |
| Example 5 | 0.45 | 0.20 | 0.28 | 0.07 | | | 1.00 |
| Example 6 | 0.24 | 0.11 | 0.52 | 0.13 | | | 1.00 |
| Example 7 | 0.37 | 0.17 | 0.36 | 0.10 | | | 1.00 |
| Example 8 | 0.37 | 0.17 | 0.36 | 0.10 | | | 1.00 |
| Example 9 | 0.37 | 0.17 | 0.36 | 0.10 | | | 1.00 |
| Example 10 | 0.40 | 0.17 | 0.34 | 0.09 | | | 1.00 |
| Comparative Example 1 | 0.32 | 0.18 | 0.25 | 0.07 | 0.18 | | 1.00 |
| Comparative Example 2 | 0.36 | 0.20 | 0.17 | 0.08 | 0.20 | | 1.00 |
| Comparative Example 3 | 0.32 | 0.18 | 0.25 | 0.07 | 0.18 | | 1.00 |
| Comparative Example 4 | 0.18 | 0.24 | 0.48 | 0.06 | | 0.04 | 1.00 |

Ratio of Pigments: ratio of respective pigments present in the entire pigments (in terms of mass)

Examples 2 to 10 and Comparative Examples 1 to 4

The respective coloring radiation-sensitive compositions of Examples 2 to 10 and Comparative Examples 1 to 4 were prepared by modifying the pigment dispersion liquid, the alkali-soluble resin, the polymerizable compound, the photopolymerization initiator, the surfactant, and the organic solvent in the preparation of the coloring radiation-sensitive composition of Example 1 into those shown in the following Table 2 and the amounts (parts by mass) (see Table 1 for the mass ratio of the respective pigments in the pigment dispersion liquid, and in Table 2, no numerical value means that the pigment is not used).

Among the materials used in the Examples and the Comparative Examples, those which are not described above will be described below.

[Chem. 62]

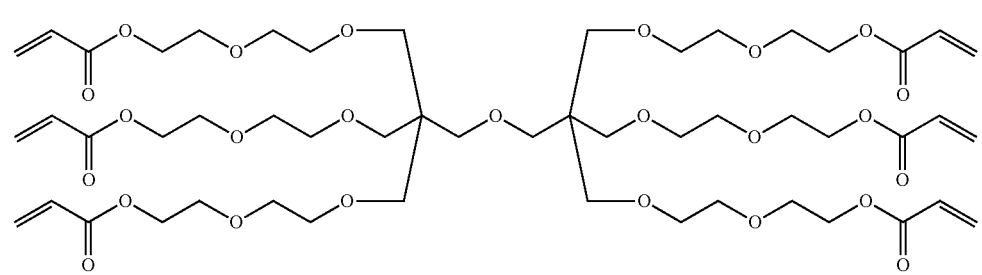

Polymerizable Compound 3

Polymerizable Compound 4: U-6LPA (urethane acrylate) manufactured by Shin-Nakamura Chemical Co., Ltd.

Polymerizable Compound 5: PM-21 (2-(meth)acryloyloxy methyl caproate acid phosphate) manufactured by Nippon Kayaku Co., Ltd.

[Chem. 63]

Polymerizable Compound 6

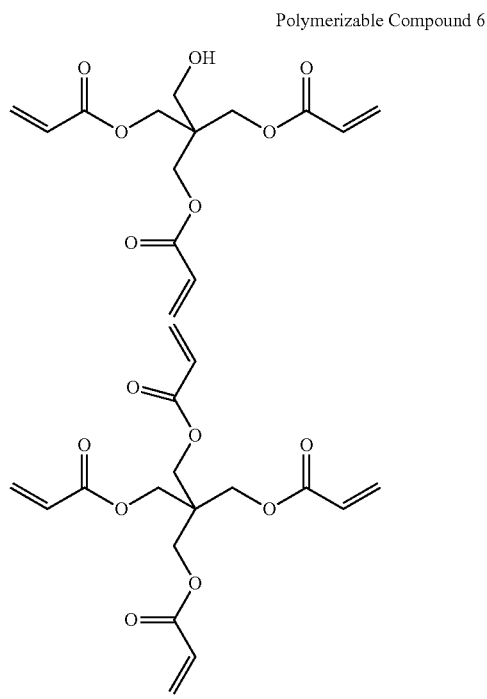

(The molar ratio of the left compound and the right compound = 6:4)

[Chem. 64]

Photopolymerization Initiator 2

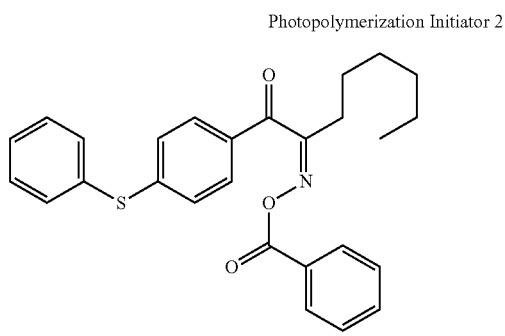

Photopolymerization Initiator 3: IRGACURE379 manufactured by BASF Corporation

Polymerization initiator 4: Photopolymerization Initiator-1 (oxime-based initiator) described in paragraph no. [0177] of Japanese Patent Application Laid-Open No. 2009-69822

Organic solvent 2: 3-methoxybutyl acetate

Alkali-Soluble Resin 2: Dispersion Resin 2

Alkali-Soluble Resin 3: Alkali-Soluble Resin-1 (epoxy acrylate resin) described in paragraph no. [0170] of Japanese Patent Application Laid-Open No. 2009-69822

Spectral characteristics were evaluated by using each coloring radiation-sensitive composition obtained. The results are summarized and shown in Table 2.

[Spectral Characteristics]

Each of the coloring radiation-sensitive compositions was spin-coated on a glass substrate and applied so as to have a film thickness of 1.0 μm after post-baking, the substrate was dried on a hot plate at 100° C. for 120 seconds, and after the drying, a heat treatment (post-baking) was performed for 300 seconds by using a hot plate at 200° C.

The light transmittance of the substrate having a colored layer was determined at a wavelength in a range of 300 nm to 1,300 nm using a spectrophotometer (ref. a glass substrate) of an ultraviolet-visible-near-infrared spectrophotometer U-4100 (manufactured by Hitachi High-Technologies Corporation).

[Manufacture of Infrared Transmission Filter]

Each of the coloring radiation-sensitive compositions of Examples 1 to 10 and Comparative Examples 1 to 4 was applied on a silicon wafer using a spin coater so as to have a film thickness of 1.0 m after drying, and a heat treatment (prebaking) was performed for 120 seconds by using a hot plate at 100° C.

Subsequently, exposure was performed at a step of 50 mJ/cm$^2$ until 50 to 750 mJ/cm$^2$ by using an i-line stepper exposure device FPA-3000i5+ (manufactured by Canon Inc.), and using a photomask in which a square pixel pattern with an angle of 1.4 μm was formed, thereby determining an optimal exposure amount, which resolutes the square pixel pattern, to perform exposure with the optimal exposure amount.

Thereafter, the silicon wafer formed with the exposed coating film was placed on a horizontal rotary table of a spin shower development machine (model DW-30, manufactured by Chemitronics Co., Ltd.) and subjected to paddle development at 23° C. for 60 seconds using CD-2060 (manufactured by FUJIFILM Electronics Materials Co., Ltd), thereby forming colored patterns on the silicon wafer.

The silicon wafer formed with the colored patterns was rinsed with pure water, and then spray-dried.

Furthermore, a heat treatment (post-baking) was performed by using a hot plate at 200° C. for 300 seconds, thereby obtaining a silicon wafer having colored patterns as an infrared transmission filter of each of Examples 1 to 10 and Comparative Examples 1 to 4.

<Evaluation>

(Visible Light Noise Performance)

A ratio (t1/t2=x) of an average light transmittance t1 [%] in a visible light region at wavelength of 400 nm to 700 nm to an average light transmittance t2 [%] in a visible light region at a wavelength of 825 nm to 1,300 nm, in a thickness direction of the infrared transmission filter obtained as described above, was obtained using a spectrophotometer (ref. a glass substrate) of an ultraviolet-visible-near-infrared spectrophotometer U-4100 (manufactured by Hitachi High-Technologies Corporation), and was evaluated based on the following evaluation criteria. A higher evaluation point exhibits a less noise derived from visible light components, and excellent performance.

<Evaluation Criteria>

5: $x \leq 0.06$
4: $0.06 < x \leq 0.065$
3: $0.065 < x \leq 0.07$
2: $0.07 < x \leq 0.08$
1: $0.08 < x$ (PCD Dependence)

In [Manufacture of Infrared Transmission Filter], the absolute value ($\Delta w = |w2-w1|$) of difference between a pattern size w1 (one side of the square pixel pattern) when the coloring radiation-sensitive composition was applied, and immediately, exposure was performed and a pattern size w2 (one side of the square pixel pattern) when exposure was performed 72 hours after the application, was measured and evaluated based on the following evaluation criteria. A higher evaluation point exhibits less dependence on PCD, and excellent performance.

<Evaluation Criteria>

5: $\Delta w < 0.01$
4: $0.01 \leq \Delta w < 0.03$
3: $0.03 \leq \Delta w < 0.05$
2: $0.05 \leq \Delta w < 0.10$
1: $0.10 \leq \Delta w$

TABLE 2

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Composition of composition | Pigment dispersion liquid B-1 | 46.5 | 47.5 | 52.4 | 35.6 | 56.4 | 31 | 47.5 | 47.5 | 47.5 | |
|  | Pigment dispersion liquid B-2 | 37.1 | 37.9 | 33 | 49.8 | 29 | 54.4 | 37.9 | 37.9 | 37.9 | |
|  | Pigment dispersion liquid B-3 | | | | | | | | | | |
|  | Pigment dispersion liquid B-4 | | | | | | | | | | |
|  | Pigment dispersion liquid B-5 | | | | | | | | | | |
|  | Pigment dispersion liquid B-6 | | | | | | | | | | |
|  | Pigment dispersion liquid B-7 | | | | | | | | | | 33.6 |
|  | Pigment dispersion liquid B-8 | | | | | | | | | | 37.4 |
|  | Pigment dispersion liquid B-9 | | | | | | | | | | 13 |
|  | Pigment dispersion liquid B-10 | | | | | | | | | | 6.7 |
|  | Alkali-soluble resin 1*1 | 1.1 | 0.5 | 0.5 | 0.5 | 0.5 | 0.5 | 0.5 | | | 0.5 |
|  | Alkali-soluble resin 2*1 | | | | | | | | 0.5 | | |
|  | Alkali-soluble resin 3*1 | | | | | | | | | 0.5 | |
|  | Polymerizable compound 1*1 | 1.8 | 0.6 | 0.6 | 0.6 | 0.6 | 0.6 | 0.6 | 0.6 | 0.6 | |
|  | Polymerizable compound 2*1 | 0.6 | 0.5 | 0.5 | 0.5 | 0.5 | 0.5 | 0.5 | 0.5 | 0.5 | |
|  | Polymerizable compound 3*1 | | 1.4 | 1.4 | 1.4 | 1.4 | 1.4 | 1.4 | 1.4 | 1.4 | |
|  | Polymerizable compound 6*1 | | | | | | | | | | 1.2 |
|  | Photopolymerizable initiator 1 | 0.9 | | | | | | | | | |
|  | Photopolymerizable initiator 2 | | 1 | 1 | 1 | 1 | 1 | 1 | 1 | 1 | 1.1 |
|  | Photopolymerizable initiator 3 | | | | | | | | | | |
|  | Photopolymerizable initiator 4 | | | | | | | | | | |
|  | Surfactant 1*2 | 4.2 | 4.2 | 4.2 | 4.2 | 4.2 | 4.2 | 4.2 | 4.2 | 4.2 | 4.2 |
|  | Polymerizable compound 4 | | | | | | | | | | |
|  | Polymerizable compound 5 | | | | | | | | | | |
|  | Organic solvent 1 | 7.8 | 6.4 | 6.4 | 6.4 | 6.4 | 6.4 | 6.4 | 6.4 | 6.4 | 2.3 |
|  | Organic solvent 2 | | | | | | | | | | |
| Characteristics | Maximum transmittance of visible region (400 to 750 nm) | 13 | 13 | 15 | 18 | 19 | 20 | 13 | 13 | 13 | 7 |
|  | Minimum transmittance of near-IR region (900 to 1,300 nm) | 98 | 98 | 98 | 98 | 97 | 99 | 98 | 98 | 98 | 92 |
|  | Transmittance at 800 nm | 56 | 56 | 61 | 47 | 64 | 44 | 59 | 59 | 59 | 54 |
| Evaluation | Average transmittance of visible region t1 (400 to 700 nm) | 5.7 | 5.7 | 6.1 | 6.1 | 6.9 | 6.8 | 5.7 | 5.7 | 5.7 | 2.3 |
|  | Average transmittance of near-IR region t2 (825 to 1,300 nm) | 99.0 | 99.0 | 98.9 | 99.2 | 98.8 | 99.3 | 99.0 | 99.0 | 99.0 | 96.0 |
|  | t1/t2 | 0.057 | 0.057 | 0.062 | 0.061 | 0.069 | 0.068 | 0.058 | 0.058 | 0.058 | 0.024 |
|  | ΔW | 0.0078 | 0.0078 | 0.0078 | 0.0078 | 0.0078 | 0.0078 | 0.018 | 0.024 | 0.033 | 0.0078 |
|  | Visible light noise performance | 5 | 5 | 4 | 4 | 3 | 3 | 5 | 5 | 5 | 5 |
|  | PCD dependence | 5 | 5 | 5 | 5 | 5 | 5 | 4 | 4 | 3 | 5 |

|  |  | Comparative Example 1 | Comparative Example 2 | Comparative Example 3 | Comparative Example 4 |
|---|---|---|---|---|---|
| Composition of composition | Pigment dispersion liquid B-1 | 75.4 | | | |
|  | Pigment dispersion liquid B-2 | | 79 | | |
|  | Pigment dispersion liquid B-3 | | | 75.4 | |
|  | Pigment dispersion liquid B-4 | | | | 3 |
|  | Pigment dispersion liquid B-5 | | | | |

TABLE 2-continued

| | | | |
|---|---|---|---|
| | Pigment dispersion liquid B-6 | | |
| | Pigment dispersion liquid B-7 | | |
| | Pigment dispersion liquid B-8 | | |
| | Pigment dispersion liquid B-9 | | |
| | Pigment dispersion liquid B-10 | | 59.4 |
| | Alkali-soluble resin 1*1 | | |
| | Alkali-soluble resin 2*1 | 3.8 | |
| | Alkali-soluble resin 3*1 | | 3.2 |
| | Polymerizable compound 1*1 | | 1 |
| | Polymerizable compound 2*1 | | |
| | Polymerizable compound 3*1 | | |
| | Polymerizable compound 6*1 | | |
| | Photopolymerizable initiator 1 | | |
| | Photopolymerizable initiator 2 | | |
| | Photopolymerizable initiator 3 | 0.5 | 1.1 |
| | Photopolymerizable initiator 4 | | |
| | Surfactant 1*2 | | |
| | Polymerizable compound 4 | 1.3 | |
| | Polymerizable compound 5 | 0.2 | |
| | Organic solvent 1 | 13.3 | 32.3 |
| | Organic solvent 2 | 5.5 | |
| Characteristics | Maximum transmittance of visible region (400 to 750 nm) | 23 | 19 |
| | Minimum transmittance of near-IR region (900 to 1,300 nm) | 95 | 78 |
| Evaluation | Transmittance at 800 nm | 81 | 53 |
| | Average transmittance of visible region t1 (400 to 700 nm) | 11.7 | 7.5 |
| | Average transmittance of near-IR region t2 (825 to 1,300 nm) | 97.7 | 83.2 |
| | t1/t2 | 0.120 | 0.090 |
| | ΔW | 0.081 | 0.072 |
| | Visible light noise performance | 1 | 1 |
| | PCD dependence | 2 | 2 |

*1 in terms of solid content
*2 1% PGMEA solution

It can be seen that all the infrared transmission filters of the Examples formed by the coloring radiation-sensitive compositions of the Examples may transmit an infrared ray (particularly, a near-infrared ray) in a state where noises derived from the visible light components are less, as compared to the infrared transmission filters of the Comparative Examples formed by the coloring radiation-sensitive compositions of the Comparative Examples.

Further, the infrared transmission filters of Examples 1 to 10, which are formed by using a coloring radiation-sensitive composition containing at least one of the alkali-soluble resin having a repeating unit derived from the compound represented by Formula (ED) and the oxime compound (photopolymerization initiators), had better PCD dependence, and the infrared transmission filters of Examples 1 to 6 and 10, which are formed by using the coloring radiation-sensitive composition containing both the alkali-soluble resin and the oxime compound, had even better results in PCD dependence.

In addition, the infrared transmission filters of Examples 1, 2, and 7 to 9, in which "the maximum value of light transmittance at a wavelength in a range of 400 to 750 nm" is 13% or less and "the minimum value of light transmittance at a wavelength in a range of 900 to 1,300 nm" is 98% or more, had much better results in visible light noise performance.

According to the present invention, it is possible to provide a composition, which may prepare an infrared transmission filter which may transmit infrared ray (particularly, near-infrared ray) even though the infrared transmission filter is very thin (for example, a thickness of 1 μm) in a state where noise derived from the visible light components and the like is small, an infrared transmission filter using the same, a method for manufacturing an infrared transmission filter, and an infrared sensor.

The present invention has been described in detail with reference to specific aspects, but it is obvious to those skilled in the art that various changes or modifications can be made without departing from the spirit and scope of the present invention.

The present application is based on the Japanese Patent Application (Patent Application No. 2012-261422) filed on Nov. 29, 2012, the contents of which are incorporated herein by reference.

The invention claimed is:

1. A composition comprising a colorant in an amount of 20 to 70% by mass based on the total solids content of the composition, wherein the composition comprises a red pigment, a yellow pigment, a blue pigment, and a violet pigment as the colorant, and when a film is formed to have a film thickness of 1 μm, light transmittance in a thickness direction of the film has a maximum value of 20% or less at a wavelength in a range of 400 to 750 nm, and light transmittance in a thickness direction of the film has a minimum value of 90% or more at a wavelength in a range of 900 to 1,300 nm,
wherein the red pigment comprises C.I. Pigment Red 254,
the yellow pigment comprises C.I. Pigment Yellow 139 or C.I. Pigment Yellow 150,
the blue pigment comprises C.I. Pigment Blue 15:6,
the violet pigment comprises C.I. Pigment Violet 23,
the mass ratio of the red pigment to the entire pigments is 0.2 to 0.5, the mass ratio of the yellow pigment to the entire pigments is 0.1 to 0.2, the mass ratio of the blue pigment to the entire pigments is 0.3 to 0.4, and the mass ratio of the violet pigment to the entire pigments is 0.05 to 0.15, and the film exhibits improved visible light noise performance.

2. The composition according to claim 1, wherein the composition contains an organic pigment as the colorant, and the content of the organic pigment is 95% by mass or more based on the total amount of the colorant.

3. The composition according to claim 1, wherein the composition contains a photopolymerization initiator and a polymerizable compound.

4. The composition according to claim 3, wherein the composition further contains an alkali-soluble resin.

5. The composition according to claim 4, wherein the alkali-soluble resin is a resin having a repeating unit derived from a compound represented by the following Formula (ED):

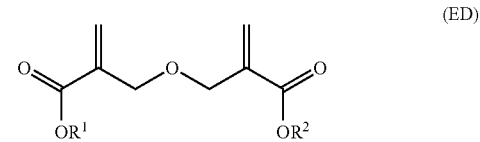

wherein each of $R^1$ and $R^2$ independently represents a hydrogen atom or a hydrocarbon group.

6. The composition according to claim 3, wherein the photopolymerization initiator is an oxime compound.

7. An infrared transmission filter formed with the composition according to claim 1.

8. An infrared sensor comprising the infrared transmission filter according to claim 7.

9. A method for manufacturing an infrared transmission filter, comprising:
a step of forming an infrared transmission composition layer by imparting the composition according to claim 1 on a substrate;
a step of pattern-wise exposing the infrared transmission composition layer; and
a step of forming a pattern by developing the infrared transmission composition layer after the exposure.

10. A colored layer having a film thickness of 0.55 μm to 1.8 μm, formed from a composition containing the colorant-containing composition according to claim 1, a photopolymerization initiator and a polymerizable compound.

11. The composition according to claim 1, wherein the content of the colorant is 30% by mass to 60% by mass, based on the total solids content of the composition.

12. A color filter configured with a combination of a colored pixel formed of the composition according to claim 1 and a colored pixel of another color selected from the group consisting of red, green, blue, magenta, yellow, cyan, black and colorless.

13. A colored layer having a film thickness of 0.55 μm to 1.8 μm, formed from the composition according to claim 1.

14. The composition according to claim 1, wherein the mass ratio of the red pigment to the entire pigments is 0.3 to 0.4.

15. The composition according to claim 1, wherein the colorant in the composition consists of a red pigment, a yellow pigment, a blue pigment and a violet pigment.

16. A composition comprising as a colorant a red pigment, a yellow pigment, a blue pigment, and a violet pigment, wherein when a film is formed to have a film thickness of 1 μm, light transmittance in a thickness direction of the film has a maximum value of 20% or less at a wavelength in a range of 400 to 750 nm, and light transmittance in a thickness direction of the film has a minimum value of 90% or more at a wavelength in a range of 900 to 1,300 nm,
  wherein the red pigment comprises C.I. Pigment Red 254,
  the yellow pigment comprises C.I. Pigment Yellow 139 or C.I. Pigment Yellow 150,
  the blue pigment comprises C.I. Pigment Blue 15:6,
  the violet pigment comprises C.I. Pigment Violet 23,
  the mass ratio of the red pigment to the entire pigments is 0.2 to 0.5, the mass ratio of the yellow pigment to the entire pigments is 0.1 to 0.2, the mass ratio of the blue pigment to the entire pigments is 0.3 to 0.4, and the mass ratio of the violet pigment to the entire pigments is 0.05 to 0.15, and
  the film exhibits improved visible light noise performance.

17. The composition according to claim 16, wherein the mass ratio of the red pigment to the entire pigments is 0.3 to 0.4.

18. The composition according to claim 16, wherein the colorant in the composition consists of a red pigment, a yellow pigment, a blue pigment and a violet pigment.

19. A composition comprising a colorant in an amount of 20 to 70% by mass based on the total solids content of the composition, wherein the composition consists essentially of a red pigment, a yellow pigment, a blue pigment, and a violet pigment as the colorant, and when a film is formed to have a film thickness of 1 μm, light transmittance in a thickness direction of the film has a maximum value of 20% or less at a wavelength in a range of 400 to 750 nm, and light transmittance in a thickness direction of the film has a minimum value of 90% or more at a wavelength in a range of 900 to 1,300 nm,
  wherein the mass ratio of the red pigment to the entire pigments is 0.2 to 0.5, the mass ratio of the yellow pigment to the entire pigments is 0.1 to 0.2, the mass ratio of the blue pigment to the entire pigments is 0.3 to 0.4, and the mass ratio of the violet pigment to the entire pigments is 0.05 to 0.15, and
  the film exhibits improved visible light noise performance.

20. The composition according to claim 19, wherein the mass ratio of the red pigment to the entire pigments is 0.3 to 0.4.

* * * * *